(12) United States Patent
Nakano et al.

(10) Patent No.: US 8,528,889 B2
(45) Date of Patent: Sep. 10, 2013

(54) DEVICE AND METHOD FOR SUPPORTING A SUBSTRATE

(75) Inventors: Seiji Nakano, Koshi (JP); Michiaki Matsushita, Koshi (JP); Naruaki Iida, Koshi (JP); Suguru Enokida, Koshi (JP); Katsuhiro Morikawa, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 646 days.

(21) Appl. No.: 12/748,652

(22) Filed: Mar. 29, 2010

(65) Prior Publication Data

US 2010/0243168 A1 Sep. 30, 2010

(30) Foreign Application Priority Data

Mar. 31, 2009 (JP) .................. 2009-087150
Mar. 31, 2009 (JP) .................. 2009-088309
Mar. 31, 2009 (JP) .................. 2009-088310

(51) Int. Cl.
*B23Q 3/00* (2006.01)
*B25B 1/00* (2006.01)

(52) U.S. Cl.
USPC ............ 269/903; 269/289 R; 29/281.1

(58) Field of Classification Search
USPC ............ 269/903, 289 R, 302.1, 71, 55, 56, 269/60, 900
See application file for complete search history.

(56) References Cited

U.S. PATENT DOCUMENTS

| | | | |
|---|---|---|---|
| 6,080,445 A | 6/2000 | Sugiyama et al. | |
| 6,136,386 A | 10/2000 | Nakahigashi et al. | |
| 6,168,669 B1 | 1/2001 | Yasuda et al. | |
| 7,514,163 B2 | 4/2009 | Nakamura et al. | |
| 7,766,456 B2 | 8/2010 | Hano et al. | |
| 8,136,925 B2 | 3/2012 | Hano et al. | |
| 2005/0202758 A1 | 9/2005 | Yoshida et al. | |
| 2009/0005862 A1 | 1/2009 | Nakatani et al. | |

FOREIGN PATENT DOCUMENTS

| | | |
|---|---|---|
| CN | 101088761 A1 | 12/2007 |
| JP | 62-133067 A1 | 6/1987 |
| JP | 09-237824 A1 | 9/1997 |
| JP | 10-018037 A1 | 1/1998 |
| JP | 10-060648 A1 | 3/1998 |
| JP | 10-298780 A1 | 11/1998 |
| JP | 11-243133 A1 | 9/1999 |
| JP | 2001-326271 A1 | 11/2001 |

(Continued)

OTHER PUBLICATIONS

Chinese Office Action dated Oct. 26, 2011.

(Continued)

Primary Examiner — Lee D Wilson
(74) Attorney, Agent, or Firm — Burr & Brown

(57) ABSTRACT

A substrate support device including a support member having a lower-surface support section to support a lower surface of a substrate; and a position restriction section provided on the lower-surface support section, the position restriction section being formed to surround a periphery of the substrate supported on the lower-surface support section and restrict a position of the substrate. At least one of the lower-surface support section and the position restriction section includes a base material and a protective film formed to cover the base material and prevent at least one of wear and chemical erosion to which the base material will be subject. The substrate support device further includes, for example, a base that supports the support member, and a driving structure that moves the support member in a relative fashion with respect to the base, and is constructed as a substrate transport device.

9 Claims, 43 Drawing Sheets

(56) References Cited

FOREIGN PATENT DOCUMENTS

| | | |
|---|---|---|
| JP | 2002-020869 A1 | 1/2002 |
| JP | 3355950 B2 | 12/2002 |
| JP | 2004-009165 A1 | 1/2004 |
| JP | 2004-123522 A1 | 4/2004 |
| JP | 2005-101247 A1 | 4/2005 |
| JP | 2005-254351 A1 | 9/2005 |
| JP | 2005-347689 A1 | 12/2005 |
| JP | 2005-353126 A1 | 12/2005 |
| JP | 2006-216886 A1 | 8/2006 |
| JP | 2007-128967 A1 | 5/2007 |
| JP | 2007-195883 A1 | 8/2007 |
| JP | 2007-213715 A1 | 8/2007 |
| JP | 2008-140949 A1 | 6/2008 |
| JP | 2009-043997 A1 | 2/2009 |

OTHER PUBLICATIONS

Japanese Office Action dated Dec. 8, 2011 for Japanese Application No. 2009-088309 (with English translation).

Japanese Office Action dated Dec. 8, 2011 for Japanese Application No. 2009-088310 (with English translation).

Japanese Office Action dated May 8, 2012 (with English translation).

DEVICE AND METHOD FOR SUPPORTING A SUBSTRATE

BACKGROUND OF THE INVENTION

1. Field of the Invention

The present invention relates to a device and method for supporting a substrate.

2. Description of the Related Art

During a photoresist process that is one of semiconductor-manufacturing processes, a resist pattern is formed on semiconductor wafers (hereinafter, referred to simply as wafers) by coating the wafer surface with a resist and exposing the resist to light in the desired pattern, followed by development. Such processing is usually performed using a system that includes a coating/developing apparatus for resist coating/development and an exposure apparatus connected to the coating/developing apparatus.

The coating/developing apparatus includes various modules. These modules are, for example, a resist-coating module for coating each wafer with the resist, a developing module for supplying a developing solution, and a heating or cooling module for heating or cooling the wafer before and/or after processing the wafer in connection with the resist-coating module and the developing module. After that, the wafer is carried between the modules and between the coating/developing apparatus and the exposure apparatus, by, for example, a substrate transport device such as a transport arm, one form of substrate support device for supporting and carrying the wafer. FIGS. 19(a) and 19(b) illustrate an example of a wafer transport section forming a portion of the substrate transport device.

The wafer transport section 101 illustrated in FIGS. 19(a), 19(b) includes a frame 102 formed into generally a C-shape, and the wafer W is retained in such a form as to be surrounded by the frame 102. The frame 102 has a total of four wafer hold sections 103 on its inner surface. The wafer hold sections 103 are each formed from a resin to prevent metal contamination of the wafer W. Each wafer hold section 103 includes a lower-surface support section 104 supporting the wafer W horizontally inside the frame 102. The wafer hold section 103 further includes sidewalls 105 surrounding a periphery of the wafer W and preventing a fall of the wafer W from the wafer transport section 101, and inclined sections 106 arranged. If one peripheral edge of the wafer W gets on one of the inclined sections 106 during wafer transfer or transport, the wafer W will slip downward from the corresponding inclined section 106 and slide along the surface of the lower-surface support section 104. The wafer W will be consequently guided into a support region surrounded by the sidewalls 105.

Although wafer sizes are standardized, a dimensional error ranging between about ±0.25 mm and about ±0.50 mm exists with each wafer. When the wafer W is retained by the wafer transport section 101, the support region becomes slightly larger than the size of the wafer W, as illustrated in FIG. 19(b). That is to say, each wafer hold section 103 is disposed so that slight clearances are formed between the sidewalls 105 and the periphery of the wafer W.

However, since, as described above, a clearance is formed between each sidewall 105 and the periphery of the wafer W, when the wafer transport section 101 moves, inertial force makes the retained wafer W slide along the surface of the lower-surface support section 104, causing the periphery of the wafer to collide against the sidewall 105. This state is illustrated in FIG. 20(a). The collision wears the sidewall 105 and the lower-surface support section 104. FIG. 20(b) is a schematic representation of microscopic observation results on the sidewall 105 of the wafer transport section 101 used in an actual device, and reference number 108 denotes traces of the wear. Currently, coating/developing apparatus is significantly improved in throughput, with substrate transport devices being correspondingly increased in wafer transport speed. These increases in transport speed wear the wafer hold section 103 more easily.

In addition, coating/developing apparatus uses a variety of chemical liquids to conduct various types of processes upon the surface of the wafer W. These chemicals include, for example, the resist and developing solution described above, and a chemical for forming an anti-reflective film layer or protective film layer on the wafer W. During flow along the surface of the wafer, each such chemical is likely to turn around in a state of mist midway and adhere to, for example, the periphery or lower surface of the wafer. If such a chemical actually adheres to the wafer W being carried, each wafer hold section 103 may come into contact with the chemical and be chemically eroded. It should be noted that the chemical erosion includes corrosion.

These events, namely, the above-discussed physical wear and chemical erosion, may, for example, lead to a change in shape of the lower-surface support section 104 and result in the wafer W being retained askew. Wear on or chemical erosion of the sidewall 105 may cause the wafer W to enter traces of the wear or erosion, resulting in the wafer being supported in positionally shifted form with respect to a predetermined support region. If friction coefficients of the inclined section 106 and the lower-surface support section 104 increase as a result of the above wear and erosion, the wafer W could fail to slide downward from the inclined section 106. This failure could in turn lead to a fall of the wafer W from the wafer transport section 101 during carriage or result in abnormal processing of the wafer W due to possible transfer to the improper position in the required module.

In addition, each module of the coating/developing apparatus has a stage serving as a substrate support device and including a wafer lower-surface support section, and this stage may further have a position restriction section surrounding the periphery of the wafer W to prevent side slipping of the wafer mounted on the lower-surface support section. The mounting region, surrounded by the position restriction section, also has a size set to be larger than the wafer size, allowing for a dimensional error of the wafer W. As with the wafer hold section 103, the lower-surface support section and position restriction section of such a stage may suffer wear and the chemical erosion caused via the wafer W by a chemical. These events could cause the wafer W to be mounted or inclined in positionally shifted form with respect to the mounting region on the stage, and result in abnormal processing of the wafer W or in abnormal transfer thereof between the stage and the substrate transport device.

In Japanese Patent No. 3355950 (Paragraph 0017), although using a diamond-like carbon film to cover the surface of a resin-formed base for a machine part is described, problems associated with carriage and mounting of the substrate as discussed above are not described and thus the problems cannot be solved. In addition, in JP-11-243133-A (FIG. 7 and others), while the wafer transport section as discussed above is described, a technique for solving the above problems is not described.

Patent Document 1: JP3355950
Patent Document 2: JP-11-243133-A

SUMMARY OF THE INVENTION

The present invention has been made under the above circumstances, and an object of the invention is to provide a device and method adapted to prevent abnormal supporting of a substrate, caused by wear due to contact with the substrate or by chemical erosion via the substrate due to use of a chemical liquid.

A first aspect of the present invention is a substrate support device comprising: a support member having a lower-surface support section to support a lower surface of a substrate; and a position restriction section provided on the lower-surface support section, the position restriction section being formed to surround a periphery of the substrate supported on the lower-surface support section and restrict a position of the substrate. At least one of the lower-surface support section and the position restriction section includes a base material and a protective film formed to cover the base material and prevent at least one of wear and chemical erosion to which the base material will be subject.

The substrate support device according to the first aspect of the present invention further comprises the following: a base that supports the support member; and a driving structure that moves the support member in a relative fashion with respect to the base. The substrate support device is constructed as a substrate transport device.

The support member in the substrate support device according to the first aspect of the present invention is a temperature control plate for heating or cooling the substrate.

A second aspect of the present invention is a substrate support device comprising: a support member having a lower-surface support section to support a lower surface of a substrate; a position restriction section provided on the lower-surface support section, the position restriction section being formed to surround a periphery of the substrate supported on the lower-surface support section and restrict a position of the substrate; and an inclined section provided on the lower-surface support section, the inclined section being inclined downward from an outward position of a support region for the substrate surrounded by the position restriction section, towards the support region, such that a peripheral edge of the substrate slides downward on the inclined section and the substrate is guided to the lower-surface support section. At least one of the lower-surface support section, the position restriction section, and the inclined section, includes a base material and a protective film formed to cover the base material and prevent at least one of wear and chemical erosion to which the base material will be subject.

The base material in the substrate support device according to the second aspect of the present invention is made of a resin.

In the substrate support device according to the second aspect of the present invention, the base material retains a large number of fibers, with some of the fibers having a front end protruding to the surface of the base material, and the protective film covers the base material and each fiber to prevent the position restriction section, the lower-surface support section, or the inclined section from wearing.

The protective film in the substrate support device according to the second aspect of the present invention is made of diamond-like carbon.

A third aspect of the present invention is a substrate supporting method comprising: the step of providing a support member having a lower-surface support section to support a lower surface of a substrate; and the step of providing a position restriction section on the lower-surface support section to surround a periphery of the substrate supported on the lower-surface support section, and restrict a position of the substrate. At least one of the lower-surface support section and the position restriction section includes a base material and a protective film formed to cover the base material and prevent at least one of wear and chemical erosion to which the base material will be subject The substrate supporting method according to the third aspect of the present invention further comprises the following: the step of providing a base to support the support member; and the step of providing a driving structure to carry the substrate by moving the support member in a relative fashion with respect to the base.

The substrate supporting method according to the third aspect of the present invention further comprises the step of heating or cooling the substrate by use of the support member.

A fourth aspect of the present invention is a substrate supporting method comprising: the step of providing a support member having a lower-surface support section to support a lower surface of a substrate; the step of providing a position restriction section on the lower-surface support section to surround a periphery of the substrate supported on the lower-surface support section, and restrict a position of the substrate; and the step of providing an inclined section inclined downward from an outward position of a support region for the substrate surrounded by the position restriction section, towards the support region, such that a peripheral edge of the substrate slides downward on the inclined section and the substrate is guided to the lower-surface support section. At least one of the lower-surface support section, the position restriction section, and the inclined section, includes a base material and a protective film formed to cover the base material and prevent at least one of wear and chemical erosion to which the base material will be subject.

The base material in the substrate supporting method according to the fourth aspect of the present invention is made of a resin.

In the substrate supporting method according to the fourth aspect of the present invention, the base material retains a large number of fibers, with some of the fibers having a front end protruding to the surface of the base material, and the protective film is formed to cover the base material and each fiber to prevent the position restriction section, the lower-surface support section, or the inclined section from wearing.

A fifth aspect of the present invention is a substrate support device comprising: a support member having a lower-surface support section to support a lower surface of a substrate; and a position restriction section provided on the lower-surface support section, the position restriction section being formed to surround a periphery of the substrate supported on the lower-surface support section and restrict a position of the substrate. At least one of the lower-surface support section and the position restriction section includes a base material and a protective film a first film covering the base material, and a second film stacked on the first film, the protective film being formed to prevent chemical erosion of the base material.

The substrate support device according to the fifth aspect of the present invention further comprises the following: a base that supports the support member; and a driving structure that moves the support member in a relative fashion with respect to the base. The substrate support device is constructed as a substrate transport device.

The support member in the substrate support device according to the fifth aspect of the present invention acts as a temperature control plate to heat or cool the substrate.

A sixth aspect of the present invention is a substrate support device comprising: a support member having a lower-surface support section to support a lower surface of a substrate; a position restriction section provided on the lower-surface support section, the position restriction section being formed to surround a periphery of the substrate on the lower-surface support section and restrict a position of the substrate; and an inclined section provided on the support member, the inclined section being inclined downward from an outward position of a support region for the substrate surrounded by the position restriction section, towards the support region, such that a peripheral edge of the substrate slides downward on the inclined section and the substrate is guided to the lower-surface support section. At least one of the lower-surface support section, the position restriction section, and the inclined section, includes a base material and a protective film inclusive of a first film covering the base material, and of a second film stacked on the first film, the protective film being formed to prevent chemical erosion of the base material.

The base material in the substrate support device according to the sixth aspect of the present invention is made of a resin.

In the substrate support device according to the sixth aspect of the present invention, the base material retains a large number of fibers, with some of the fibers having a front end protruding to the surface of the base material, and the protective film covers the base material and each fiber to prevent the position restriction section, the lower-surface support section, or the inclined section from wearing.

The protective film in the substrate support device according to the sixth aspect of the present invention is made of diamond-like carbon.

In the substrate support device according to the sixth aspect of the present invention, the first film has a main constituent different from that which the second film has.

In the substrate support device according to the sixth aspect of the present invention, fluorine is contained as a main constituent of the first film, and silicon is contained as a main constituent of the second film.

A seventh aspect of the present invention is a substrate supporting method comprising: the step of providing a lower-surface support section having a lower-surface support section to support a lower surface of a substrate; and the step of providing a position restriction section on the support member to surround a periphery of the substrate supported on the lower-surface support section, and restrict a position of the substrate. At least one of the lower-surface support section and the position restriction section includes a base material and a protective film including a first film covering the base material, and second film stacked on the first film, the protective film being formed to prevent chemical erosion of the base material.

The substrate supporting method according to the seventh aspect of the present invention further comprises the following: the step of providing a base to support the support member; and the step of providing a driving structure to carry the substrate by moving the support member in a relative fashion with respect to the base.

The substrate supporting method according to the seventh aspect of the present invention further comprises the step of heating or cooling the substrate by use of the support member.

An eighth aspect of the present invention is a substrate supporting method comprising: the step of providing a support member having a lower-surface support section to support a lower surface of a substrate; the step of providing a position restriction section on the lower-surface support section to surround a periphery of the substrate supported on the lower-surface support section, and restrict a position of the substrate; and the step of providing an inclined section inclined downward from an outward position of a support region for the substrate surrounded by the position restriction section, towards the support region, such that a peripheral edge of the substrate slides downward on the inclined section and the substrate is guided to the lower-surface support section. At least one of the lower-surface support section, the position restriction section, and the inclined section, includes a base material and a protective film including a first film covering the base material, and a second film stacked on the first film, the protective film being formed to prevent chemical erosion of the base material.

The base material in the substrate supporting method according to the eighth aspect of the present invention is made of a resin.

In the substrate supporting method according to the eighth aspect of the present invention, the base material retains a large number of fibers, with some of the fibers having a front end protruding to the surface of the base material; and the protective film covers the base material and each fiber to prevent the position restriction section, the lower-surface support section, and the inclined section from wearing.

A ninth aspect of the present invention is a vacuum chuck comprising: a substrate mount constructed of a resin-containing, molded body and having a substrate-mounting surface to retain a substrate; a large number of fiber bodies buried in the substrate mount to improve strength of the substrate mount; a protective film formed to cover at least the substrate-mounting surface for enhanced wear resistance of the substrate mount against the substrate, the protective film being adapted to cover the fiber bodies partially protruding from the surface of the substrate mount; and a suction pathway provided in the substrate mount, the suction pathway being used for vacuum-attracting the substrate mounted on the substrate mounting-surface from the side of a lower surface of the substrate.

In the vacuum chuck according to the ninth aspect of the present invention, the substrate mount is rotatably disposed, and used for, while rotating the substrate retained on the substrate mount by suction, supplying a process liquid to the substrate and subjecting the substrate to liquid treatment; and the protective film is further formed on at least one of a periphery and lower surface of the substrate mount such that the protective film covers each fiber body protruding from the surface of the substrate mount and thereby suppresses deterioration of the substrate mount due to contact with the process liquid.

A tenth aspect of the present invention is a vacuum chuck that is used for, while rotating a substrate retained on a rotatably disposed substrate mount by suction, supplying a process liquid to the substrate and subjecting the substrate to liquid treatment, the vacuum chuck comprising: the substrate mount constructed of a resin-containing, molded body and having a substrate-mounting surface to retain the substrate; a large number of fiber bodies buried in the substrate mount to improve strength of the substrate mount; a protective film further formed on at least one of a periphery and lower surface of the substrate mount such that the protective film covers the fiber bodies partially protruding from the surface of the substrate mount, thereby suppressing deterioration of the substrate mount due to contact with the process liquid; and a suction pathway provided in the substrate mount, the suction pathway being used for vacuum-attracting the substrate mounted on the substrate mounting-surface from the side of a lower surface of the substrate.

In the vacuum chuck according to the tenth aspect of the present invention, the protective film formed on at least one of the periphery and lower surface of the substrate mount contains fluorine to enhance water repellence against the process liquid.

The protective film in the vacuum chuck according to the tenth aspect of the present invention is a diamond-like carbon film.

An eleventh aspect of the present invention is a chemical processing device adapted for, while rotating a substrate that a vacuum chuck retains by suction in a processing cup, supplying a process liquid to the substrate and subjecting the substrate to liquid treatment, the vacuum chuck comprising: a substrate mount constructed of a resin-containing, molded body and having a substrate-mounting surface to retain a substrate; a large number of fiber bodies buried in the substrate mount to improve strength of the substrate mount; a protective film formed to cover at least the substrate-mounting surface for enhanced wear resistance of the substrate mount against the substrate, the protective film being adapted to cover the fiber bodies partially protruding from the surface of the substrate mount; and a suction pathway provided in the substrate mount, the suction pathway being used for vacuum-attracting the substrate mounted on the substrate mounting-surface from the side of a lower surface of the substrate.

A twelfth aspect of the present invention is a chemical processing device adapted for, while rotating a substrate that a vacuum chuck retains by suction in a processing cup, supplying a process liquid to the substrate and subjecting the substrate to liquid treatment, the vacuum chuck being used for, while rotating the substrate retained on a rotatably disposed substrate mount by suction, supplying the process liquid to the substrate and subjecting the substrate to the liquid treatment, the vacuum chuck comprising: the substrate mount constructed of a resin-containing, molded body and having a substrate-mounting surface to retain the substrate; a large number of fiber bodies buried in the substrate mount to improve strength of the substrate mount; a protective film further formed on at least one of a periphery and lower surface of the substrate mount such that the protective film covers the fiber bodies partially protruding from the surface of the substrate mount, thereby suppressing deterioration of the substrate mount due to contact with the process liquid; and a suction pathway provided in the substrate mount, the suction pathway being used for vacuum-attracting the substrate mounted on the substrate mounting-surface from the side of a lower surface of the substrate.

A substrate support device of the present invention comprises a support member having a lower-surface support section to support a lower surface of a substrate, a position restriction section surrounding a periphery of the substrate supported on the lower-surface support section and restricting a position of the substrate, and a protective film for covering at least one of the lower-surface support section and the position restriction section and preventing at least one of wear on and chemical erosion of the lower-surface support section and the position restriction section. Improper supporting of the substrate due to such wear or chemical erosion is therefore prevented.

In another substrate support device of the present invention, a protective film including a first film and a second film stacked thereupon covers either a lower-surface support section that supports a lower surface of a substrate, or a position restriction section that surrounds a periphery of the substrate supported on the lower-surface support section and restricts a position of the substrate. Even if through-holes that penetrate the first film and the second film are formed by abnormal film deposition, unless the through-holes overlap, a base material that forms part of the lower-surface support section or the position restriction section will not become exposed. Improper supporting of the substrate due to chemical erosion of the base material is therefore prevented.

A vacuum chuck of the present invention, adapted to mount a substrate on a substrate mount constructed of a resin-containing, molded body and retain the substrate by suction, comprises a large number of fiber bodies buried in the substrate mount to improve its strength, and a protective film formed on at least a substrate-mounting surface of the substrate mount so that during molding, the protective film covers each of the fiber bodies protruding outward from the surface of the substrate mount. Substrate mount deterioration (wear) due to friction or sliding against the substrate is therefore prevented. In addition, since a kind of anchoring effect makes the protective film strongly adhere to the substrate mount via the fiber bodies, even if the substrate mount suffers a slight change in shape due to rotation or the like, the protective film can have its shape changed according to a particular shape of the substrate mount, such that film separation and damage are suppressed. The deterioration of the substrate mount is therefore suppressed, even when wafers are processed in large numbers. When the substrate is suction-retained on the vacuum chuck and a process liquid is supplied for chemical processing of the substrate, the process liquid is likely to turn around at the surface of the substrate and reach a lower surface thereof via a periphery thereof. Even in such a case, however, sticking of the process liquid to the substrate mount and entry of the process liquid from an interface between the fiber bodies and the substrate mount can be suppressed by forming the protective film on at least one of the periphery side and lower surface of the substrate mount so as to cover the large number of fiber bodies protruding outward from the surface of the substrate mount. The deterioration (erosion) of the substrate mount due to use of the process liquid is suppressed as a result.

DESCRIPTION OF THE PREFERRED EMBODIMENTS

First Embodiment

A first embodiment of the present invention will be described using FIGS. 1 to 18.

A coating/developing apparatus 1 with a substrate transport device of the present invention is first described below.

Figure 1:
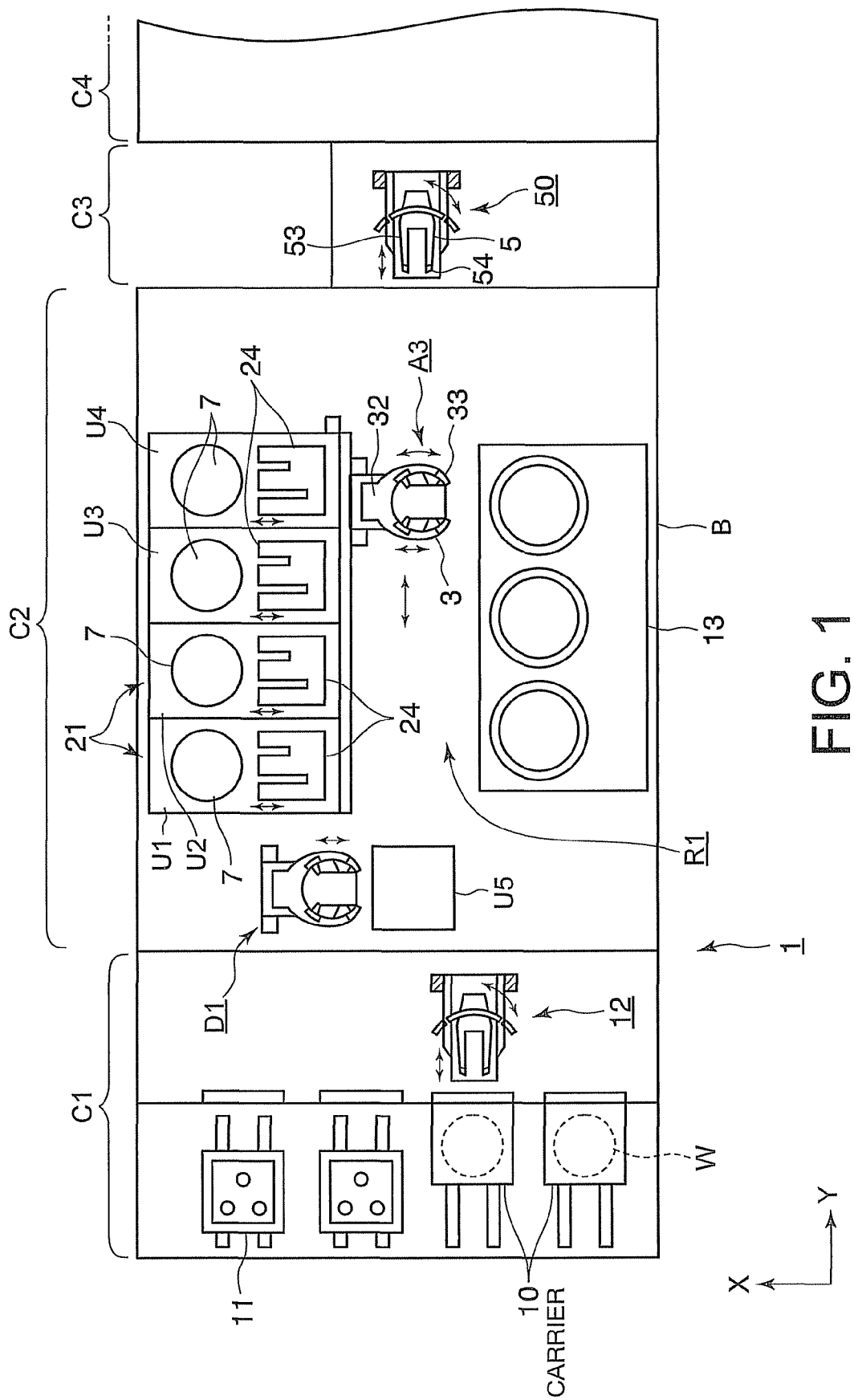
FIG. 1 is a plan view of a coating/developing apparatus having a substrate transport device according to a first embodiment of the present invention.
Figure 2:
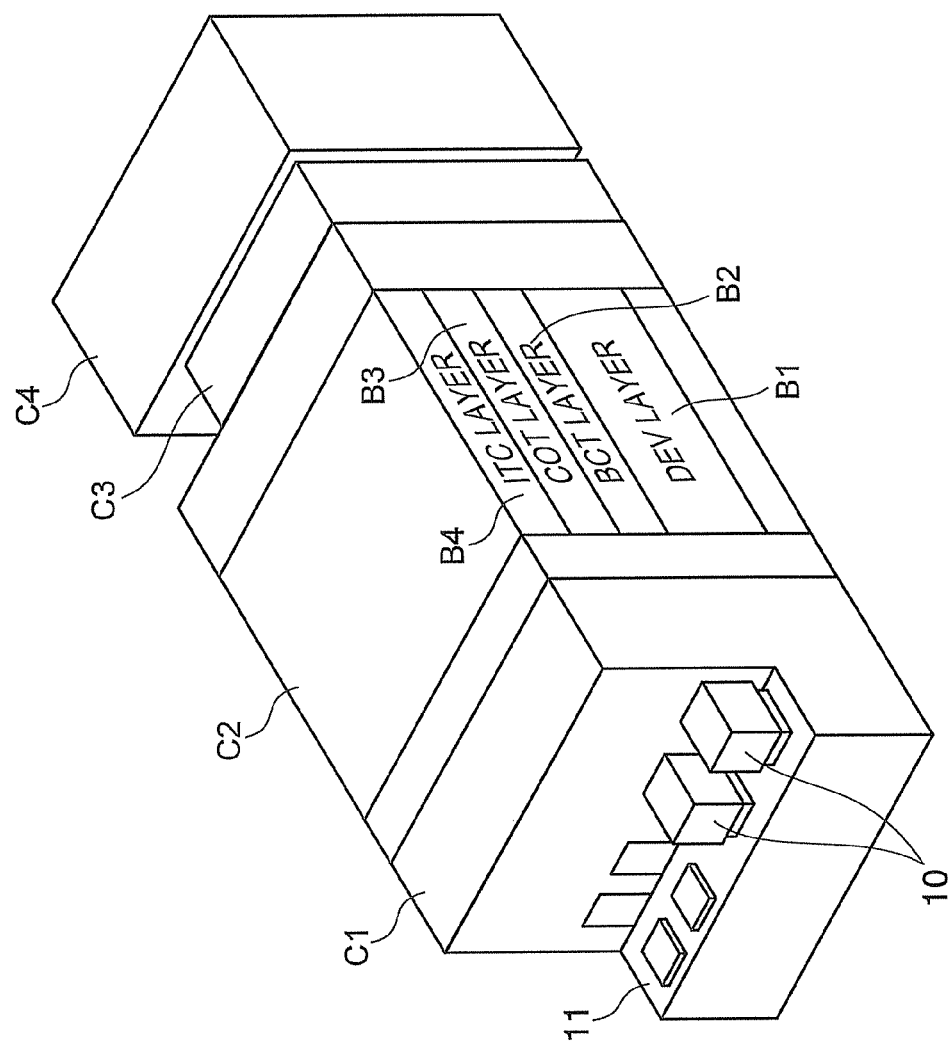
FIG. 2 is a perspective view of the coating/developing apparatus.
Figure 3:
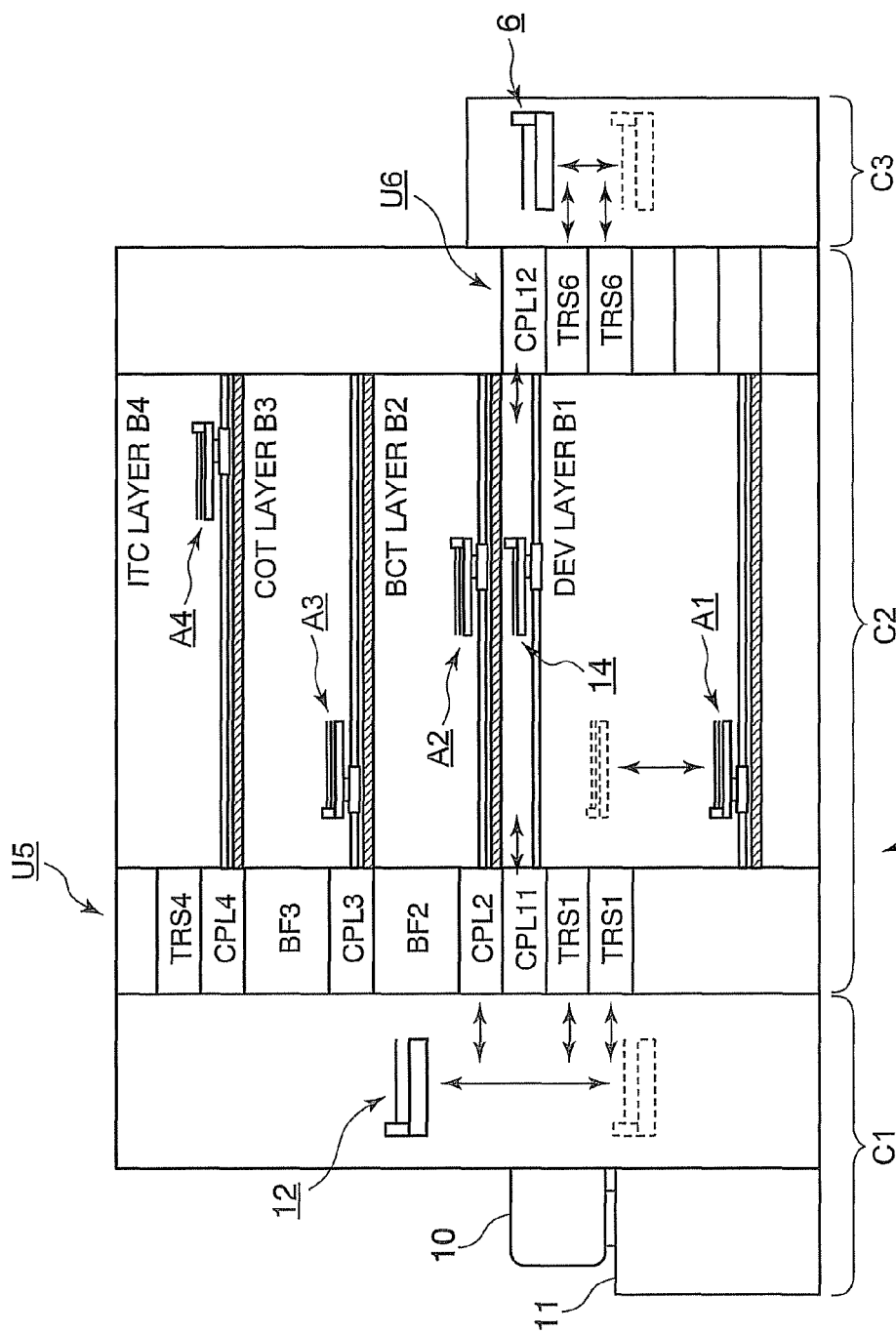
FIG. 3 is a longitudinal, sectional side view of the coating/developing apparatus.

FIG. 1 is a plan view of a resist pattern forming system including an exposure apparatus C4 connected to the coating/developing apparatus 1. FIG. 2 is a perspective view of the system. FIG. 3 is a longitudinal, sectional side view of the system. The coating/developing apparatus 1 includes a carrier block C1. The carrier block C1 is constructed so that a transfer arm 12, after unloading a wafer W from an enclosed type of carrier 10 mounted on a mounting table 11 of the carrier block C1, transfers the wafer W to a processing block C2, then receives a processed wafer W from the processing block C2, and returns the wafer W to the carrier 10.

As shown by way of example in FIG. 3, the processing block C2 includes a first block (DEV layer) B1 for a developing process, a second block (BCT layer) B2 for forming an anti-reflective film on a lower layer of a resist film, a third block (COT layer) B3 for coating with the resist film, and a fourth block (ITC layer) B4 for forming a protective film on an upper-layer side of the resist film. The four layers are stacked in that order with the lowermost one first.

Each layer of the processing block C2 has substantially the same configuration as that of the layer existing when viewed from above. The third block (COT layer) 83 is described below by way of example. The COT layer block B3 includes the following: a resist film forming module 13 for forming the resist film as a coating film; rack units U1 to U4 each constituting a heating/cooling module group for performing a pre-process prior to, and a post-process following completion of the process that the resist film forming module 13 performs; and a transport arm A3 that is a substrate transport device provided between the resist film forming module 13 and the heating/cooling module group to transfer a wafer W therebetween.

The rack units U1-U4 are arranged along a transport region R1 that is a moving route of the transport arm A3, and are each constituted by a stacked array of heating modules 21 and cooling modules. Each heating module 21 has a heating plate 7 to heat a wafer W mounted thereon, and each cooling module has a cooling plate to cool a wafer W mounted thereon. Referring to FIG. 1, the heating module 21 further includes the cooling plate 24 that cools a heated wafer W in addition to moving between the transport region R1 and the heating plate 7, and operating as an intermediating element for wafer transfer. A configuration of the heating plate 7 will be described later herein.

The second block (BCT layer) B2 and the fourth block (ITC layer) 84 have substantially the same configuration as that of the COT layer block 83, except that an anti-reflective film forming module equivalent to the resist film forming module, and a protective film forming module are provided and that in the two modules, a chemical for forming an anti-reflective film, and a chemical for forming a protective film are each supplied to the wafer W as a coating liquid alternative to the resist.

Developing modules corresponding to the resist film forming module are stacked in two stages in one DEV layer block B1 of the first block (DEV layer) B1, and the DEV layer block B1 has a rack unit that constitutes a heating/cooling module group for pre-processing and post-processing with respect to the process performed by the developing module. The DEV layer block B1 has a transport arm A1 to transport the wafer W between the two developing module stages and the heating/cooling modules. Briefly, the transport arm A1 is used in common for the two developing module stages.

The processing block C2 further has a rack unit U5 as shown in FIGS. 1 and 3, and the wafer W from the carrier block C1 is transported to one transfer unit in the rack unit U5. This transfer unit is, for example, a transfer unit CPL 2 corresponding to the second block (BCT layer) B2. A transport arm A2 in the second block (BCT layer) B2 receives the wafer W from the transfer unit CPL 2 and transports the wafer W to each unit (the anti-reflective film forming modules and the heating/cooling modules), in which an anti-reflective film is then formed on the wafer W.

After this, the wafer W is transported to a transfer unit BF 2 of the rack unit U5, a transfer arm D1, and a transfer unit CPL 3 of the rack unit U5, in that order. After being controlled to a temperature of, for example, 23° C. in the transfer unit CPL 3, the wafer W is further transported to the third block (COT layer) B3 via the transport arm A3, and then a resist film is formed on the wafer W by the resist film forming module 13. The wafer W is further transferred to the transport arm A3, a transfer unit BF 3 of the rack unit U5, and the transfer arm D1, in that order, and then returned to the transfer unit BF 3 in the rack unit U5. The wafer W with the resist film formed thereon may further have a protective film formed in the fourth block (ITC layer) B4. If this is the case, the wafer W is transferred to a transport arm A4 via a transfer unit CPL 4 and then after the formation of the protective film, further transferred to a transfer unit TRS 4 by the transport arm A4.

An upper internal section of the DEV layer block B1 includes a shuttle arm 14 that is a special carrying element for transporting the wafer W directly from a transfer unit CPL 11 within the rack unit U5 to a transfer unit CPL 12 within a rack unit U6. The wafer W with the resist film and protective film formed thereon is transferred from the transfer units BF 3 and TRS 4 via the transfer arm D1 to the transfer unit CPL 11, from which unit the wafer W is then directly transported to the transfer unit CPL 12 of the rack unit U6 by the shuttle arm 14 and carried into an interface block C3. Each unit with the reference code CPL assigned thereto in FIG. 3, also serves as a cooling unit for temperature control, and each unit with the reference code BF assigned thereto, also serves as a buffer unit having a multiple-wafer mounting capability.

The wafer W is next carried to the exposure apparatus C4 by an interface arm 50, then after undergoing a predetermined exposure process in the exposure apparatus C4, mounted in a transfer unit TRS 6 of the rack unit U6, and returned to the processing block C2. The returned wafer W undergoes a developing process in the first block (DEV layer) B1 and is next transferred to a transfer unit TRS 1 of the rack unit U5 by the transport arm A1. After this, the wafer W is returned to the carrier 10 via the transfer arm 12.

Figure 4:
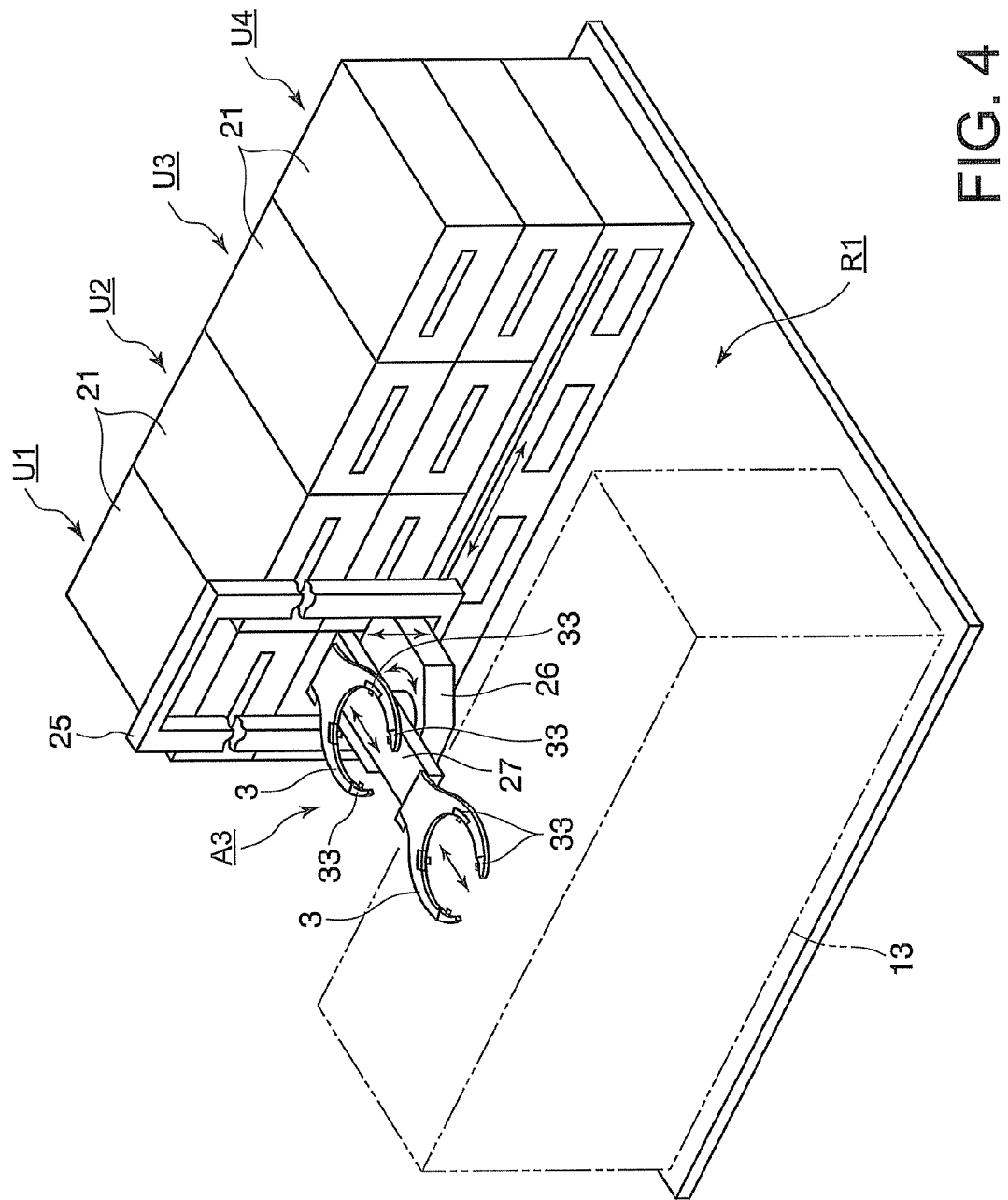
FIG. 4 is a perspective view of a processing block of the coating/developing apparatus.

The transport arm A3 that is the substrate transport device forming an embodiment of a substrate support device of the COT layer block B3 is described below referring to FIG. 4. The transport arm A3 includes a horizontal slider 25 that moves along the transport region R1, a lifting base 26 that moves the horizontal slider 25 upward and downward, and a pivoting base 27 that turns around a vertical axis, above the lifting base 26. The pivoting base 27 includes two wafer transport sections 3 supported on the pivoting base 27 and moving back and forth above the pivoting base 27 independently of each other. The horizontal slider 25, the lifting base 26, and the pivoting base 27 are actuated via a driving structure not shown.

Figure 5:
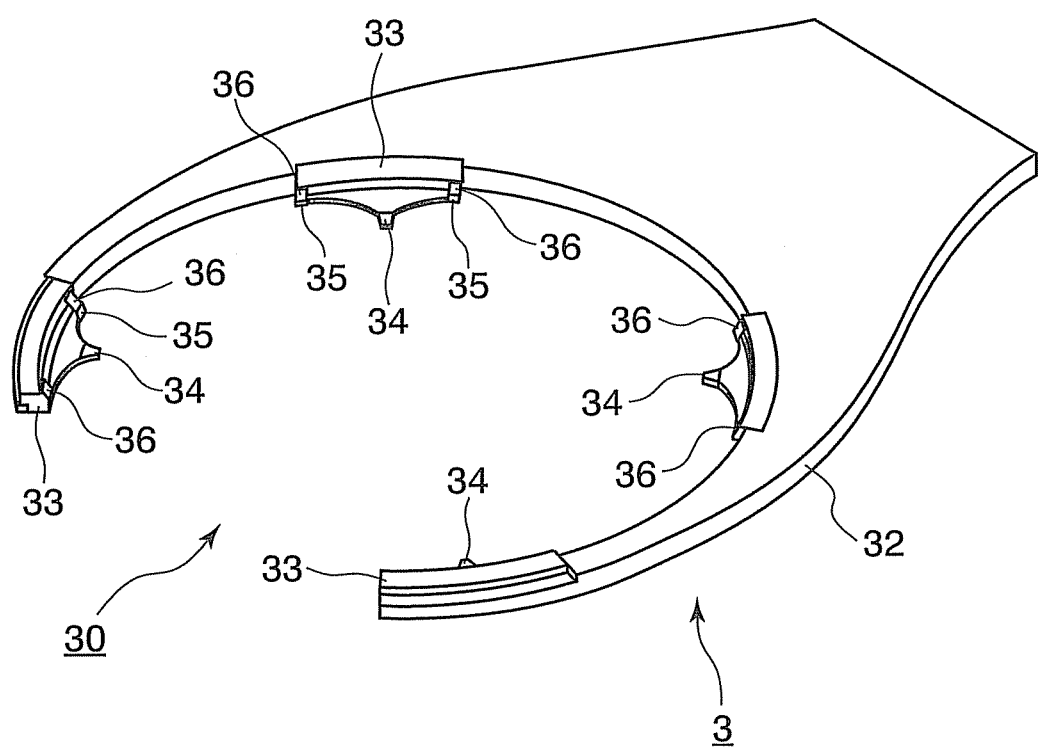
FIG. 5 is a perspective view of a wafer transport section of a transport arm in the processing block.

Each of the wafer transport sections 3 is described below referring to FIGS. 5 and 6. The wafer transport section 3 is of substantially the same shape as that of the wafer transport section 101 discussed in the BACKGROUND OF THE INVENTION hereof, has a protrusion extending in bifurcated form from a proximal portion of the transfer section 3, and includes a frame 32 formed into generally a C-shape. Four wafer hold members 33 each for retaining a wafer W at an inner circumferential side of the frame 32 are spacedly arranged at the inner circumferential side. The wafer transport section 3 constituted by the frame 32 and each wafer hold member 33 forms a substrate support member.

The wafer hold member 33 is described below referring also to FIG. 7(a), a perspective view of the hold member. Sections covered with the protective films 41 described later herein are each shown with a number of points in FIG. 7(a). The wafer hold member 33 includes a lower-surface support section 34 for supporting the lower surface of a wafer W, lower vertical walls 35 that surround a periphery of the wafer W supported on the lower-surface support section 34 and restrict a position of the wafer W as a position restriction section, and inclined sections 36 formed to continuously connect to, and inclined downward toward, the lower vertical walls 35. Each inclined section 36 functions to slide back a peripheral edge of the wafer W downward from the inclined section 36 if the wafer W has shifted to get thereon, and guide the wafer W into a support region 30 surrounded by the corresponding lower vertical wall 35. As described in the BACKGROUND OF THE INVENTION, the wafer hold member 33 is provided on the frame 32 so that a diameter of the support region 30 is slightly larger than that of the wafer W.

In addition, an upper vertical wall 37 is formed on each inclined section 36 so as to continuously connect thereto. During carriage of the wafer W by the wafer transport section 3, inertia or a physical shock could cause the wafer W to slide away from the support region 30 and get on the inclined section 36. If this actually happens, the peripheral edge of the wafer W may shift further outward from the inclined section 36 and consequently, the wafer W may drop from the hold member 33. The upper vertical wall 37 is provided to suppress such a situation.

In order to prevent metal contamination of the wafer W, the wafer hold member 33 is constructed of a base material 40 that is a molded body of a polyether-ether-ketone (PEEK) resin, for example. As shown in FIG. 7(b), the base material 40 contains a large number of carbon fibers 42 that are fiber bodies, to improve its strength and is retained by the carbon fibers 42. The carbon fibers 42 measure, for example, about 7 μm in diameter and, for example, about 0.1 mm to 6.0 mm in length. In addition, the carbon fibers 42 have about 1 to 5 μm of respective front ends protruded from the surface of the base material 40.

Figure 6:
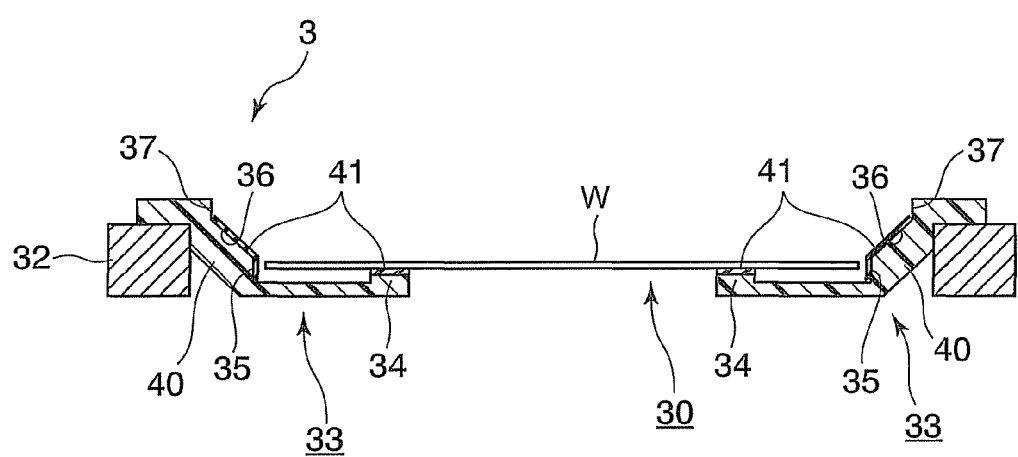
FIG. 6 is a longitudinal, sectional side view of the wafer transport section.
Figure 7:
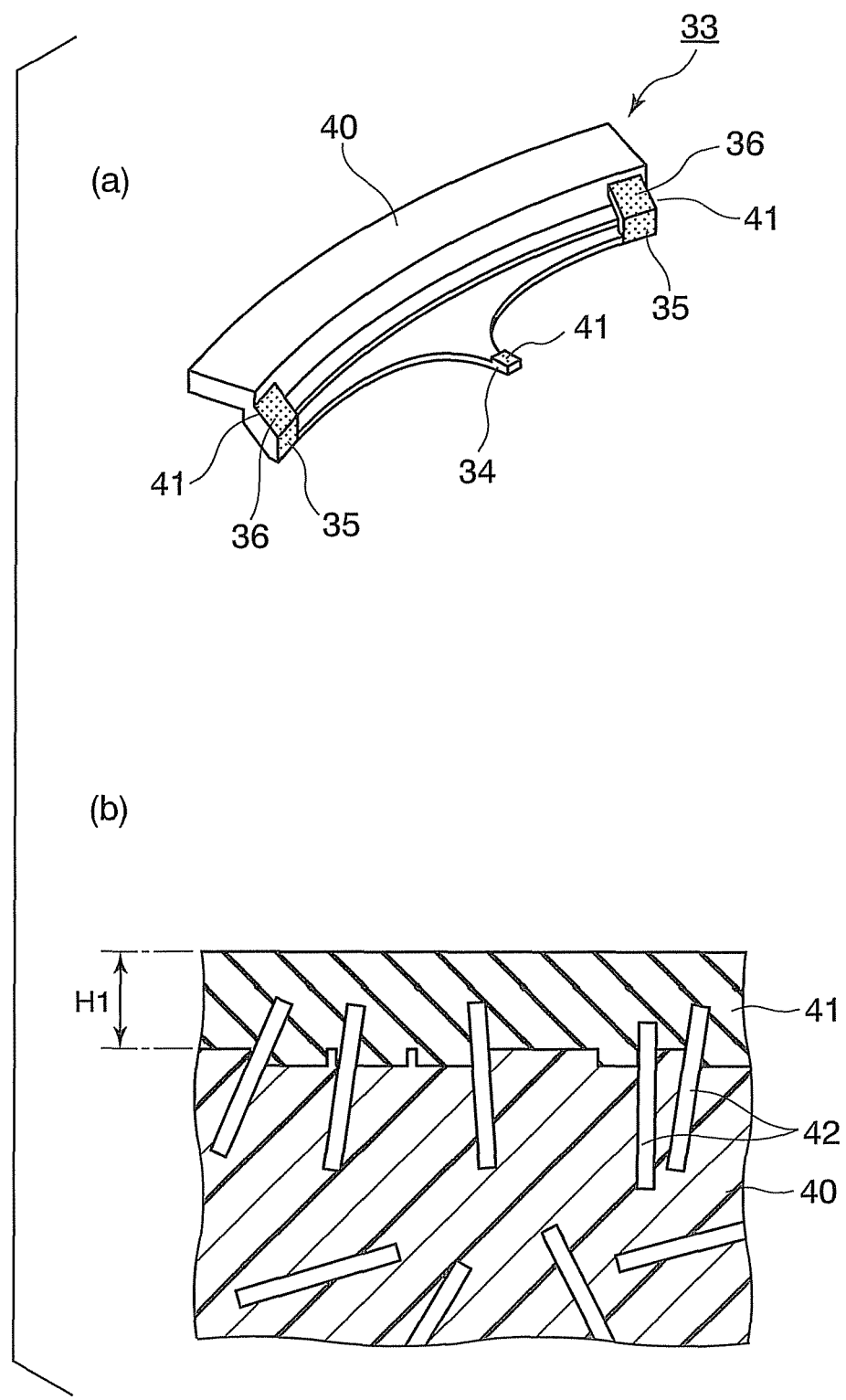
FIGS. 7(a) and 7(b) are a perspective view of a wafer hold member and a longitudinal, sectional view of the surface of the wafer hold member, respectively.
Figure 8:
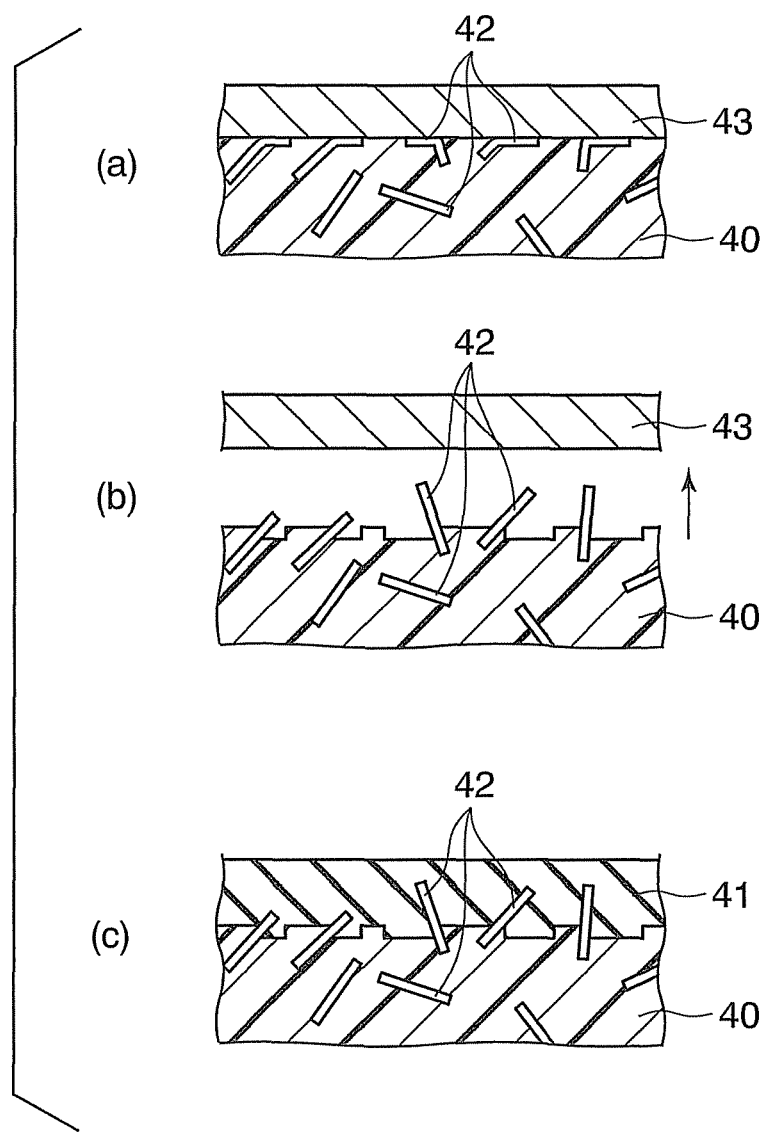
FIGS. 8(a) to 8(c) are process diagrams that illustrate manufacturing steps for the wafer hold member.
Figure 9:
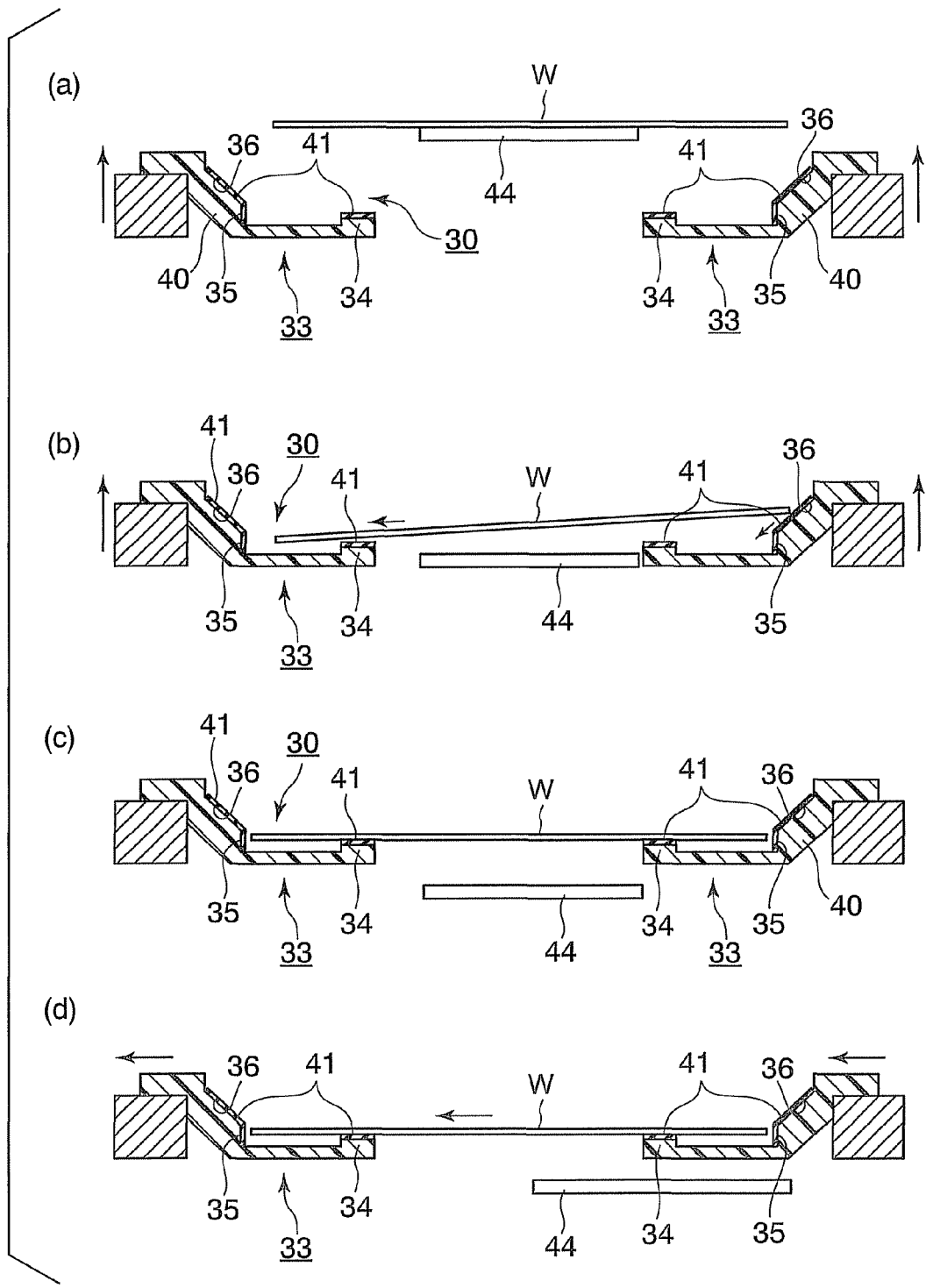
FIGS. 9(a) to 9(d) are process diagrams that illustrate steps in which a wafer is transferred to the wafer transport section.
Figure 10:
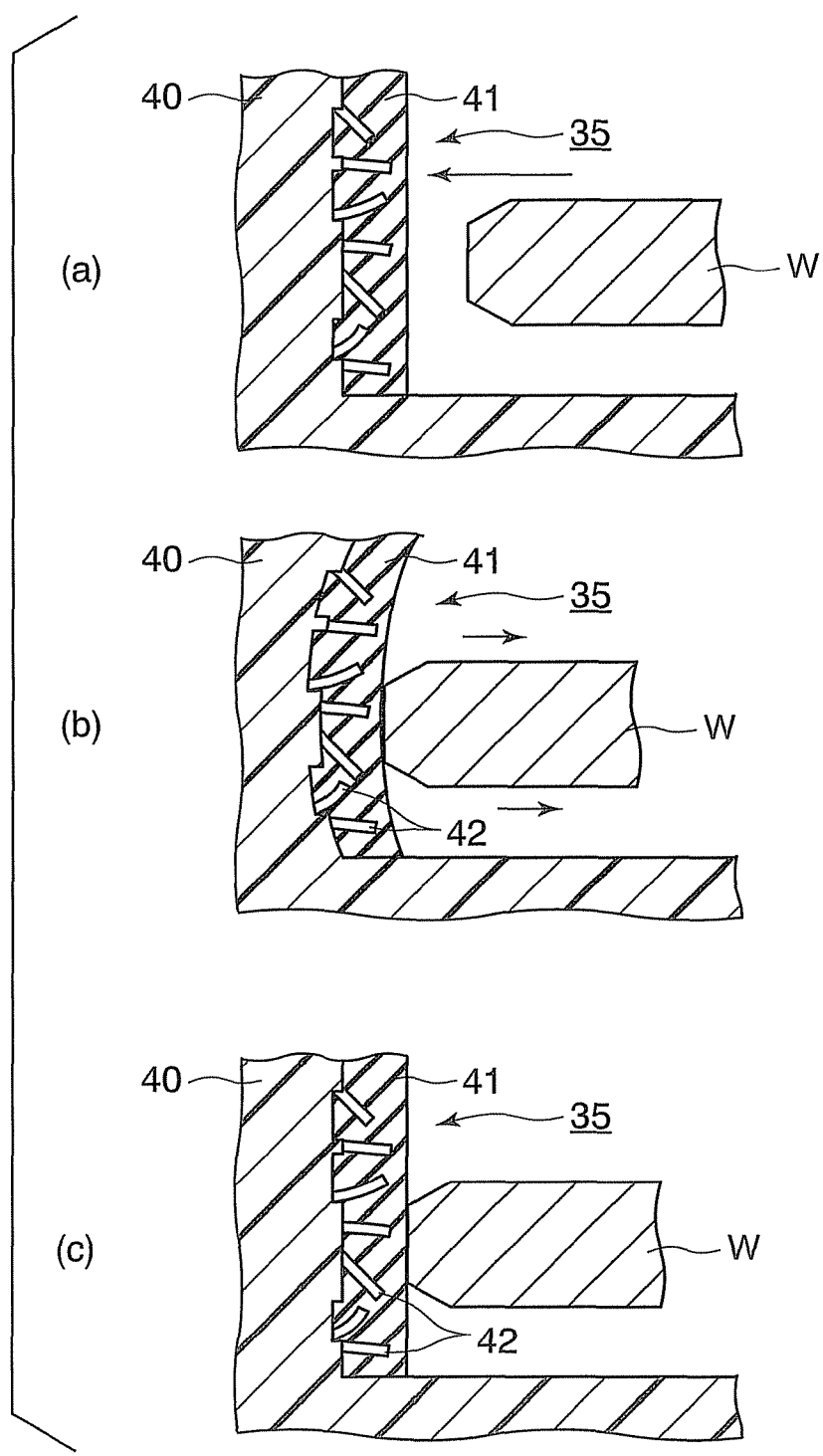
FIGS. 10(a) to 10(c) are explanatory diagrams illustrating how a wafer collides against a sidewall of the wafer hold member.
Figure 11:
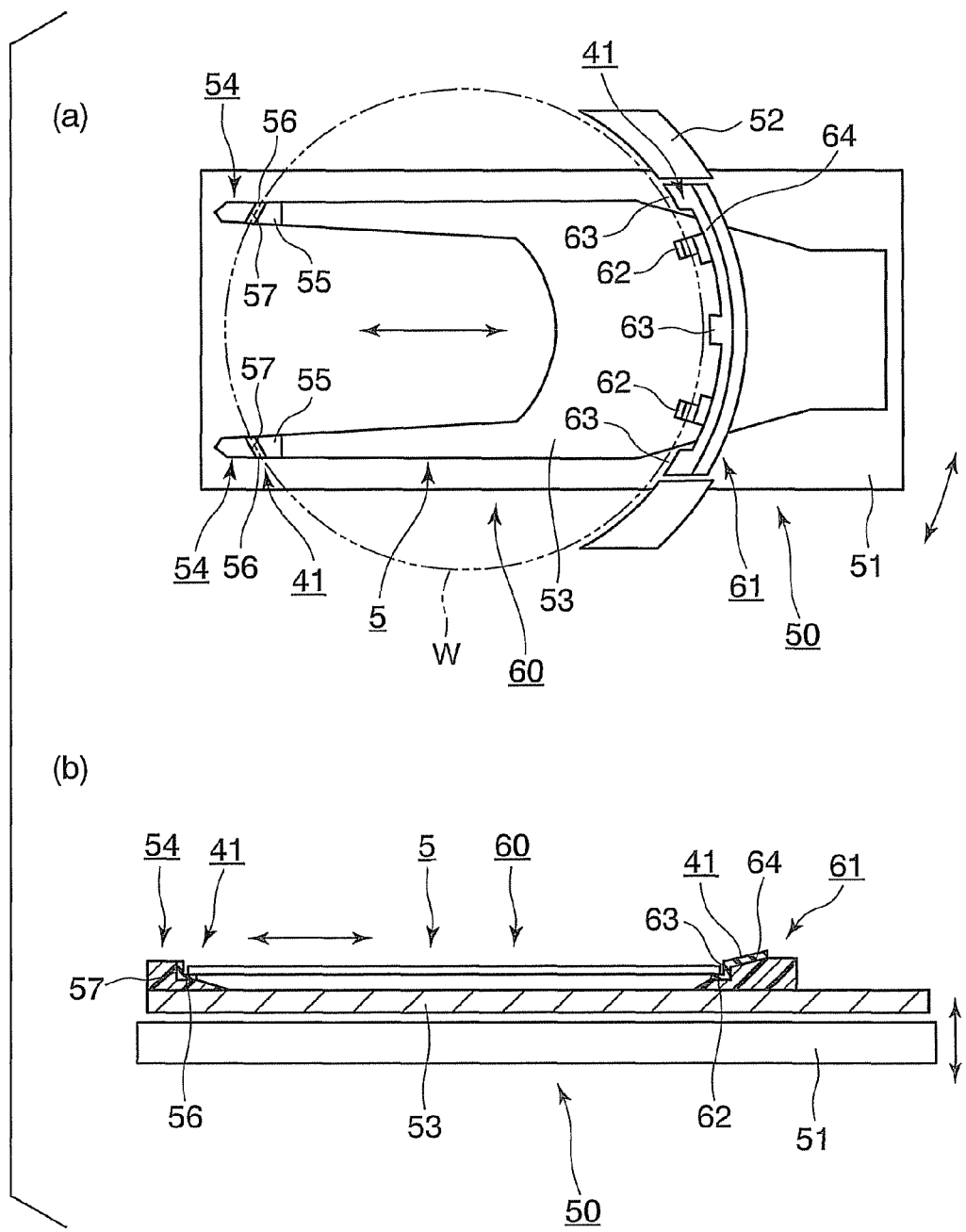
FIGS. 11(a) and 11(b) are a plan view, and a longitudinal, sectional side view, respectively, of an interface arm of the coating/developing apparatus.

As shown in FIGS. 6 and 7(b), the protective film 41 made of diamond-like carbon (DLC) that is an amorphous hard film made of a hydrocarbon or of an allotrope of carbon is formed on the surfaces of the lower-surface support section 34, the lower vertical wall 35, and the inclined section 36. Compared with the base material 40, the DLC has high hardness and hence, high resistance to wear. In addition, the DLC has high corrosion resistance against various chemicals and is low in friction coefficient, compared with the base material 40.

In order to lower the friction coefficient and so as to prevent chemicals from being supplied to the base material 40 via clearances between the protective film 41 and the carbon fibers 42 protruded from the surface of the base material 40, the protective film 41 is formed to serve as a covering for the front end of each carbon fiber 42 and obtain film thickness greater than length of the protruded front end. If the thickness H1 of the protective film 41 in FIG. 7(b) is too small, the film lacks fineness or denseness and is therefore liable to permit chemicals to penetrate the protective film 41 and erode the base material 40. Conversely if the film thickness is too large, the wafer W is, as will be further detailed later herein, liable not to change in shape according to a particular shape of the base material 40 in case of a collision, and absorptiveness of its shock could consequently decrease. Therefore, preferable thickness is, for example, between 1 μm and 10 μm.

A method of manufacturing the wafer hold member 33 is described below.

The above-mentioned resin is mixed in molten form with a large number of carbon fibers 42, and after this, a metallic mold 43 for forming the wafer hold member 33 is filled with the mixture. The resin is then cured inside the mold 43, thereby to form the base material 40. FIG. 8(a) illustrates a boundary between the base material 40 and the mold 43, and indicates that the carbon fibers 42 existing near the boundary each have a bent front end in firm contact with the mold 43 after the fiber end was pressed against the mold 43 for reasons such as expansion and contraction of the resin during curing. In addition, in some cases, slight projections and depressions are formed on the surface of the base material 40 according to a particular inner-surface roughness level or shape of the mold 43. Next after removal of the wafer hold member 33 from the mold 43, the bent front ends of the carbon fibers 42 become straight on the surface of the wafer hold member 33, either by repulsive force (resilience) of the fiber ends to leap outward, or according to the inner-surface shape of the mold 43, and finally, leap out to the surface. This state is shown in FIG. 8(b). Referring to the fibers 42, although the front end protruding to the surface of the base material 40, and the section remaining inside the base material 40 are depicted with the same thickness in each figure, the front end may be crushed by the mold 43 and reduced in diameter in comparison with the section remaining inside the base material 40.

After that, as shown in FIG. 8(c), the protective film 41 is formed using, for example, physical vapor deposition (PVD) or chemical vapor deposition (CVD). More specifically, since the base material 40 has complex projections and depressions formed on its surface with the carbon fibers 42 protruded thereto, the protective film 41 is intricately formed with the projections and the depressions. The protective film 41 is therefore formed with high adhesion to the base material 40. Referring to the fibers 42, although the front end protruding to the surface of the base material 40, and the section remaining inside the base material 40 are depicted with the same thickness in each figure, the front end may be crushed by the mold 43 and reduced in diameter in comparison with the section remaining inside the base material 40.

For example, if a plasma CVD method is used to form the protective film 41 of the DLC, the carbon compound gases commonly used for DLC formation, such as methane ($CH_4$), ethane ($C_2H_6$), propane ($C_3H_8$), butane ($C_4H_{10}$), acetylene ($C_2H_2$), benzene ($C_6H_6$), carbon tetrafluoride ($CF_4$), and dicarbon hexafluoride ($C_2F_6$), are employed as source gases.

As necessary, a hydrogen gas, an inert gas, or the like is mixed with the above carbon compound gases, as a carrier gas, and the mixture is supplied to the base material 40 to deposit the film.

Next, a process in which the wafer transport section 3 of the transport arm A3 receives a wafer W from a stage 44 provided in the transfer unit BF 3 is described below referring to FIGS. 9(a) to 9(d). The wafer transport section 3 moves forward toward the stage 44 and is positioned below the wafer W mounted on the stage 44, as shown in FIG. 9(a). After this, the wafer transport section 3 moves upward and then the wafer W is transferred thereto. This transfer is performed, for example, with the wafer W having its lower surface supported on the lower-surface support section(s) 34 of a part of the four wafer hold members 33, and with the wafer W having its peripheral edge inclined to be positioned on part of the four inclined sections 36. FIG. 9(b) shows the transfer step.

When the wafer W is thus transferred to the wafer hold members 33, damage to the inclined section 36 and the lower-surface support section 34 due to any shocks during the transfer is suppressed since both sections are covered with the protective film 41. In addition, at this time, even if a mist of chemicals is adhering to, for example, the lower surface of the wafer W and a bevel section thereof that is a periphery, chemical erosion due to the mist is prevented since the protective film 41 prevents the mist from adhering to the base material.

Since the protective film 41 is low in friction coefficient, the peripheral edge of the wafer W slides downward from each inclined section 36 and at the same time, the wafer W slides along the surface of each lower-surface support section 34, and thus as shown in FIG. 9(c), the wafer W is positioned in the support region 30 surrounded with the lower sidewalls 35, and retained horizontally.

After this, when the wafer hold member 33 moves in a horizontal direction, the wafer W slides along the lower-surface support section 34 and collides against the lower vertical wall 35 by inertial force. A state of the lower vertical wall 35 at this time is described below referring to FIGS. 10(a) to 10(c). The collision exerts a stress on the wafer hold member 33, causing a change in a shape of the base material 40 formed from the resin. At this time, the protective film 41 also changes in shape to match to the shape of the base material 40, since, as described above, the protective film 41 is intricately mixed with the carbon fibers 42 to obtain high adhesion to the base material 40. The above changes in the shapes of the protective film 41 and the base material 40 disperse the stress from the colliding section of the wafer W, at the lower vertical wall 35, and the dispersed stress is absorbed in various portions by the base material 40. This state is shown in FIGS. 10(a), 10(b). When the stress is thus made weak, the base material 40 returns to its original shape by its restoration force and the protective film 41 also returns to its original shape by following the shape of the base material 40, as shown in FIG. 10(c).

The way the stress is absorbed has been described taking the lower vertical wall 35 as an example. The same also applies to the lower-surface support section 34 and the inclined section 36. That is to say, as described above, even when a strong stress is applied to the wafer W during its transfer or during its sliding along the surface, the stress is widely dispersed similarly to that of the lower vertical wall 35, since the protective film 41 is formed with high adhesion to the base material 40. High resistance to wear is therefore obtained. Additionally, when the wafer W slides along the surface of the lower-surface support section 34 and collides against the lower vertical wall 35, even if a mist of chemicals is adhering to the wafer W, the protective film 41 prevents chemical erosion of various sections.

As described above, each wafer hold member 33 of the wafer transport section 3 includes the lower-surface support section 34 that retains the wafer W, the inclined section 36 that guides the wafer W so that the wafer W is retained by the lower-surface support section 34, and the lower vertical wall 35 that surrounds the periphery of the wafer W and restricts a position thereof. In addition, the protective film 41 constructed of the DLC is formed on the surfaces of the lower-surface support section 34, the inclined section 36, and the lower vertical wall 35. Therefore, wear on these sections due to physical shocks from the wafer W, and chemical erosion of each section due to the adhering of chemicals via the wafer W are suppressed and hence, changes in shape are suppressed. As a result, the wafer W is reliably retained in the support region 30 of the wafer transport section 3. A fall of the wafer W from the wafer transport section 3 during transport, and improper transfer of the wafer W to the module on which it is to be mounted are thus suppressed. Furthermore, the DLC, because of its low friction coefficient, makes the wafer W easily slide along the surfaces of the inclined section 36 and the lower-surface support section 34 and allows more reliable retaining of the wafer W in the support region 30 of the wafer transport section 3.

Moreover, the configuration with the protective film 41 covering the carbon fibers 42 protruded to the base material 40 as described above improves the adhesion of the protective film 41 to the base material 40 and strength of the protective film 41, making the base material 40 absorb shocks, and yielding higher wear resistance. This configuration also suppresses the shock applied to the wafer W, and reduces wafer damage such as chipping. Besides, covering the protruded carbon fibers 42 with the protective film 41 is effective for suppressing a situation under which, when a shock is exerted upon the base material 40, the carbon fibers 42 fall therefrom and fly about in the form of particles.

As described above, the protective film 41 is constructed of DLC. The DLC contains carbon (C) and hydrogen (H) as elements of its main constituents. The protective film 41 may be formed as a DLC film containing, for example, silicon (Si), a combination of Si and nitrogen (N), a combination of Si and oxygen (O), fluorine (F), or a combination of C, H, $SiO_2$, as main constituents in addition to C and H. The N in the above is contained as, for example, a CN radical, in the film. Since F enhances water repellence, the film preferably contains F to obtain higher water repellence against chemicals. In addition, Si enhances hardness and hence, wear resistance, so the film preferably contains Si to obtain greater smoothness and a lower friction coefficient as well.

A material capable of suppressing damage to the wafer W to be transported is preferably selected as a constituent material of the protective film 41. From this point of view, if the wafer W is constructed of silicon, for example, and the DLC also contains silicon, since damage to both the wafer W and the protective film 41 due to chafing against each other could occur, silicon-free DLC is preferably used to form the protective film 41.

For further improved adhesion between the protective film 41 and resin base material 40 in the above example, prior to the formation of the protective film 41, more complex projections and depressions may be formed on the surface of the base material 40 by, for example, performing an abrasive blasting process on the surface after releasing the base material 40 from the mold 43. The strength of the base material 40 and the adhesion of the protective film can likewise be improved by, for example, including glass fibers, instead of carbon fibers, as fiber bodies in the resin base material 40.

The kind of material constituting the protective film 41 is not limited to DLC and can be, for example, a ceramic material such as SiC or AlN (aluminum nitride), quartz, or the like, provided that the material has high corrosion resistance or high hardness against various chemicals. Further alternatively, the protective film 41 may be formed using, for example, a highly wear-resistant C- and/or H-based hydrocarbon resin with a high-carbon-content purified hydrocarbon homogenously mixed into an acrylic resin such as polycarbonate. The hydrocarbon resin in this case has a carbon content of at least 80%, for example.

The protective film 41 preferably ranges, for example, between 1,000 and 3,000 in Vickers hardness, and for smoothness, between 0.5 nm and 1.0 nm in Ra, and up to 0.2 in friction coefficient. In addition, for film deposition on the base material made of a resin as described above, a material that allows the deposition at a low temperature of, for example, 200° C. or less, is preferably selected to prevent deterioration of the base material.

The wafer hold members of the transport arms A1, A2, and A4 each, and of the transfer arm D1, are constructed similarly to the wafer hold member 33 of the transport arm A3.

A wafer transport section 5 provided in the interface arm 50 is described below as another example of a wafer transport section, with reference being made to FIG. 11(a) that is a plan view of the interface arm 50, and FIG. 11(b) that is a longitudinal, sectional side view thereof. The description focuses primarily on differences with respect to the wafer transport section 3. The wafer transport section 5 is provided so as to move back and forth above a pivoting base 51 shown in FIG. 11(a), and the pivoting base 51 is liftably and pivotally constructed, as with the pivoting base 27. In addition, the pivoting base 51 includes pressing sections 52 for matching a position of a wafer W on both left and right sides of the wafer transport section 5, and the pressing sections 52 move with the pivoting base 51.

The wafer transport section 5 includes a frame 53 formed into a two-forked shape, the frame 53 having, at both of its distal ends, wafer hold members 54 each constructed of carbon fibers 42 and a base material 40 similarly to the wafer hold member 33. The base material 40 is formed to retain the fibers 42, and the wafer hold members 54 are each formed through substantially the same manufacturing steps as those of the wafer hold member 33. Each wafer hold member 54 includes a lower-surface support section 56 for supporting the wafer W horizontally, and a vertical wall 57 provided at a distal end of the lower-surface support section 56. The lower-surface support section 56 and the vertical wall 57 are covered with the protective film 41. The vertical wall 57 restricts the position of the wafer W on the wafer hold member 54.

In addition, the frame 53 has at its proximal end a wafer hold member 61 constructed of carbon fibers 42 and the base material 40 through substantially the same manufacturing steps as those of the wafer hold member 33. The wafer hold member 61 includes lower-surface support sections 62 for supporting the lower surface of the wafer W horizontally, lower vertical walls 63 provided at a proximal end of each lower-surface support section 62, and an inclined section 64 inclined downward from the proximal end of the lower-surface support section 62, toward a distal end thereof. The inclined section 64, as with the inclined section 36, guides the wafer W to the lower-surface support section 62. The lower-surface support section 62 and each lower vertical wall 63 are covered with the protective film 41. Reference number 60 in FIGS. 11(a), 11(b) denotes the support region for the wafer W, surrounded by the lower vertical wall 63 and the vertical wall 57. Sections covered with the protective film 41 are each shown with a number of points in FIG. 12. The wafer transport section 5 formed from the frame 53 and the wafer hold members 54, 61, constitutes a substrate support member.

How the wafer transport section 5 receives the wafer W from a stage 69 provided in the transfer unit CPL 12 is described below using FIGS. 13(a) to 13(e). The wafer transport section 5 moves forward toward the stage 69 and then after being positioned under the wafer W mounted thereon, moves upward. This state is shown in FIGS. 13(a), 13(b).

Next while having its lower surface supported on the lower-surface support sections 56 and the inclined section 64, the wafer W is transferred, for example, in an inclined condition, to the wafer transport section 5. This condition is shown in FIG. 13(c). After this, the wafer transport section 5 reverses and the periphery of the wafer W abuts the pressing sections 52. The wafer W is then pushed toward a distal end of the wafer transport section 5, slides downward from the inclined section 64, and is supported on each lower-surface support section 56, 62 horizontally. This state is shown in FIG. 13(d). The wafer W slides along the surface of the lower-surface support section 56, 62 by inertial force, abuts the vertical wall 57, and stops. This state is shown in FIG. 13(e). When the wafer W is thus transferred to the wafer transport section 5 and then further transported, even if the wafer W comes into contact with any sections of the wafer hold member 54, 61, the protective film 41 suppresses wear and chemical erosion of those sections.

The wafer transport section 5 of the interface arm 50 has been described. The wafer transport section of the transfer arm 12 is constructed similarly to the wafer transport section 5. The wafer transport sections 3, 5 may have their entire surfaces covered with the protective film 41, or the wafer transport section 5 may have its pressing sections 52 covered with the protective film 41.

Next, the heating plate 7 provided as part of the substrate support device, in the heating module 21 of the COT layer block B3, is described below referring to FIG. 14(a) that is a plan view of the heating plate 7, and FIG. 14(b) that is a longitudinal, sectional side view thereof. The heating plate 7 that also serves as a stage on which to mount a wafer W is formed into a flat, circular shape with three holes 71 arranged in a circumferential direction of the heating plate 7 and extending in a longitudinal direction thereof. Only two of the three holes are shown in FIG. 14(b). A lift pin 73 driven by a lifter 72 to move upward and downward is provided in each hole 71, and the pin 73 remains concealed under, and sticks out from, the surface of the heating plate 7. A heater for heating the wafer W is disposed in the heating plate 7.

A plurality of (in the present example, four) support pins 74 are arranged as lower-surface support sections on the heating plate 7 externally to the holes 71 in the circumferential direction of the heating plate 7. The support pins 74 support the wafer W so as to make the wafer lie with a clearance above the surface of the heating plate 7. In addition, a number of position-restricting pins 75 for preventing the wafer W from sliding out from the heating plate 7 are arranged at peripheral edges thereof. The support pins 74 and the position-restricting pins 75 are manufactured through substantially the same manufacturing steps as those of the wafer hold members 33. Each support pin 74 and each position-restricting pin 75, as with each wafer hold member 33, are constructed of the carbon fibers 42 and the base material 40 formed from the PEEK resin, and have a surface covered with the protective film 41.

A process in which a wafer W is transferred to the heating plate 7 is described below referring to FIGS. 15(a) to 15(c). After the wafer W has been transferred to the cooling plate 24, the cooling plate 24 moves to a position above the heating plate 7 and then the lift pins 73 move upward to support the lower surface of the wafer W, as shown in FIG. 15(a). Next after the cooling plate 24 has exited from its position above the heating plate 7, the lift pins 73 move downward to lower the wafer W to the support pins 74, as shown in FIG. 15(b).

At this time, air between the heating plate 7 and the lower surface of the wafer W may cause the wafer W to slide along the surfaces of the support pins 74 and collide against the position-restricting pins 75, as shown in FIG. 15(c). However, the protective film 41, as with the wafer hold members 33, prevents the support pins 74 and the position-restricting pins 75 from becoming worn and damaged. Even if the wafer W has any chemicals adhering thereto, the support pins 74 and the position-restricting pins 75 are also prevented from becoming chemically eroded.

The above-described protective film can be applied to, in addition to the sections described in each above example, all other sections that are likely to come into contact with the substrate. For example, the protective film 41 may be formed on the surface of a stage on which to mount a substrate in a deposition apparatus or etching apparatus, or position-restricting pins 74 covered with the protective film 41 may be provided. Alternatively, the protective film 41 may be deposited at a contact section of the wafer W on the surface of the cooling plate provided for cooling the wafer.

The protective film 41 may be deposited on all surfaces of each wafer hold member 33, 54, 61 using an appropriate method for depositing the protective film, or may be deposited at least in a section of a contact region of the substrate. In addition, a known resin in addition to PEEK can be used as the resin that forms part of the base material 40.

(Evaluation Tests 1)

Figure 16:
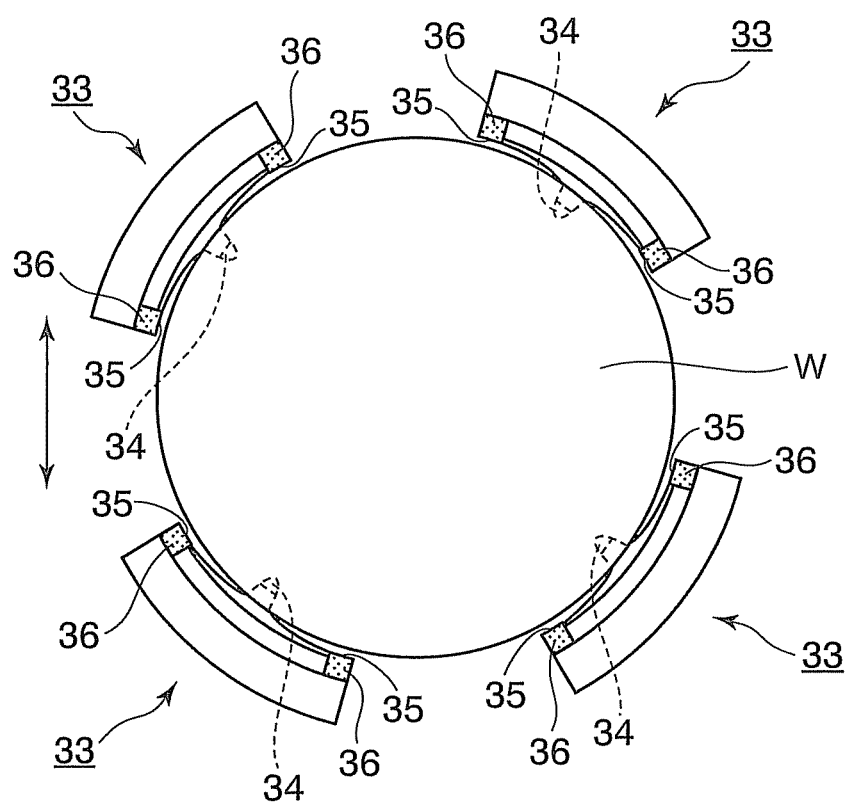
FIG. 16 is an explanatory diagram of a device used for evaluation tests.

Evaluation tests 1-1 were performed with four wafer hold members 33 arranged in a circumferential direction and a wafer W mounted on and supported on respective lower-surface support sections 34, as shown in FIG. 16. The wafer hold members 33 are connected to a drive not shown, and are adapted so that while maintaining a predetermined spacing between one another, the wafer hold members 33 reciprocate in a horizontal direction as indicated by arrows in the figure. In addition, the wafer hold members 33 are positionally preadjusted so that respective lower walls 35 are slightly spaced apart from a periphery of the wafer W. However, the protective film 41 made of the DLC described in the first embodiment is not formed on the wafer hold members 33. Furthermore, the wafer hold members 33 used in the tests are each constructed of a predetermined resin instead of the PEEK resin described in the first embodiment. In the predetermined resin, carbon fibers are included in substantially the same form as in the first embodiment. After wafer W mounting, the wafer hold members 33 are reciprocated 200,000 times and the wafer W is made to collide against the respective lower walls 35 each time. During the tests, depths of any traces of wear, formed on each lower wall 35 after collisions, were measured using a microscope.

Evaluation tests 1-1 were followed by evaluation tests 1-2 similar to tests 1-1. In evaluation tests 1-2, depths of any traces of wear, formed on each lower wall 35 after collisions, were measured. The test conditions, however, differ in that as described in the first embodiment, the protective film 41 is formed on the wafer hold members 33, and in that the film is 3 μm thick. In addition, tests similar to evaluation tests 1-2 were performed as evaluation tests 1-3, and depths of any traces of wear, formed on each lower wall 35, were measured. The wafer hold members 33 in evaluation tests 1-3 are constructed of the same PEEK resin material as used in the first embodiment. The protective film 41 is formed on the wafer hold members 33 similarly to that of the first embodiment, and the film has the same thickness of 3 μm as used in evaluation tests 1-2. The wafer hold members 33 were reciprocated 200,000 times.

Furthermore, tests similar to evaluation tests 1-2 were performed as evaluation tests 1-4, and depths of any traces of wear, formed on each lower wall 35, were measured. The reciprocation of the wafer hold members 33 was repeated 10,000,000 times. The protective film 41 formed on various sections of each wafer hold member 33 has the same thickness of 3 µm as used in evaluation tests 1-2.

Furthermore, tests similar to evaluation tests 1-3 were performed as evaluation tests 1-5, and depths of any traces of wear, formed on each lower wall 35, were measured. The wafer hold members 33 in evaluation tests 1-5, however, are constructed of the predetermined resin that is substantially the same material as that of the wafer hold members 33 used in evaluation tests 1-2. The protective film 41 is formed on the wafer hold members 33 similarly to that of the first embodiment, and the film has a thickness of 8 µm. The wafer hold members 33 were reciprocated 10,000,000 times.

Furthermore, tests similar to evaluation tests 1-4 were performed as evaluation tests 1-6. The reciprocation of the wafer hold members 33 was repeated 10,000,000 times and depths of any traces of wear were measured on the lower-surface support sections 34.

Moreover, tests similar to evaluation tests 1-3 were performed as evaluation tests 1-7. The reciprocation of the wafer hold members 33 was repeated 10,000,000 times and depths of any traces of wear were measured on the lower-surface support sections 34.

Besides, tests similar to evaluation tests 1-5 were performed as evaluation tests 1-8. The reciprocation of the wafer hold members 33 was repeated 10,000,000 times and depths of any traces of wear were measured on the lower-surface support sections 34.

Figure 17:
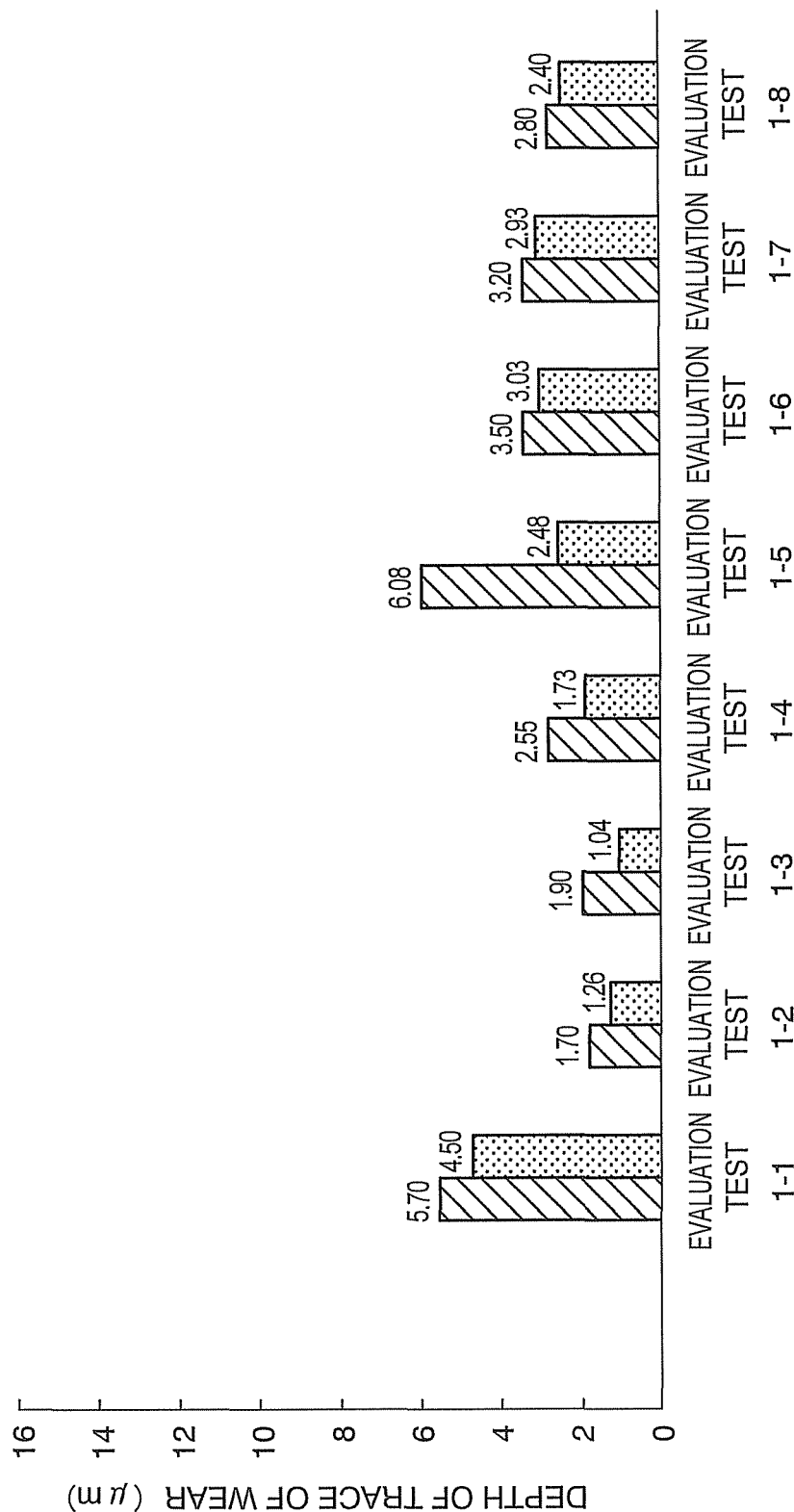
FIG. 17 is a graph that represents evaluation test results.

FIG. 17 shows results of evaluation tests 1-1 to 1-8. The greatest depth of the formed traces of wear, and an average depth value thereof are represented by a graph having slant lines and a graph having a number of points, respectively, for each identification number of the evaluation tests. These test results are shown above each graph and expressed in units of µm. As represented by the graphs, the maximum and average depth values of the formed traces of wear in evaluation tests 1-2 are both smaller than those of evaluation tests 1-1. That is to say, the results of evaluation tests 1-1 and 1-2 indicate that as described in the first embodiment, the deposition of the protective film 41 improves the lower wall 35 of each wafer hold member 33 in wear resistance. In addition, although the number of collisions of the wafer W against the lower wall 35 in evaluation tests 1-4 is greater than in evaluation tests 1-1, the maximum and average depth values of the formed traces of wear in evaluation tests 1-4 are smaller than those of evaluation tests 1-1. These results also indicate that the deposition of the protective film 41 improves the wear resistance of the lower wall 35.

It can be seen from the results of evaluation tests 1-3 and 1-5 that even when the kind of resin forming the wafer hold member 33, and the film thickness of the protective film 41 are changed, the wear resistance of the lower wall 35 is increased above that obtained in evaluation tests 1-1. In addition, since the maximum and average depths of the formed traces of wear in evaluation tests 1-6 to 1-8 are held down to relatively small values, the formation of the protective film 41 is considered to be effective for the lower-surface support section 34 as well.

(Evaluation Tests 2)

In evaluation tests 2-1, an undiluted solution of sulfonic acid was drip-applied to wafer hold members 33, and depths of any consequential traces of wear (erosion) were measured using a microscope. The protective film 41, however, is not formed on the wafer hold members 33. In addition, each wafer hold member 33 is constructed of the predetermined resin used in evaluation tests 1-1, instead of the PEEK resin.

In evaluation tests 2-2, as in the first embodiment, an undiluted solution of sulfonic acid was drip-applied to wafer hold members 33 each having the protective film 41 formed on various sections in a manner similar to that of evaluation tests 2-1, and depths of any consequential traces of wear were measured using a microscope. Each wafer hold member 33 is constructed of the predetermined resin used in evaluation tests 2-1, and the protective film 41 is 1 µm thick.

Tests similar to evaluation tests 2-2 were performed as evaluation tests 2-3 using wafer hold members 33 each having a 3-µm thick protective film 41.

Tests similar to evaluation tests 2-2 were performed as evaluation tests 2-4 using wafer hold members 33 each having a 6-µm thick protective film 41.

Tests similar to evaluation tests 2-2 were performed as evaluation tests 2-5 using wafer hold members 33 each having a first protective film and a second protective film stacked thereupon. The first protective film and the second protective film are both 3 µm thick, and a mixing ratio between the elements constituting the first protective film, and a mixing ratio between the elements constituting the second protective film differ from each other.

Tests similar to evaluation tests 2-2 were performed as evaluation tests 2-6 using wafer hold members 33 each having an 8-µm thick protective film 41.

Tests similar to evaluation tests 2-2 were performed as evaluation tests 2-7 using wafer hold members 33 each constructed of PEEK and having a 3-µm thick protective film 41. A mixing ratio between the elements constituting the protective film 41 differs from the mixing ratios between the elements constituting the protective films 41 used in evaluation tests 2-1 to 2-4, and 2-6.

Tests similar to evaluation tests 2-1 were performed as evaluation tests 2-8 using wafer hold members 33 each constructed of PEEK and having a 3-µm thick protective film 41. A mixing ratio between the elements constituting the protective film 41 is the same as any one of the mixing ratios between the elements constituting the protective films 41 used in evaluation tests 2-1 to 2-4, and 2-6.

Tests similar to evaluation tests 2-1 were performed as evaluation tests 2-9 using wafer hold members 33 each constructed of polyimide and having a 3-µm thick protective film 41. A mixing ratio between the elements constituting the protective film 41 is the same as the mixing ratio between the elements constituting the protective film 41 used in evaluation tests 2-7.

Tests similar to evaluation tests 2-1 were performed as evaluation tests 2-10 using wafer hold members 33 each constructed of polyimide and having a 3-µm thick protective film 41. A mixing ratio between the elements constituting the protective film 41 is the same as any one of the mixing ratios between the elements constituting the protective films 41 used in evaluation tests 2-1 to 2-4, and 2-6.

Figure 18:
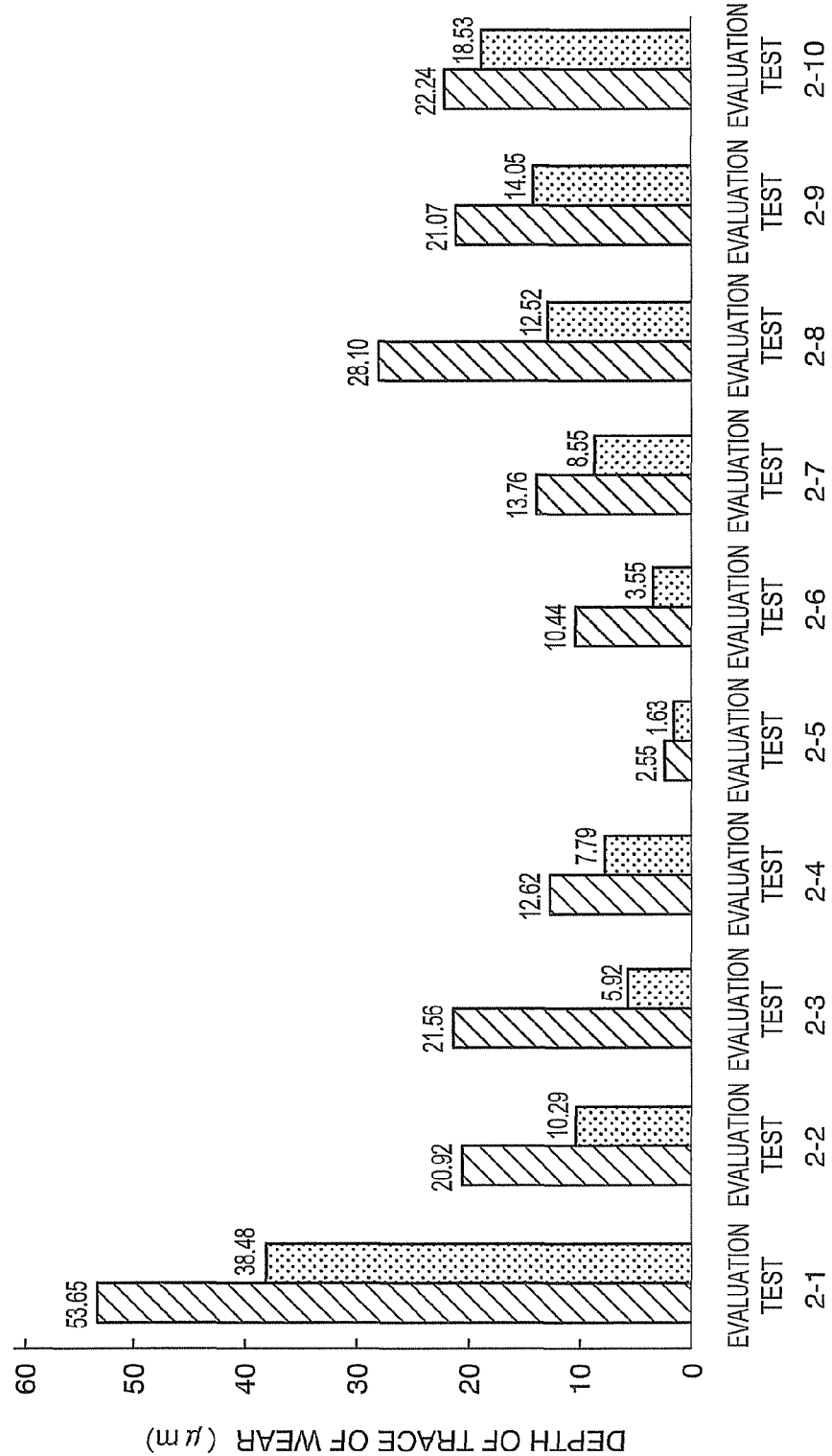
FIG. 18 is a graph that represents other evaluation test results.
Figure 19:
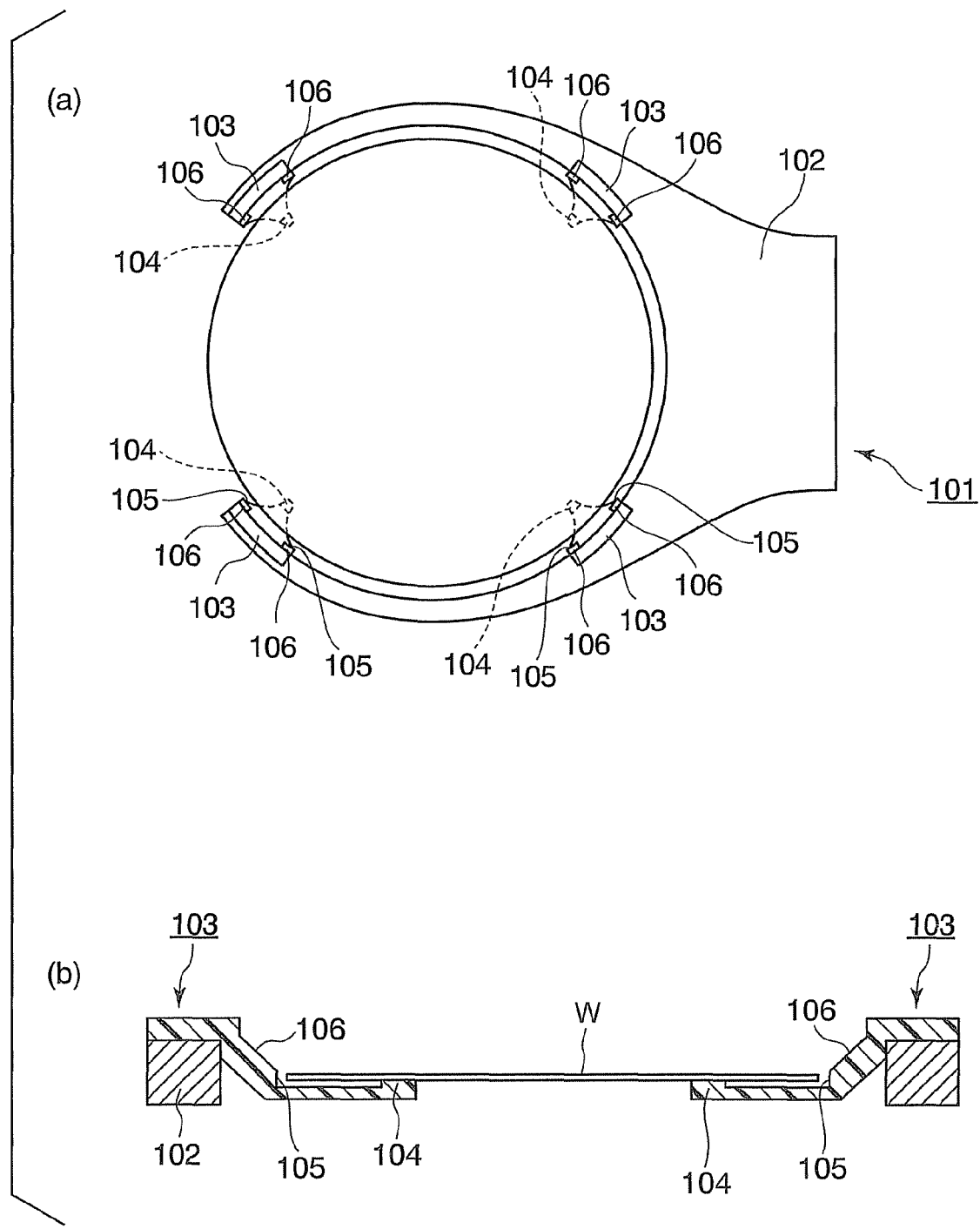
FIGS. 19(a) and 19(b) are a plan view, and a longitudinal, sectional side view, respectively, of a wafer transport section in a conventional transport arm.
Figure 20:
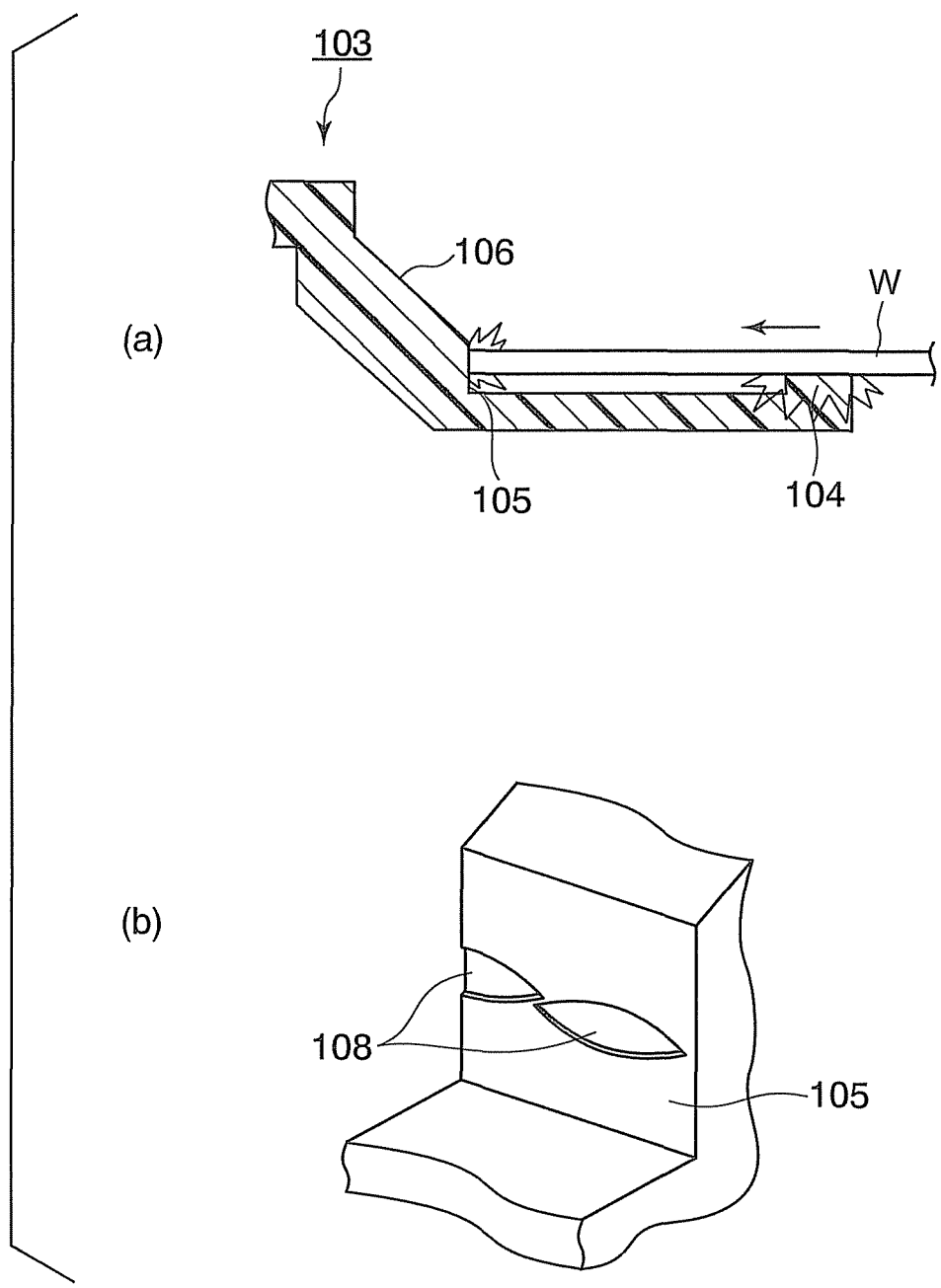
FIGS. 20(a) and 20(b) are explanatory diagrams that illustrate how the conventional transport arm gets worn.

FIG. 18 shows results of evaluation tests 2-1 to 2-10. As with FIG. 17, FIG. 18 represents the greatest depth of any formed traces of wear and an average depth value thereof, by a graph with slant lines and a graph with a number of points, respectively, for each identification number of the evaluation tests. These test results are shown above each graph and expressed in units of µm. As represented by the graphs, the maximum and average depth values of the formed traces of wear in evaluation tests 2-2 to 2-6 are both smaller than those of evaluation tests 2-1. That is to say, the results of evaluation tests 2-1 to 2-6 indicate that the formation of the protective film 41 improves acid resistance.

If the protective film 41 is too thin, this results in carbon fibers being lost, and conversely if the protective film 41 is too thick, this results in pinholes being formed. Neither the loss of carbon fibers nor the formation of pinholes was observed during or after evaluation tests 2-5. These facts indicate that the protective film 41 is in a particularly preferable, deposited state. In addition, the maximum and average depth values of the traces of wear, formed in evaluation tests 2-5, are the smallest of all test results including other evaluation tests. Depositing the film in the form discussed in the above description of evaluation tests 2-5 is therefore particularly preferable.

The maximum and average depth values of the traces of wear, formed in evaluation tests 2-7 to 2-10, are also held down to relatively small values. In addition, these results indicate that forming the protective film 41 is effective for improving resistance to erosion.

Second Embodiment

Next, a second embodiment of the present invention will be described referring to FIGS. 21 to 30.

In the second embodiment of FIGS. 21 to 30, the same sections as those of the first embodiment shown in FIGS. 1 to 18 are each assigned the same reference number or symbol, and detailed description of the same sections is omitted.

Figure 21:
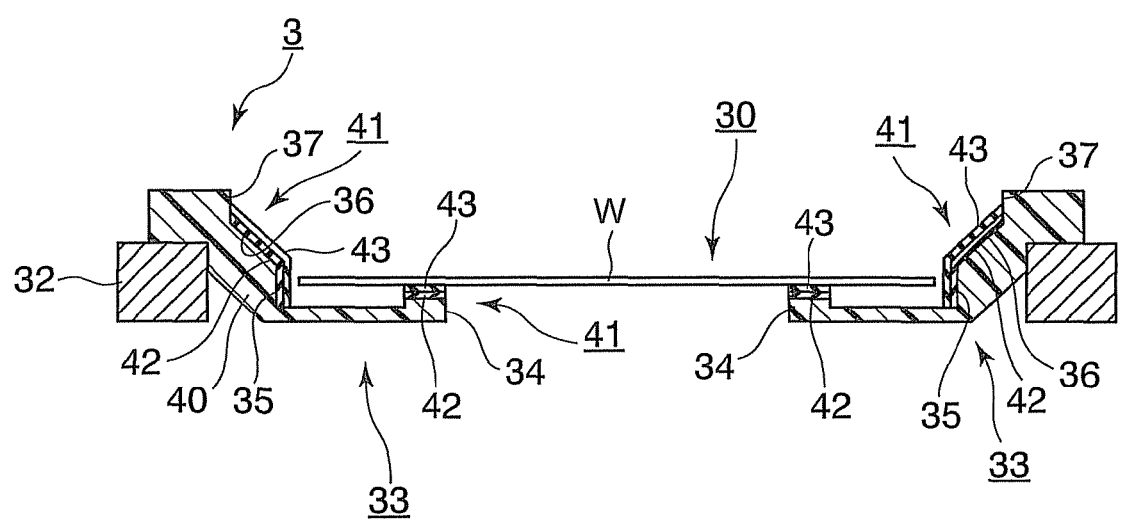
FIG. 21 is a longitudinal, sectional side view of a wafer transport section in a second embodiment of the present invention.
Figure 22:
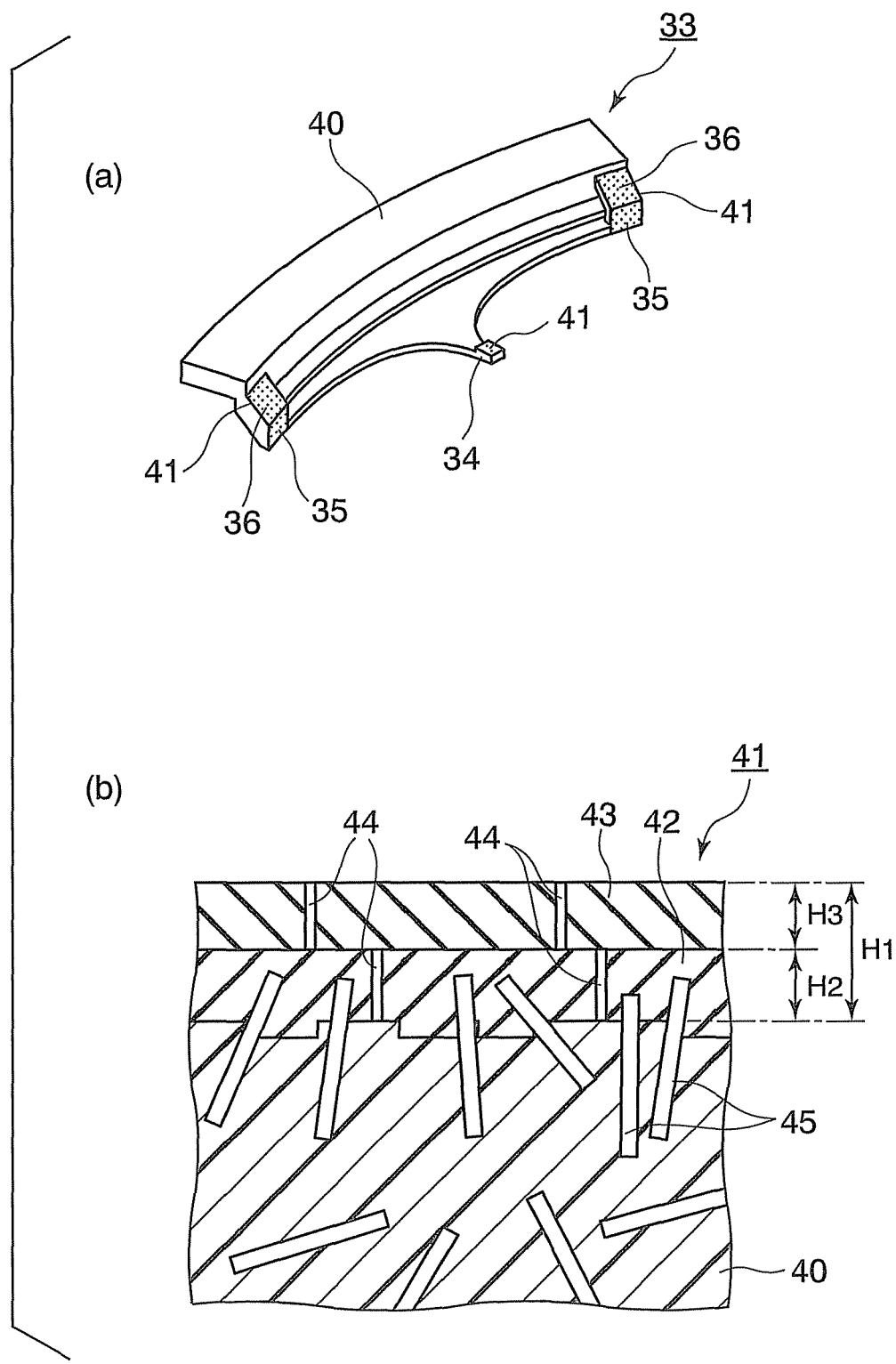
FIGS. 22(a) and 22(b) are a perspective view of a wafer hold member and a longitudinal, sectional view of the surface of the wafer hold member, respectively.
Figure 23:
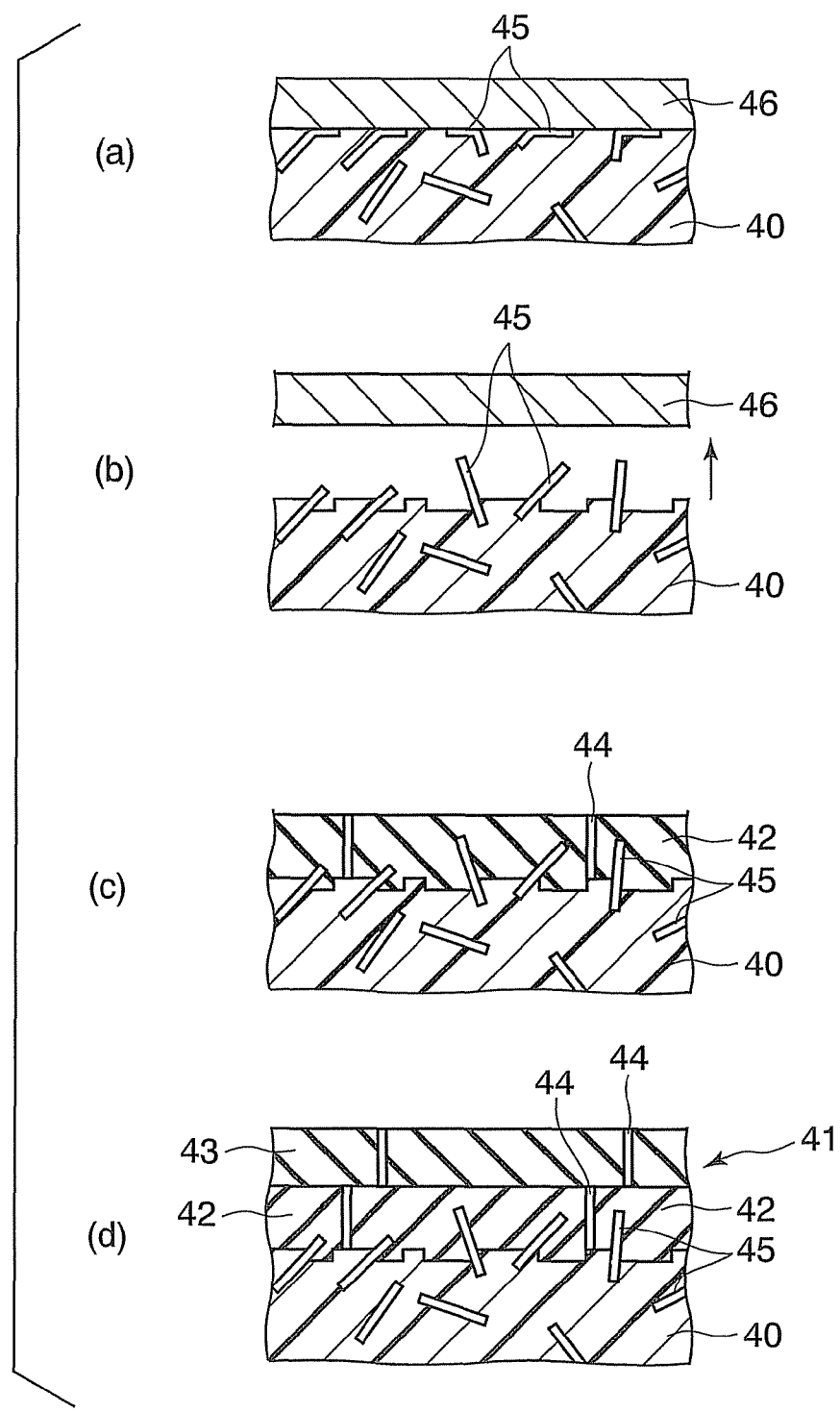
FIGS. 23(a) to 23(d) are process diagrams that illustrate manufacturing steps for the wafer hold member.
Figure 24:
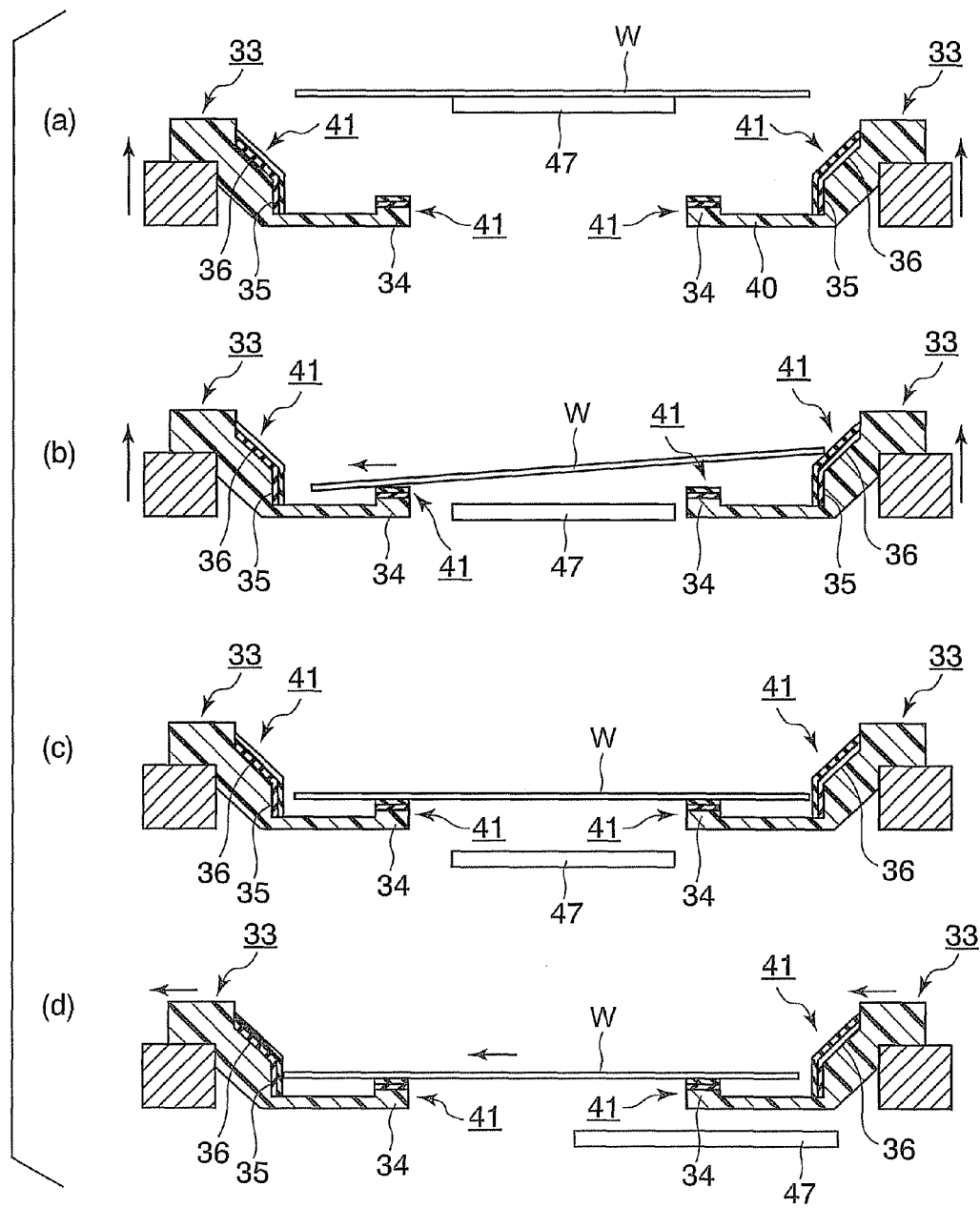
FIGS. 24(a) to 24(d) are process diagrams that illustrate steps in which a wafer is transferred to the wafer transport section.
Figure 25:
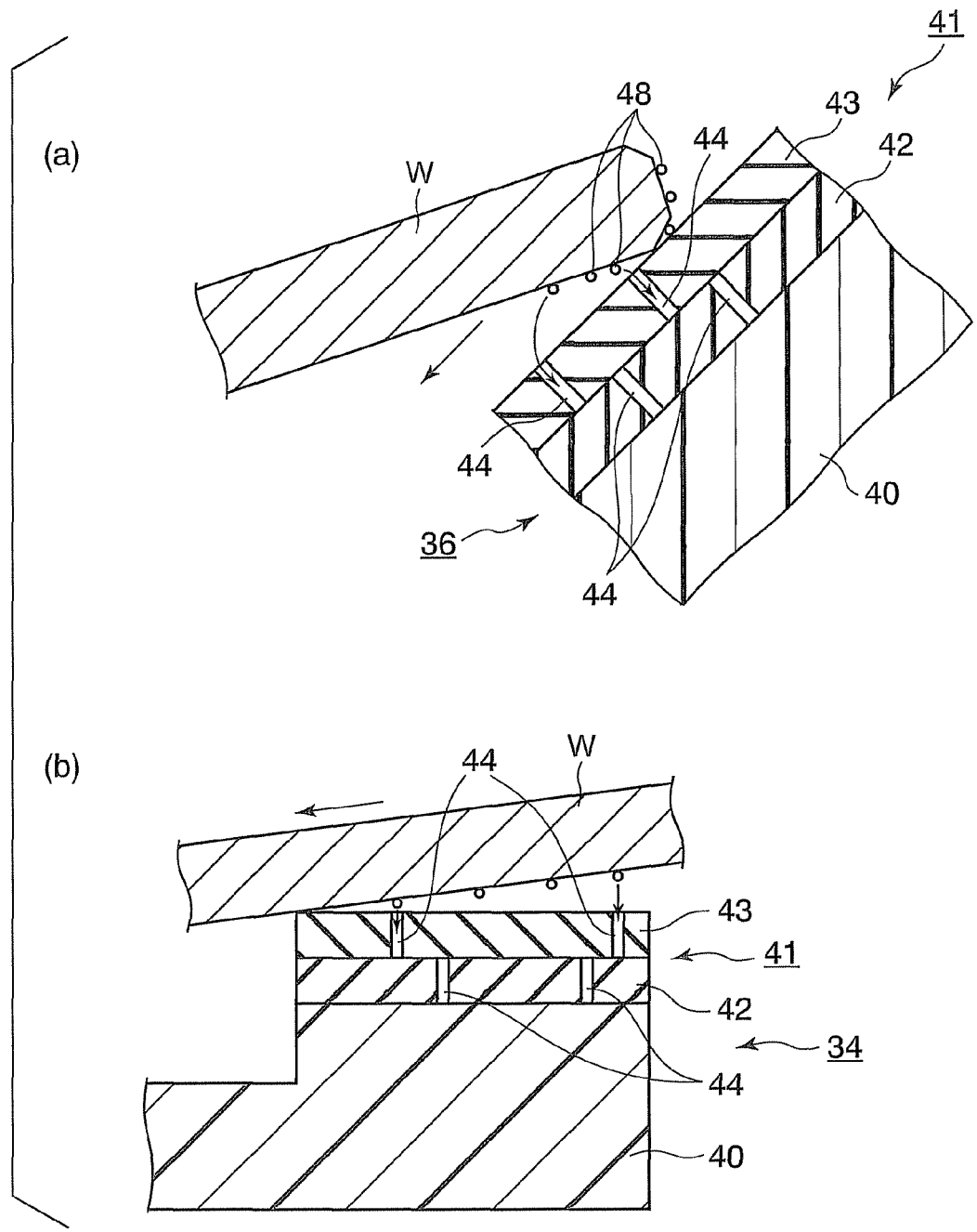
FIGS. 25(a) and 25(b) are explanatory diagrams that illustrate how the wafer is transferred to the wafer hold member.
Figure 26:
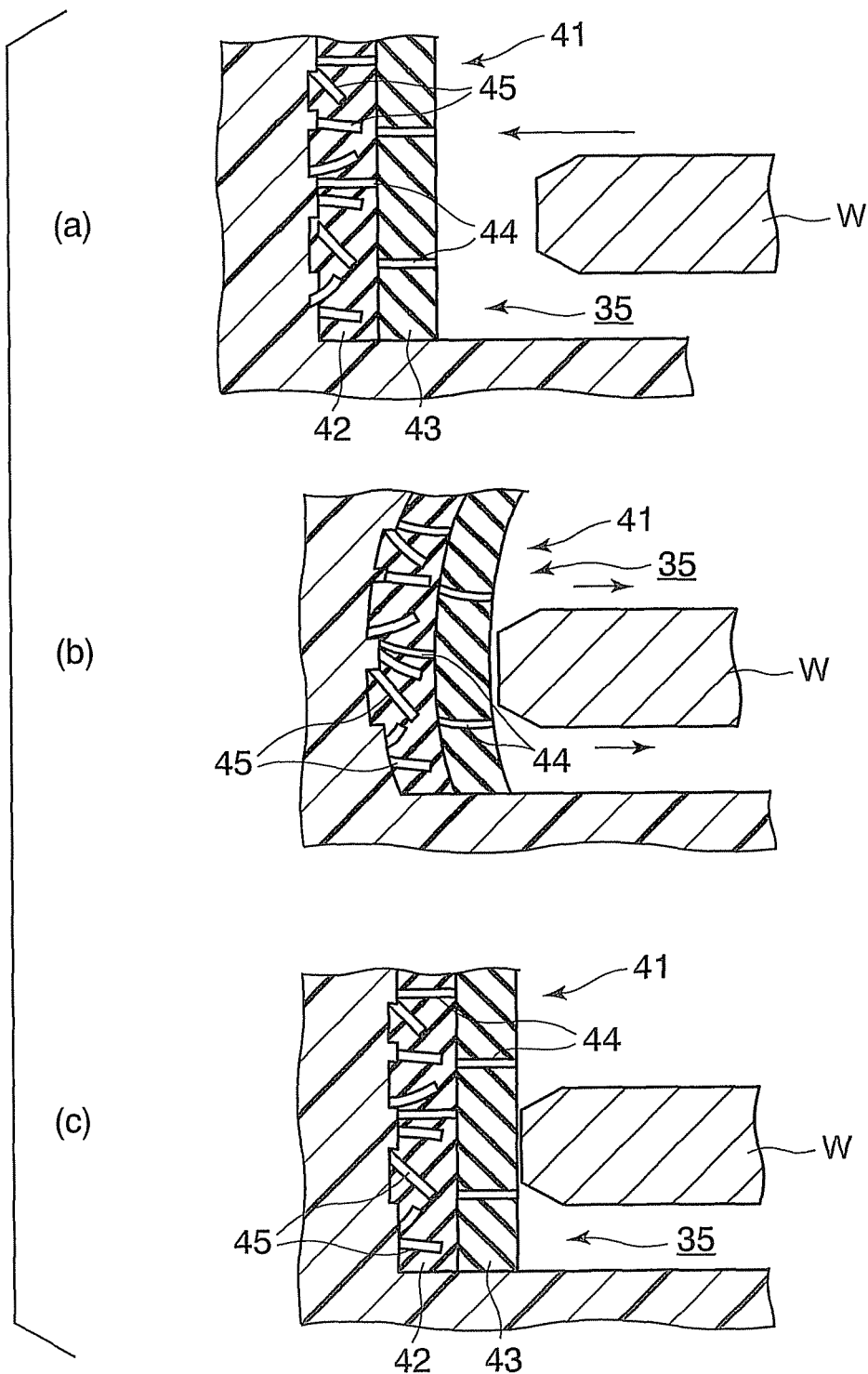
FIGS. 26(a) to 26(c) are explanatory diagrams illustrating how a wafer collides against a sidewall of the wafer hold member.
Figure 27:
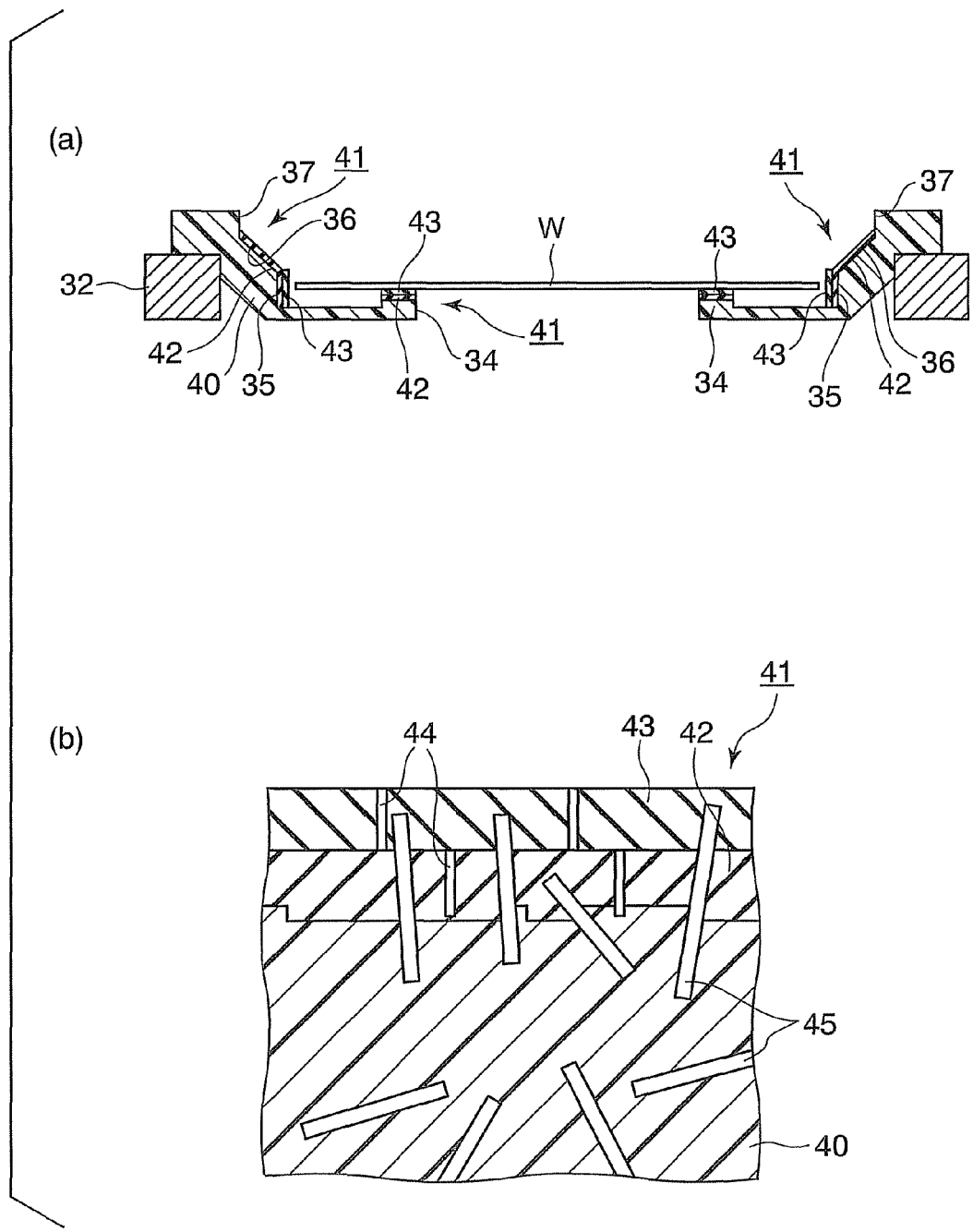
FIGS. 27(a) and 27(b) are longitudinal, sectional side views illustrating other examples of a wafer hold member.
Figure 28:
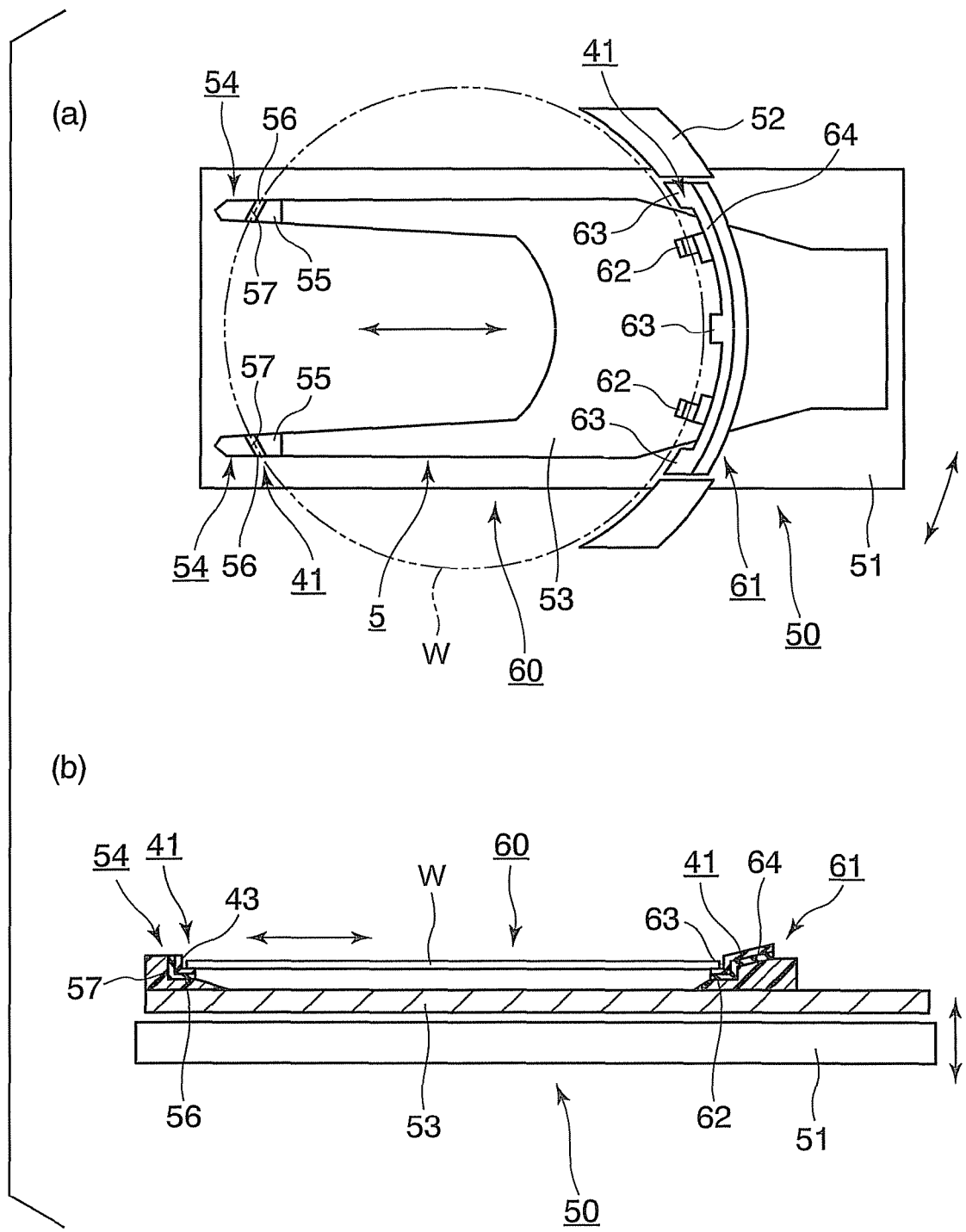
FIGS. 28(a) and 28(b) are a plan view, and a longitudinal, sectional side view, respectively, of an interface arm of a coating/developing apparatus.
Figure 29:
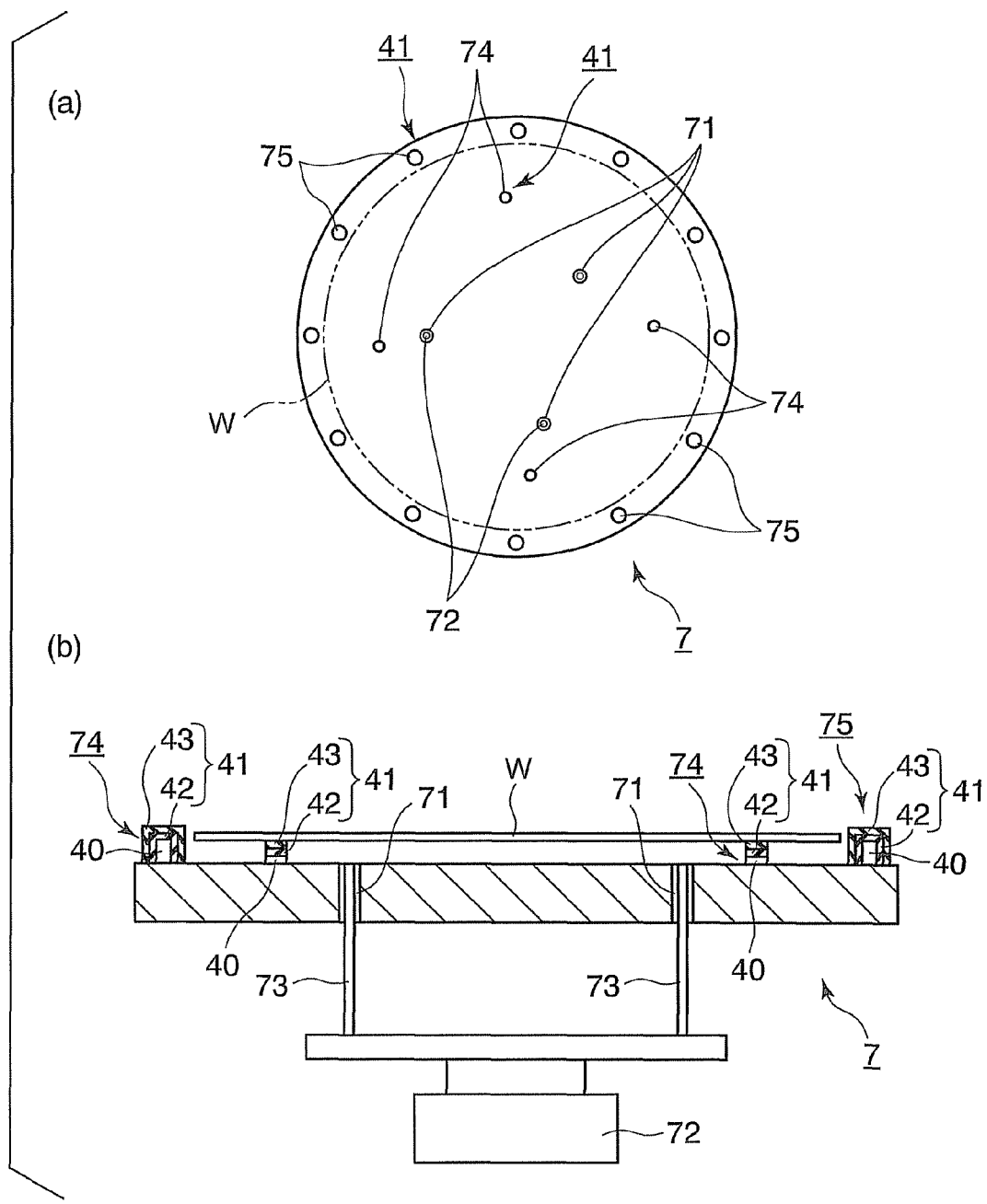
FIGS. 29(a) and 29(b) are a plan view, and a longitudinal, sectional side view, respectively, of a wafer transport section of the interface arm.

As shown in FIGS. 21 and 22(b), a protective film 41 is formed, in two-layered form on the surfaces of the lower-surface support section 34, the lower vertical wall 35, and the inclined section 36. The protective film 41 includes a lower layer 42 and an upper layer 43, each of which is made of diamond-like carbon (DLC), an amorphous hard film made of a hydrocarbon or of an allotrope of carbon. Reference number 44 in FIG. 22(b) denotes through-holes (through-defects) formed in the layers 42 and 43 during film deposition. Compared with the base material 40, the DLC has high hardness and hence, high resistance to wear. In addition, the DLC has high corrosion resistance against various chemicals and is low in friction coefficient, compared with the base material 40.

Since the upper layer 43 comes into contact with a wafer W during transfer and transport thereof, the upper layer 43 is formed of a DLC film containing carbon (C), hydrogen (H), and silicon (Si), as its main constituents, so as to lower its friction coefficient and enhance smoothness, hardness, and hence, wear resistance. The lower layer 42 directly deposited on the base material 40 is constructed of a DLC film containing fluorine (F) in addition to C and H, as its main constituents, so as to have high water repellence against chemicals, prevent the chemicals from permeating the base material 40, and obtain high corrosion resistance. Briefly, the upper layer 43 has a lower friction coefficient, higher smoothness, and higher wear resistance, than the lower layer 42, and the lower layer 42 has higher water repellence than the upper layer 43.

In order to prevent chemicals from being supplied to the base material 40 via clearances between the protective film 41 and carbon fibers 45 protruding from the surface of the base material 40, and so as to have a sufficiently low friction coefficient, the protective film 41 is formed to cover a front end of each carbon fiber 45 and have film thickness greater than length of the protruding front end. If thickness H1 of the protective film 41 in FIG. 22(b) is too small, the film lacks fineness or denseness and is therefore liable to permit chemicals to penetrate the protective film 41 and erode the base material 40. Conversely if the film thickness is too large, the wafer W is, as will be further detailed later herein, liable not to change in shape according to a particular shape of the base material 40 in case of a collision, and absorptiveness of its shock could consequently decrease. Therefore, preferable thickness is, for example, between 1 $\mu$m and 10 $\mu$m. In addition, the lower layer 42 has a thickness H2 of, for example, 1 $\mu$m to 3 $\mu$m, to obtain sufficient water repellence, and the upper layer 43 has a thickness H3 of, for example, 5 $\mu$m to 10 $\mu$m, to obtain sufficient hardness.

A method of manufacturing the wafer hold member 33 is described below. The above-described resin is mixed in molten form with a large number of carbon fibers 45, and after this, a metallic mold 46 for forming the wafer hold member 33 is filled with the mixture. The resin is then cured inside the mold 46, thereby to form the base material 40. FIG. 23(a) illustrates a boundary between the base material 40 and the mold 46, indicating that the carbon fibers 45 existing near the boundary each have a bent front end in firm contact with the mold 46 after the fiber end was pressed against the mold 46 for reasons such as expansion and contraction of the resin during curing. In addition, in some cases, slight projections and depressions are formed on the surface of the base material 40 according to a particular inner-surface roughness level or shape of the mold 46. Next after removal of the wafer hold member 33 from the mold 46, the bent front ends of the carbon fibers 45 become straight on the surface of the wafer hold member 33, either by repulsive force (resilience) of the fiber ends to leap outward, or according to the inner-surface shape of the mold 46, and finally, leap out to the surface. This state is shown in FIG. 23(b). Referring to the fibers 45, although the front end protruding to the surface of the base material 40, and the section remaining inside the base material 40 are depicted with the same thickness in each figure, the front end may be crushed by the mold 46 and reduced in diameter in comparison with the section remaining inside the base material 40.

After that, as shown in FIG. 23(c), the lower layer 42 is deposited using, for example, physical vapor deposition (PVD) or chemical vapor deposition (CVD). More specifically, since the base material 40 has complex projections and depressions formed on its surface with the carbon fibers 45 protruding thereto, the lower layer 42 is intricately formed with the projections and the depressions. The lower layer 42 is therefore formed with high adhesion to the base material 40. After the formation of the lower layer 42, the upper layer 43 is deposited with PVD or CVD, as shown in FIG. 23(d), thereby to form the protective film 41. Since the layers are stacked in this way, even if through-holes 44 are formed in the lower layer 42, the upper layer 43 covers the through-holes 44 so as to prevent the surface of the base material from being exposed via the through-holes 44. In addition, even if through-holes 44 occur in the upper layer 43, the lower layer 42 present thereunder prevents such exposure.

For example, if a plasma CVD method is used to form the protective film 41 of the DLC, the carbon compound gases commonly used for DLC formation, such as methane ($CH_4$), ethane ($C_2H_6$), propane ($C_3H_8$), butane ($C_4H_{10}$), acetylene ($C_2H_2$), benzene ($C_6H_6$), carbon tetrafluoride ($CF_4$), and dicarbon hexafluoride ($C_2F_6$), are employed as source gases. As necessary, a hydrogen gas, an inert gas, or the like is mixed with the above carbon compound gases, as a carrier gas, and the mixture is supplied to the wafer W to deposit the film. In the present example, the lower layer 42 is formed by supplying a source gas containing carbon, hydrogen, and fluorine, to the base material 40, and the upper layer 43 is formed by supplying a source gas containing carbon, hydrogen, and silicon, to the base material 40.

Next, a process in which the wafer transport section 3 of the transport arm A3 receives a wafer W from a stage 47 provided in the transfer unit BF 3 is described below referring to FIGS. 24(a) to 24(d). The wafer transport section 3 moves forward toward the stage 47 and is positioned below the wafer W mounted on the stage 47, as shown in FIG. 24(a). After this, the wafer transport section 3 moves upward and then the wafer W is transferred thereto. This transfer is performed, for example, with the wafer W having its lower surface supported on the lower-surface support section(s) 34 of a part of the four wafer hold members 33, and with the wafer W having its peripheral edge inclined to be positioned on part of the four inclined sections 36. FIG. 24(b) shows the transfer step.

When the wafer W is thus transferred to the wafer hold members 33, damage to the inclined section 36 and the lower-surface support section 34 due to any shocks during the transfer is suppressed since both sections are covered with the protective film 41. Damage to the upper layer 43, in particular, of the protective film 41, is more reliably suppressed since the upper layer 43 contains silicon so as to be harder. In addition, at this time, even if, as shown in FIGS. 25(a) and 25(b), a chemical mist 48 is adhering to the lower surface of the wafer W and a bevel section thereof that is a periphery, the base material 40 is prevented from being exposed to the mist 48, since constructing the protective film 41 in stacked layer form as described above prevents the exposure of the base material 40 due to the presence of the through-holes 44. Furthermore, since the lower layer 42 contains fluorine to obtain water repellence, even if the mist 48 adheres to the lower layer 42 via the through-holes 44 in the upper layer 43, the water repellence of the lower layer 42 prevents the mist from permeating the base material 40. Hence, chemical erosion due to the mist 48 is prevented more reliably.

Because of its low friction coefficient, the protective film 41 makes the peripheral edge of the wafer W easily slide downward from each inclined section 36. At the same time, the wafer W slides along the surface of each lower-surface support section 34, and thus as shown in FIG. 24(c), the wafer W is positioned in the support region 30 surrounded with the lower sidewalls 35, and retained horizontally.

After this, when the wafer hold member 33 moves in a horizontal direction, the inertial force of the wafer W causes the wafer W to slide along the surface of the lower-surface support section 34 and collide against the lower vertical wall 35. A state of the lower vertical wall 35 at this time is described below referring to FIGS. 26(a) to 26(c). The collision exerts a stress on the wafer hold member 33, causing a change in a shape of the base material 40 formed from the resin. At this time, the protective film 41 also changes in shape to match to the shape of the base material 40, since, as described above, the protective film 41 is intricately mixed with the carbon fibers 45 to obtain high adhesion to the base material 40. The upper layer 43 is formed from the same DLC as that of the lower layer 42, and thus has high adhesion thereto, which makes the upper layer 43 change in shape following the change in the shape of the lower layer 42. These changes in the shapes of the protective film 41 and the base material 40 disperse the stress from the colliding section of the wafer W, at the lower vertical wall 35, and the dispersed stress is absorbed in various portions by the base material 40. This state is shown in FIGS. 26(a), 26(b). When the stress is thus made weak, the base material 40 returns to its original shape by its restoration force and the protective film 41 also returns to its original shape by following the shape of the base material 40, as shown in FIG. 26(c).

The way the stress is absorbed has been described taking the lower vertical wall 35 as an example. The same also applies to the lower-surface support section 34 and the inclined section 36. That is to say, as described above, even when the wafer W is strongly stressed during its transfer or during its sliding along the surface, the stress is widely dispersed similarly to that of the lower vertical wall 35, since the protective film 41 is formed with high adhesion to the base material 40. High resistance to wear is therefore obtained.

The way the base material 40 is prevented from being exposed to the chemical mist 48 during the transfer of the wafer W to the wafer hold members 33 has also been described. The same also applies to the collision of the wafer W against the lower vertical wall 35 in the above case. That is to say, even when the collision occurs, the mist 48 adhering to the periphery of the wafer W is prevented from adhering to the base material 40 of the lower vertical wall 35 via the through-holes 44, as during the transfer of the wafer W. Erosion is therefore prevented.

As described above, each wafer hold member 33 of the wafer transport section 3 includes the lower-surface support section 34 that retains the wafer W, the inclined section 36 that guides the wafer W so that the wafer is retained by the lower-surface support section 34, and the lower vertical wall 35 that surrounds the periphery of the wafer W and restricts a position thereof. In addition, the DLC-constructed protective film 41 including the lower layer 42 and the upper layer 43 is formed on the surfaces of the lower-surface support section 34, the inclined section 36, and the lower vertical wall 35. Therefore, even if the through-holes 44, through-defects, are formed in the layers 42, 43, unless the through-holes overlap, chemical erosion of the base material 40 due to contact with the chemicals is suppressed since the base material 40 that forms part of each section does not become exposed. Corrosion resistance thus improves, which results in the wafer W being reliably retained in the support region 30 of the wafer transport section 3, and leads to preventing the wafer W from falling from the wafer transport section 3 during transport, and from being improperly transferred to the module on which the wafer W is to be mounted. Furthermore, the DLC, because of its low friction coefficient, makes the wafer W easily slide along the surfaces of the inclined section 36 and the lower-surface support section 34, and allows more reliable retaining of the wafer W in the support region 30 of the wafer transport section 3.

Moreover, the configuration with the protective film 41 covering the carbon fibers 45 protruding to the base material 40, as described above, improves the adhesion of the protective film 41 to the base material 40 and strength of the protective film 41, making the base material 40 absorb shocks, and yielding higher wear resistance. This configuration also suppresses the shock applied to the wafer W, and reduces wafer damage such as chipping.

The lower layer 42 and the upper layer 43 may both be formed as, for example, a DLC layer containing C and H as its main constituents, and not containing F or Si. Alternatively, the lower layer 42 and the upper layer 43 may each be constructed as, for example, either a layer containing Si and N (nitrogen) in addition to C and H, as the main constituents, a DLC layer containing Si and O (oxygen), or a DLC layer containing C, H, and $SiO_2$. The N in the above is contained as, for example, a CN radical, in the layer. Although the lower layer 42 may contain C, H, Si as the main constituents and the upper layer 43 may contain C, H, F as the main constituents, the layer that contains Si to obtain greater hardness and a lower friction coefficient is preferably formed as the upper layer for the reasons discussed in the embodiment.

Besides, for example, the upper layer 43 and the lower layer 42 may be constructed as layers having the same main constituents. For example, layers that contain C and H as the main constituents, may be constructed as the upper layer 43 and the lower layer 42. In that case, in order to suppress chemicals' permeating the base material 40, it is preferable that the lower layer 42 be formed to have greater denseness and fineness than the upper layer 43, and that the upper layer 43 be formed to have greater smoothness and a lower friction coefficient than the lower layer 42. Alternatively, the upper layer 43 and the lower layer 42 may be constructed as layers of the same composition, or the protective film 41 does not always need to include two layers and may be constructed by stacking three layers or more.

As shown in FIG. 27(a), the upper layer 43 may not cover the entire lower layer 42. In addition or alternatively, as shown in FIG. 27(b), the front ends of the carbon fibers 45 protruding from the base material 40 may extend through the lower layer 42 and reach the upper layer 43. The strength of the base material 40 and the adhesion of the protective film can likewise be improved by, for example, including glass fibers, instead of carbon fibers, as fiber bodies in the resin base material 40.

The kind of material constituting the protective film 41 is not limited to DLC and can be, for example, a ceramic material such as SIC or AlN (aluminum nitride), quartz, or the like, provided that the material has high corrosion resistance or high hardness against various chemicals. Further alternatively, the protective film 41 may be formed using, for example, a highly wear-resistant hydrocarbon resin with a high-carbon-content purified hydrocarbon homogenously mixed into an acrylic resin such as polycarbonate. The hydrocarbon resin in this case has a carbon content of at least 80%, for example.

The protective film 41 preferably ranges, for example, between 1,000 and 3,000 in Vickers hardness, and for smoothness, between 0.5 nm and 1.0 nm in Ra, and up to 0.2 in friction coefficient. In addition, for film deposition on the base material made of a resin as described above, a material that allows the deposition at a low temperature of, for example, 200° C. or less, is preferably selected to prevent deterioration of the material.

The wafer hold members of the transport arms A1, A2, A4, and of the transfer arm D1, are constructed similarly to the wafer hold member 33 of the transport arm A3.

A wafer transport section 5 provided in the interface arm 50 is described below as another example of a wafer transport section, with reference being made to FIG. 28(a) that is a plan view of the interface arm 50, and FIG. 28(b) that is a longitudinal, sectional side view thereof. The description focuses primarily on differences with respect to the wafer transport section 3. The wafer transport section 5 is provided so as to be supported on a pivoting base 51 and move back and forth above the pivoting base 51 shown in FIG. 28(a), and the pivoting base 51 is liftably and pivotally constructed, as with the pivoting base 27. In addition, the pivoting base 51 includes pressing sections 52 for matching a position of a wafer W on both left and right sides of the wafer transport section 5, and the pressing sections 52 move with the pivoting base 51.

Figure 12:
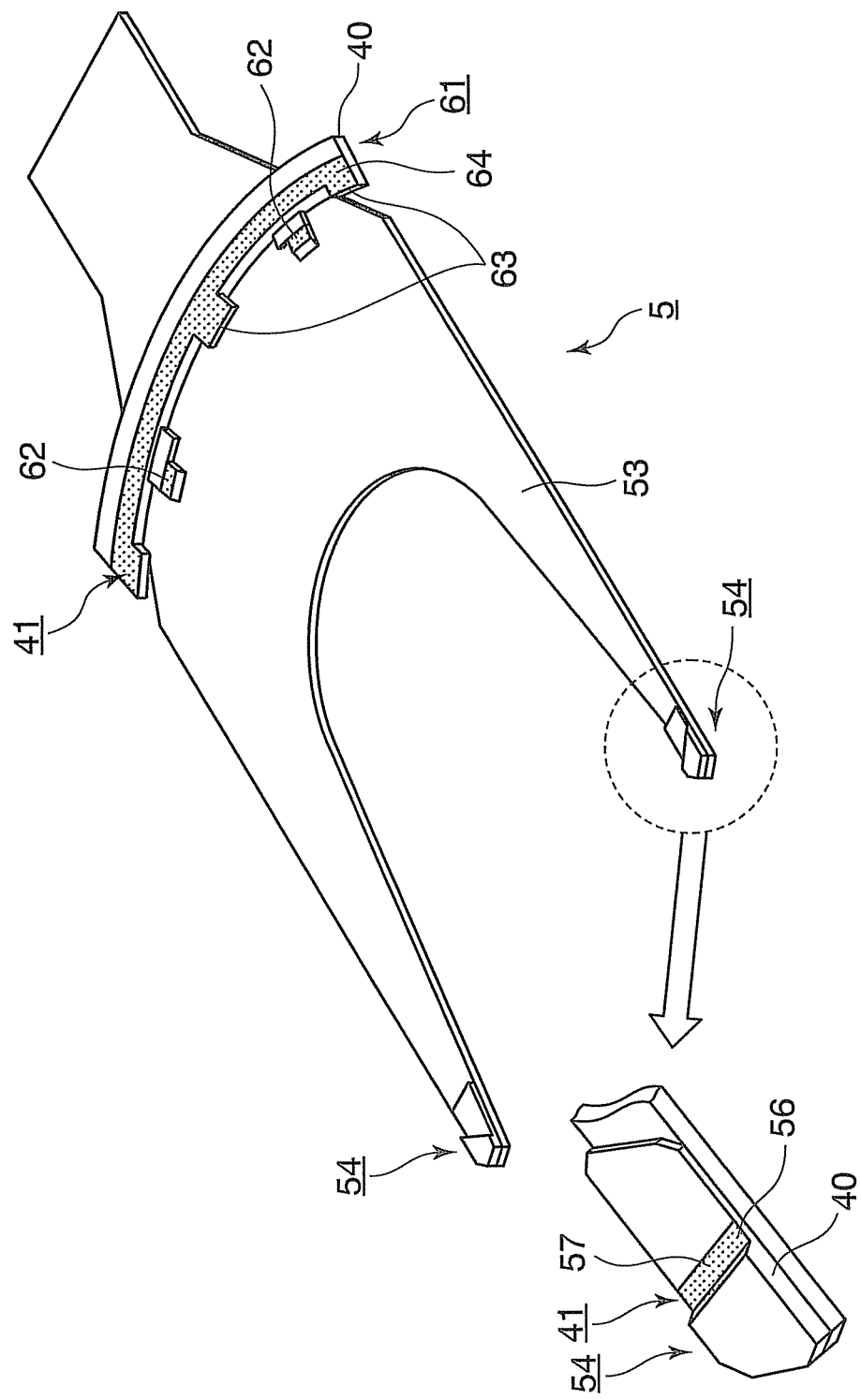
FIG. 12 is a perspective view of a wafer transport section of the interface arm.
Figure 13:
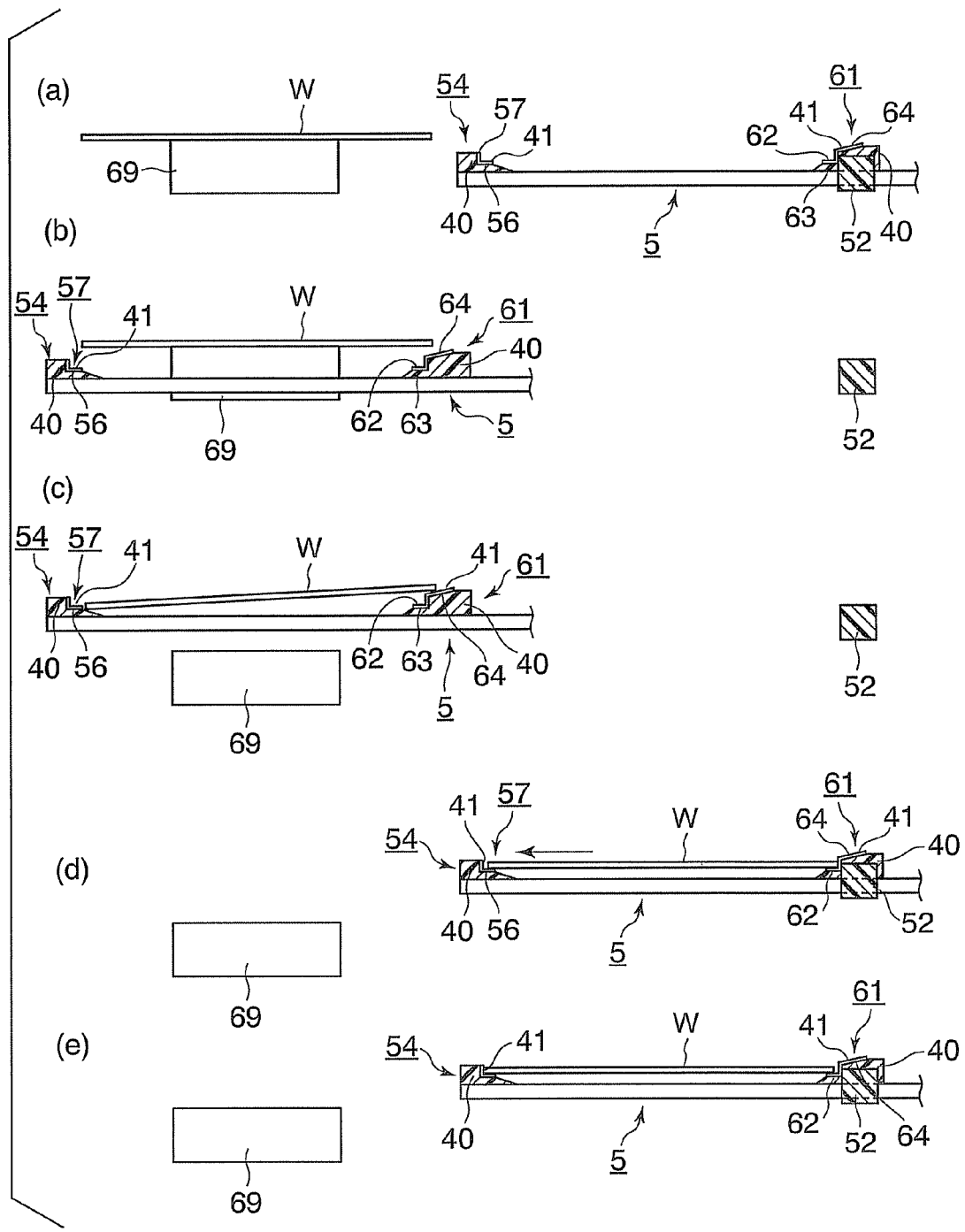
FIGS. 13(a) to 13(e) are explanatory diagrams that illustrate steps in which the wafer transport section receives the wafer.
Figure 14:
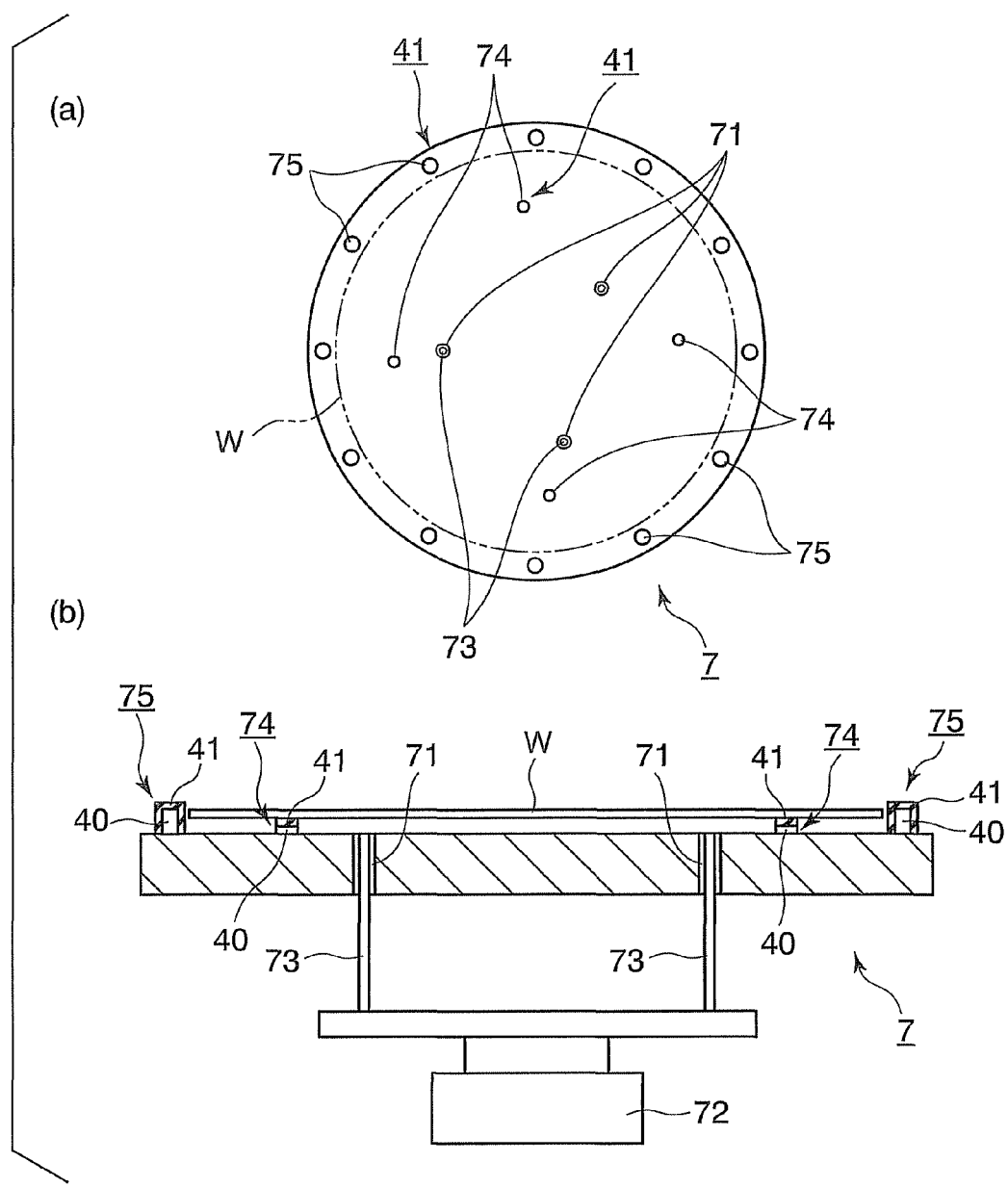
FIGS. 14(a) and 14(b) are a plan view, and a longitudinal, sectional side view, respectively, of a heating plate of a heating module provided in the coating/developing apparatus.
Figure 15:
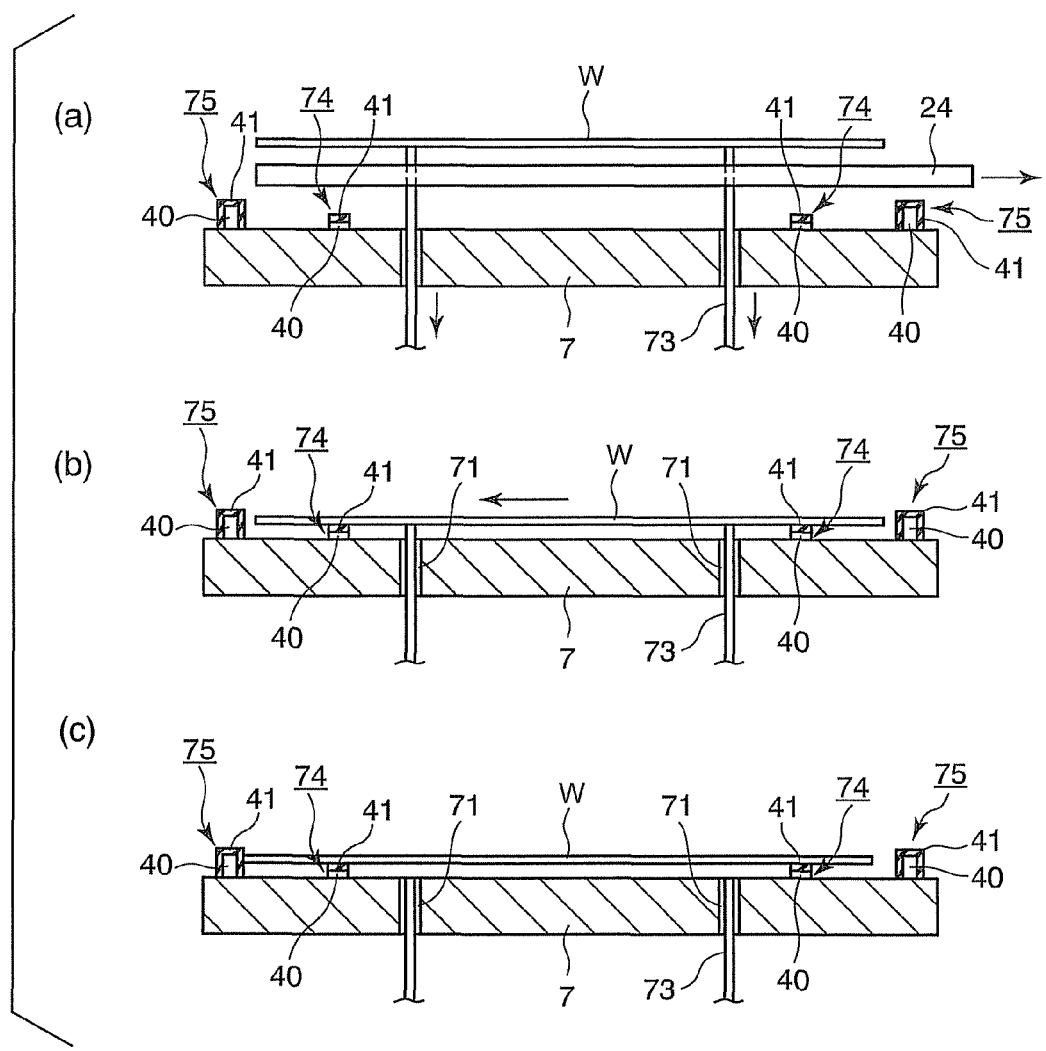
FIGS. 15(a) to 15(c) are process diagrams that illustrate steps in which the wafer is transferred to the heating plate.

The wafer transport section 5 includes a frame 53 formed into a two-forked shape as shown in FIG. 12, the frame 53 having, at both of its distal ends, wafer hold members 54 constructed of carbon fibers 45 and a PEEK-resin-containing base material 40 similarly to the wafer hold member 33. The base material 40 is formed to retain the fibers 45, and the wafer hold members 54 are each formed through substantially the same manufacturing steps as those of the wafer hold member 33. Each wafer hold member 54 includes a lower-surface support section 56 for supporting the wafer W horizontally, and a vertical wall 57 provided at a distal end of the lower-surface support section 56. The lower-surface support section 56 and the vertical wall 57 are covered with the protective film 41. The vertical wall 57 restricts the position of the wafer W on the wafer hold member 54.

As shown in FIG. 12, the frame 53 has at its proximal end a wafer hold member 61 constructed of the carbon fibers 45 and the base material 40 formed from the PEEK resin, through substantially the same manufacturing steps as those of the wafer hold member 33. The wafer hold member 61 includes lower-surface support sections 62 for supporting the lower surface of the wafer W horizontally, lower vertical walls 63 provided at a proximal end of each lower-surface support section 62, and an inclined section 64 inclined downward from the proximal end of the lower-surface support section 62, toward a distal end thereof. The inclined section 64, as with the inclined section 36, guides the wafer W to the lower-surface support section 62. The lower-surface support section 62 and each lower vertical wall 63 are covered with the protective film 41. Reference number 60 in FIGS. 11(a), 11(b) denotes the support region for the wafer W, surrounded by the lower vertical wall 63 and the vertical wall 57. Sections covered with the protective film 41 are each shown with a number of points in FIG. 12. The wafer transport section 5 formed from the frame 53 and the wafer hold members 54, 61, constitutes a substrate support member.

How the wafer transport section 5 receives the wafer W from a stage 69 provided in the transfer unit CPL 12 is described below using FIGS. 13(a) to 13(e). The wafer transport section 5 moves forward toward the stage 69 and then after being positioned under the wafer W mounted thereon, moves upward. This state is shown in FIGS. 13(a), 13(b). Next while having its lower surface supported on the lower-surface support sections 56 and the inclined section 64, the wafer W is transferred, for example, in an inclined condition, to the wafer transport section 5. This condition is shown in FIG. 13(c). After this, the wafer transport section 5 reverses and the periphery of the wafer W abuts the pressing portions 52. The wafer W is then pushed toward a distal end of the wafer transport section 5, slides downward from the inclined section 64, and is supported on each of lower-surface support sections 56, 62 horizontally. This state is shown in FIG. 13(d). The wafer W slides along the surface of each of the lower-surface support sections 56, 62 by inertial force, abuts the vertical wall 57, and stops. This state is shown in FIG. 13(e). When the wafer W is thus transferred to the wafer transport section 5 and then further transported, even if the wafer W comes into contact with any sections of the wafer hold members 54, 61, the protective film 41 suppresses chemical erosion and wear of the base material 40 that forms part of the wafer hold members 54, 61.

The wafer transport section 5 of the interface arm 50 has been described. The wafer transport section of the transfer arm 12 is constructed similarly to the wafer transport section 5. The wafer transport sections 3, 5 may have their entire surfaces covered with the protective film 41, or the wafer transport section 5 may have its pressing sections 52 covered with the protective film 41.

Next, the heating plate 7 provided as part of the substrate support device, in the heating module 21 of the COT layer block B3, is described below referring to FIG. 29(a) that is a plan view of the heating plate 7, and FIG. 29(b) that is a longitudinal, sectional side view thereof. The heating plate 7 that also serves as a stage on which to mount a wafer W is formed into a flat, circular shape with three holes arranged in a circumferential direction of the heating plate 7 and extending in a longitudinal direction thereof. Only two of the three holes are shown in FIG. 29(b). A lift pin 73 driven by a lifter 72 to move upward and downward is provided in each hole 71, and the pin 73 remains concealed under, and sticks out from, the surface of the heating plate 7. A heater for heating the wafer W is disposed in the heating plate 7.

A plurality of (in the present example, four) support pins 74 are arranged as lower-surface support sections on the heating plate 7 externally to the holes 71 in the circumferential direction of the heating plate 7. The support pins 74 support the wafer W so as to make the wafer W lie with a clearance above the surface of the heating plate 7. In addition, a number of position-restricting pins 75 for preventing the wafer W from sliding out from the heating plate 7 are arranged at peripheral edges thereof. The support pins 74 and the position-restricting pins 75 are manufactured through substantially the same manufacturing steps as those of the wafer hold members 33. Each support pin 74 and each position-restricting pin 75, as with each wafer hold member 33, are constructed of the carbon fibers 45 and the base material 40 formed from the PEEK resin, and have a surface covered with the protective film 41 that includes the lower layer 42 and the upper layer 43.

Figure 30:
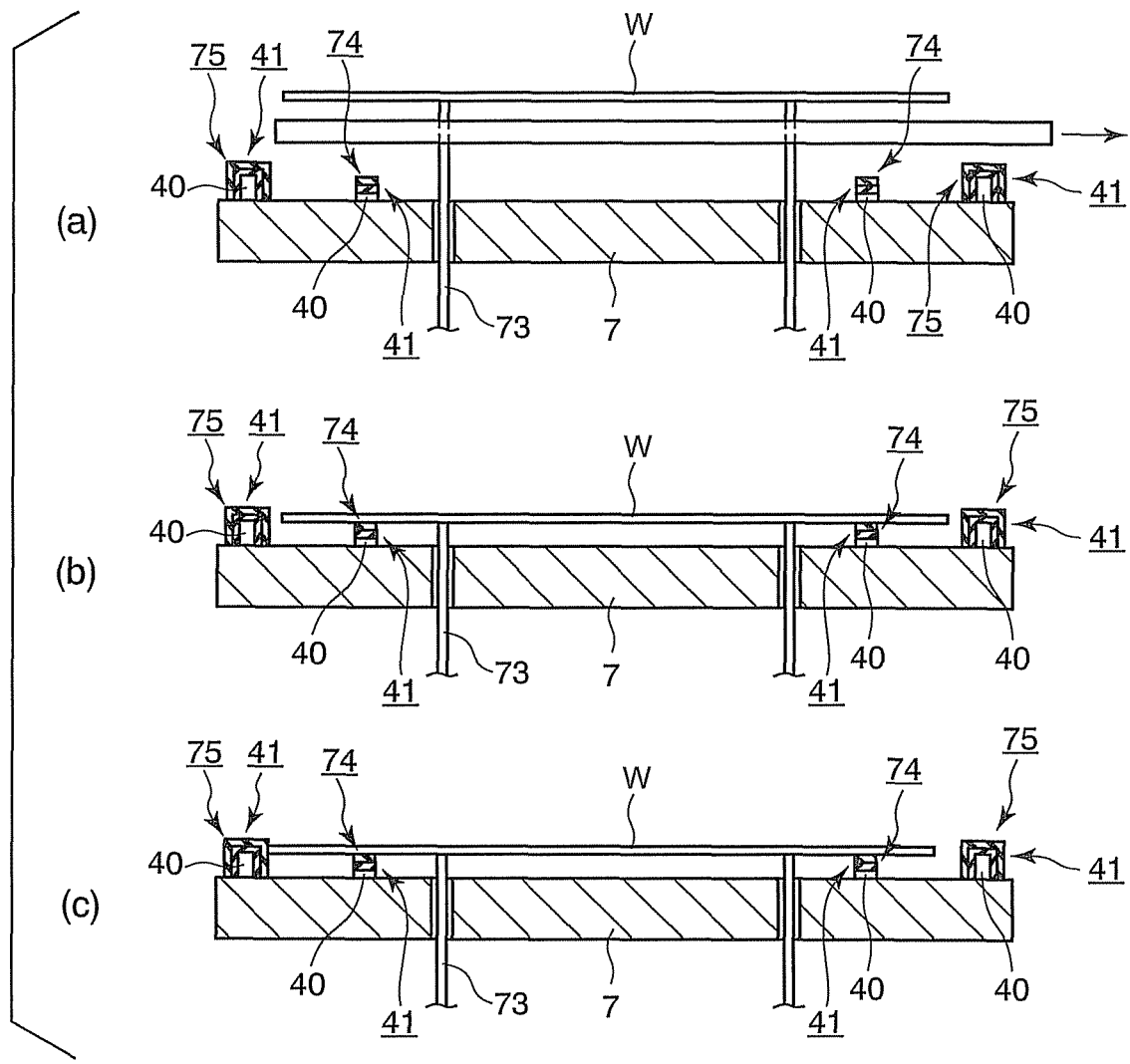
FIGS. 30(a) to 30(c) are explanatory diagrams that illustrate steps in which the wafer transport section receives the wafer.

A process in which a wafer W is transferred to the heating plate 7 is described below referring to FIGS. 30(*a*) to 30(*c*). After the wafer W has been transferred to the cooling plate 24, the cooling plate 24 moves to a position above the heating plate 7 and then the lift pins 73 move upward to support the lower surface of the wafer W, as shown in FIG. 30(*a*). Next after the cooling plate 24 has exited from its position above the heating plate 7, the lift pins 73 move downward to lower the wafer W to the support pins 74, as shown in FIG. 30(*b*).

At this time, air between the heating plate 7 and the lower surface of the wafer W may cause the wafer W to slide along the surfaces of the support pins 74 and collide against the position-restricting pins 75, as shown in FIG. 30(*c*). However, the protective film 41, as with the wafer hold members 33, prevents the support pins 74 and the position-restricting pins 75 from becoming worn and damaged. Even if the wafer W has any chemicals adhering thereto, the protective film 41 also prevents the support pins 74 and the position-restricting pins 75 from becoming chemically eroded.

The above-described protective film can be applied to, in addition to the sections described in each above example, all other sections that are likely to come into contact with the substrate. For example, the protective film 41 may be formed on the surface of a stage on which to mount a substrate in a deposition apparatus or etching apparatus, or position-restricting pins 74 covered with the protective film 41 may be provided.

The protective film 41 may be deposited on all surfaces of each wafer hold member 33, 54, 61 using an appropriate method for depositing the protective film, or may be deposited at least in a section of a contact region of the substrate. In addition, a known resin in addition to PEEK can be used as the resin that forms part of the base material 40.

(Evaluation Tests 1)

Evaluation tests 1-1 were performed with four wafer hold members 33 arranged in a circumferential direction and a wafer W mounted on and supported on respective lower-surface support sections 34, as shown in FIG. 16. The wafer hold members 33 are connected to a drive not shown, and are adapted so that while maintaining a predetermined spacing between one another, the wafer hold members 33 reciprocate in a horizontal direction as indicated by arrows in the figure. In addition, the wafer hold members 33 are positionally pre-adjusted so that respective lower walls 35 are slightly spaced apart from a periphery of the wafer W. However, the protective film 41 made of the DLC described in the embodiment is not formed on the wafer hold members 33. Furthermore, the wafer hold members 33 used in the tests are each constructed of a predetermined resin instead of the PEEK resin described in the embodiment. In the predetermined resin, carbon fibers are included in substantially the same form as in the embodiment. After wafer mounting, the wafer hold members 33 are reciprocated 200,000 times and the wafer W is made to collide against the respective lower walls 35 each time. During the tests, depths of any traces of wear, formed on each lower wall 35 after the collisions, were measured using a microscope.

Evaluation tests 1-1 were followed by evaluation tests 1-2 similar to tests 1-1. In evaluation tests 1-2, depths of any traces of wear, formed on each lower wall 35 after collisions, were measured. Although, on the wafer hold members 33 used in evaluation tests 1-2, the protective film 41 constructed of DLC is formed at substantially the same sections as those described in the embodiment, this protective film is of a single-layered structure, not a stacked layer structure, and has a thickness of 3 μm.

In addition, tests similar to evaluation tests 1-2 were performed as evaluation tests 1-3, and depths of any traces of wear, formed on each lower wall 35, were measured. The wafer hold members 33 in evaluation tests 1-3 are constructed of the same PEEK resin material as used in the embodiment. The protective film 41 is formed on the wafer hold members 33 similarly to that of the embodiment, and the film has the same thickness of 3 μm as used in evaluation tests 1-2. The wafer hold members 33 were reciprocated 200,000 times.

Furthermore, tests similar to evaluation tests 1-2 were performed as evaluation tests 1-4, and depths of any traces of wear, formed on each lower wall 35, were measured. The reciprocation of the wafer hold members 33 was repeated 10,000,000 times. The protective film 41 formed on various sections of each wafer hold member 33 has the same thickness of 3 μm as used in evaluation tests 1-2.

Furthermore, tests similar to evaluation tests 1-3 were performed as evaluation tests 1-5, and depths of any traces of wear, formed on each lower wall 35, were measured. The wafer hold members 33 in evaluation tests 1-5, however, are constructed of the predetermined resin that is substantially the same material as that of the wafer hold members 33 used in evaluation tests 1-2. The DLC-based protective film formed on the wafer hold members 33 similarly to that of evaluation tests 1-2 is single-layered and has a thickness of 8 μm. The wafer hold members 33 were reciprocated 10,000,000 times.

Furthermore, tests similar to evaluation tests 1-4 were performed as evaluation tests 1-6. The reciprocation of the wafer hold members 33 was repeated 10,000,000 times and depths of any traces of wear were measured on the lower-surface support sections 34.

Moreover, tests similar to evaluation tests 1-3 were performed as evaluation tests 1-7. The reciprocation of the wafer hold members 33 was repeated 10,000,000 times and depths of any traces of wear were measured on the lower-surface support sections 34.

Besides, tests similar to evaluation tests 1-5 were performed as evaluation tests 1-8. The reciprocation of the wafer hold members 33 was repeated 10,000,000 times and depths of any traces of wear were measured on the lower-surface support sections 34.

Results of evaluation tests 1-1 to 1-8 are substantially the same as the results shown in FIG. 17 for the first embodiment. In FIG. 17, the greatest depth of the formed traces of wear, and an average depth value thereof are represented by a graph having slant lines, and a graph having a number of points, respectively, for each identification number of the evaluation tests. These test results are shown above each graph and expressed in units of μm. As represented by the graphs, the maximum and average depth values of the formed traces of wear in evaluation tests 1-2 are both smaller than those of evaluation tests 1-1. That is to say, the results of evaluation tests 1-1 and 1-2 indicate that the deposition of the protective film improves the lower wall 35 of each wafer hold member 33 in wear resistance. In addition, although the number of collisions of the wafer W against the lower wall 35 in evaluation tests 1-4 is greater than in evaluation tests 1-1, the maximum and average depth values of the formed traces of wear are smaller than those of evaluation tests 1-1. These results also indicate that the deposition of the protective film 41 improves the wear resistance of the lower wall 35.

It can be seen from the results of evaluation tests 1-3 and 1-5 that even when the kind of resin forming the wafer hold member 33, and the film thickness of the protective film 41 are changed, the wear resistance of the lower wall 35 is increased above that obtained in evaluation tests 1-1. In addition, since the maximum and average depths of the formed traces of wear in evaluation tests 1-6 to 1-8 are held down to relatively small values, the formation of the protective film is considered to be effective for the lower-surface support section 34 as well.

(Evaluation Tests 2)

In evaluation tests 2-1, an undiluted solution of sulfonic acid was drip-applied to wafer hold members 33, and depths of any consequential traces of wear were measured using a microscope. The protective film 41, however, is not formed on the wafer hold members 33. In addition, each wafer hold member 33 is constructed of the predetermined resin used in evaluation tests 1-1, instead of the PEEK resin.

In evaluation tests 2-2, as in the embodiment, an undiluted solution of sulfonic acid was drip-applied to wafer hold members 33 each having the protective film 41 formed on various sections in a manner similar to that of evaluation tests 2-1, and depths of any consequential traces of wear were measured using a microscope. The protective film in evaluation tests 2-2 is single-layered and constructed of DLC, and has a thickness of 1 μm thick. Each wafer hold member 33 is constructed of the predetermined resin similarly to that of evaluation tests 2-1.

Tests similar to evaluation tests 2-2 were performed as evaluation tests 2-3. The protective film formed on wafer hold members 33 in evaluation tests 2-3 is also single-layered and has a thickness of 3 μm.

Tests similar to evaluation tests 2-2 were performed as evaluation tests 2-4. The protective film formed on wafer hold members 33 in evaluation tests 2-4 is also single-layered and has a thickness of 6 μm.

Tests similar to evaluation tests 2-2 were performed as evaluation tests 2-5 using wafer hold members 33 each having the protective film 41 including the lower layer 42 and upper layer 43 described in the foregoing embodiment. The lower layer 42 and the upper layer 43 are both 3 μm thick, and a mixing ratio between the elements constituting the first protective film, and a mixing ratio between the elements constituting the second protective film differ from each other.

Tests similar to evaluation tests 2-2 were performed as evaluation tests 2-6. The protective film formed on wafer hold members 33 in evaluation tests 2-6 is also single-layered and has a thickness of 6 μm.

Tests similar to evaluation tests 2-2 were performed as evaluation tests 2-7 using wafer hold members 33 each constructed of PEEK. The protective film formed on the wafer hold members 33 in evaluation tests 2-7 is also single-layered and has a thickness of 3 μm. A mixing ratio between the elements constituting the protective film differs from the mixing ratios between the elements constituting the protective films used in evaluation tests 2-1 to 2-4, and 2-6.

Tests similar to evaluation tests 2-2 were performed as evaluation tests 2-8 using wafer hold members 33 each constructed of PEEK. The protective film formed on the wafer hold members 33 in evaluation tests 2-8 is also single-layered and has a thickness of 3 μm. A mixing ratio between the elements constituting the protective film is the same as any one of the mixing ratios between the elements constituting the protective films used in evaluation tests 2-1 to 2-4, and 2-6.

Tests similar to evaluation tests 2-2 were performed as evaluation tests 2-9 using wafer hold members 33 each constructed of polyimide. The protective film formed on the wafer hold members 33 in evaluation tests 2-9 is also single-layered and has a thickness of 3 μm. A mixing ratio between the elements constituting the protective film is the same as the mixing ratio between the elements constituting the protective film used in evaluation tests 2-7.

Tests similar to evaluation tests 2-2 were performed as evaluation tests 2-10 using wafer hold members 33 each constructed of polyimide. The protective film formed on the wafer hold members 33 in evaluation tests 2-10 is also single-layered and has a thickness of 3 μm. A mixing ratio between the elements constituting the protective film 41 is the same as any one of the mixing ratios between the elements constituting the protective films used in evaluation tests 2-1 to 2-4, and 2-6.

Results of evaluation tests 2-1 to 2-10 are substantially the same as the test results shown in FIG. 18 for the first embodiment. FIG. 18 represents the greatest depth of any formed traces of wear and an average depth value thereof, by a graph with slant lines and a graph with a number of points, respectively, for each identification number of the evaluation tests. These test results are shown above each graph and expressed in units of μm. As represented by the graphs, the maximum and average depth values of the formed traces of wear in evaluation tests 2-5 using the protective film 41 of the stacked structure are both smaller than those of evaluation tests 2-2 to 2-4, 2-6 to 2-10 each using the single-layered protective film, and than those of evaluation tests 2-1 not using a protective film. That is to say, these evaluation test results indicate that as described in the embodiment, forming the protective film into a stacked structure is effective for improving erosion resistance against chemicals.

Third Embodiment

Next, a third embodiment of the present invention is described below referring to FIGS. 31 to 44.

Figure 31:
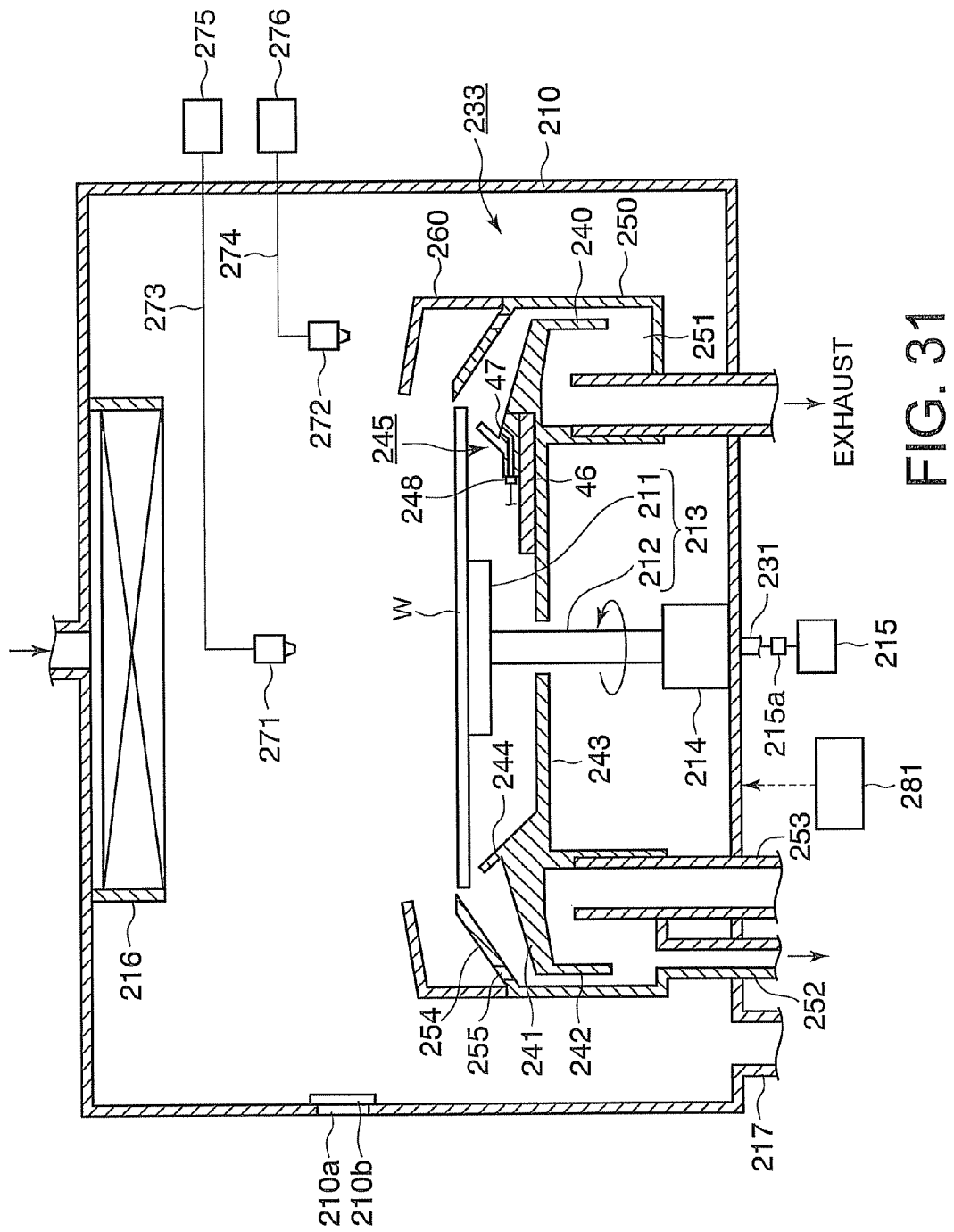
FIG. 31 is a longitudinal, sectional view of a resist coater in a third embodiment of the present invention.
Figure 32:
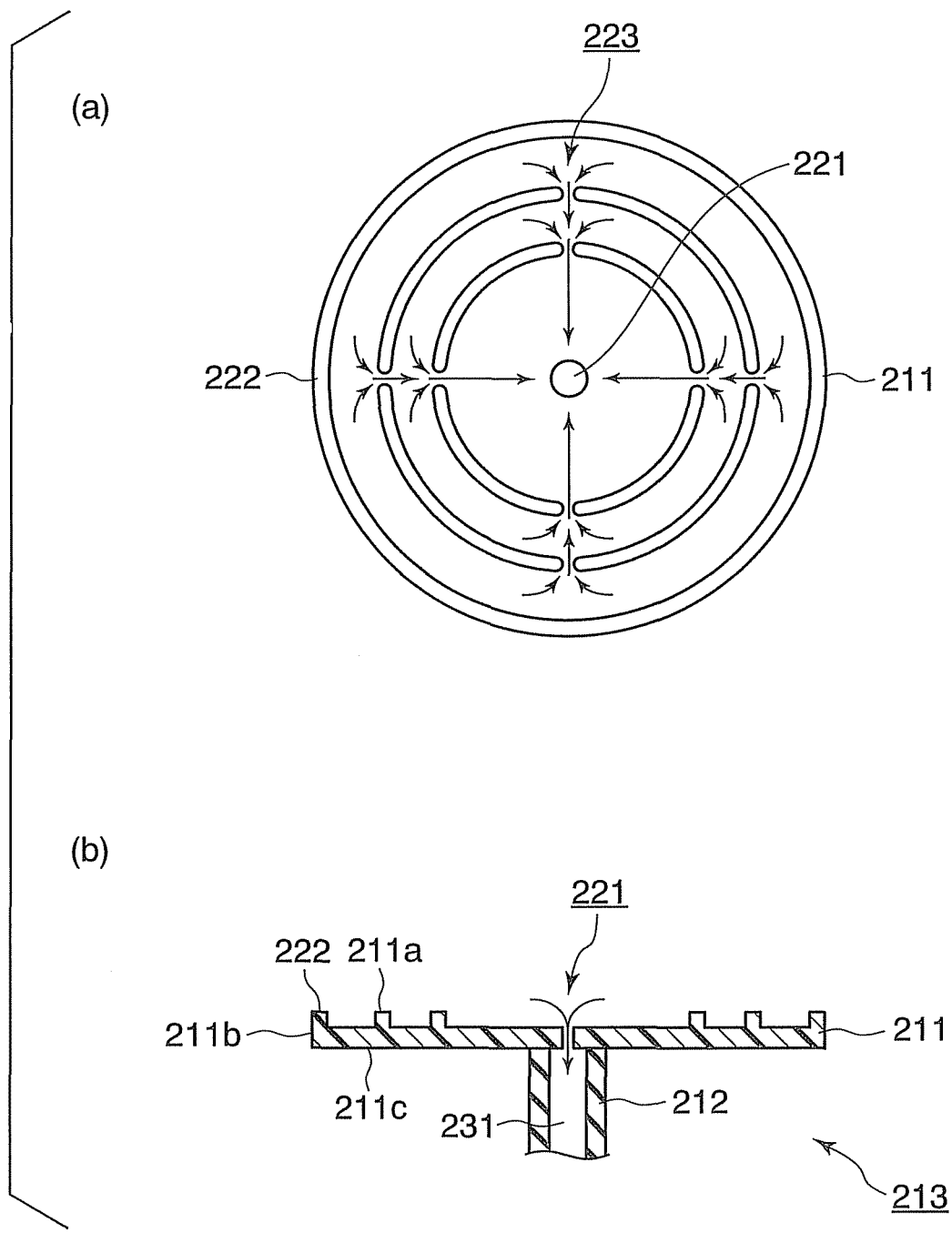
FIGS. 32(a) and 32(b) are explanatory diagrams of a table used for the resist coater.

An embodiment in which a chemical processing apparatus according to the present invention is applied to a resist coater is described. As shown in FIG. 31, the resist coater includes the following: a spin chuck (vacuum chuck) 213 including a substantially disc-shaped table 211 that is a substrate mount for retaining horizontally a substrate, for example, a semiconductor wafer W (hereinafter, referred to simply as the wafer W) by vacuum-attracting the wafer W from its lower surface, and a rotating shaft 212 connected centrally to a lower face of the table 211; and a resist nozzle 271 that is a process liquid supply element for supplying a process liquid, for example, a resist liquid, to the wafer W.

A rotary drive 214 that supports the rotating shaft 212 both rotatably about a vertical axis and liftably is connected to a lower end of the rotating shaft 212. Reference number 210 in FIG. 31 denotes a process vessel (housing) that contains the spin chuck 213, and, for example, below the process vessel 210 is connected to a suction pump 215 that is a vacuum retainer for attracting the wafer W from the lower surface via a suction pathway 231 formed in an internal region of the spin chuck 213. Reference number 215a in FIG. 31 denotes an evacuation valve provided on the suction pathway 231 in order to achieve suction-retaining and releasing of the wafer W. The process vessel 210 has, on its ceiling face, a fan filter unit (FFU) 216 for supplying a clear gas to the inside of the process vessel 210, and on a floor surface, an exhaust pipe 217 for discharging an internal atmosphere of the process vessel 210. Air supply from the fan filter unit 216 and the discharge from the exhaust pipe 217 form a downward airstream inside the process vessel 210. Reference number 210a in FIG. 31 denotes a loading port for loading/unloading the wafer W into/from the process vessel 210, and reference number 210b denotes a shutter that opens and closes the loading port.

Figure 33:
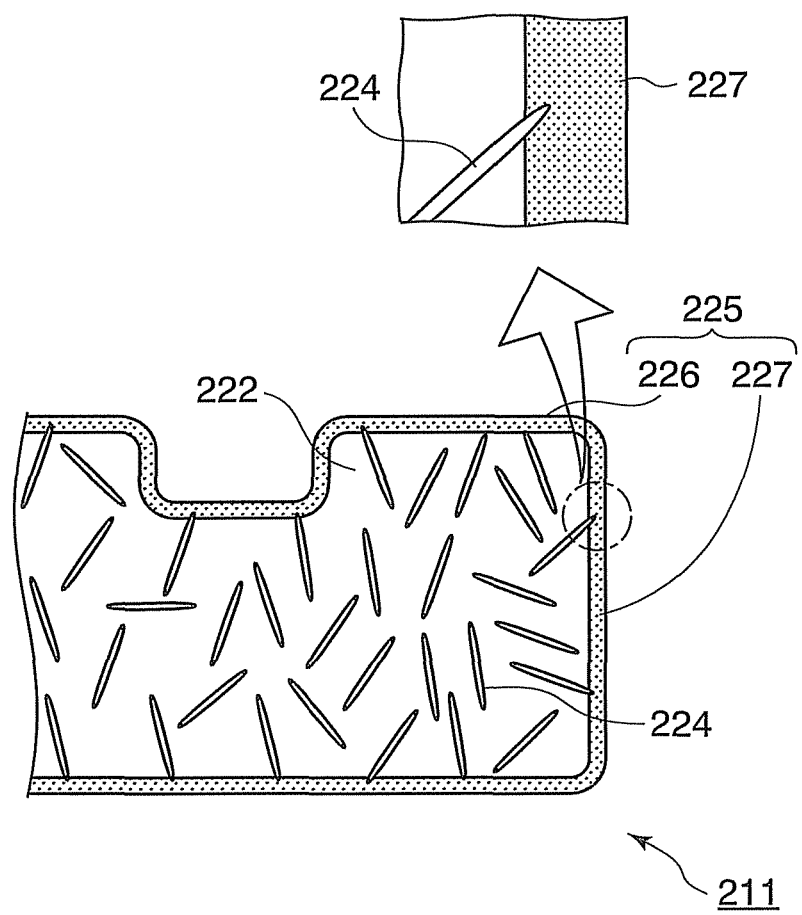
FIG. 33 is a longitudinal, sectional view illustrating the table in enlarged perspective.
Figure 34:
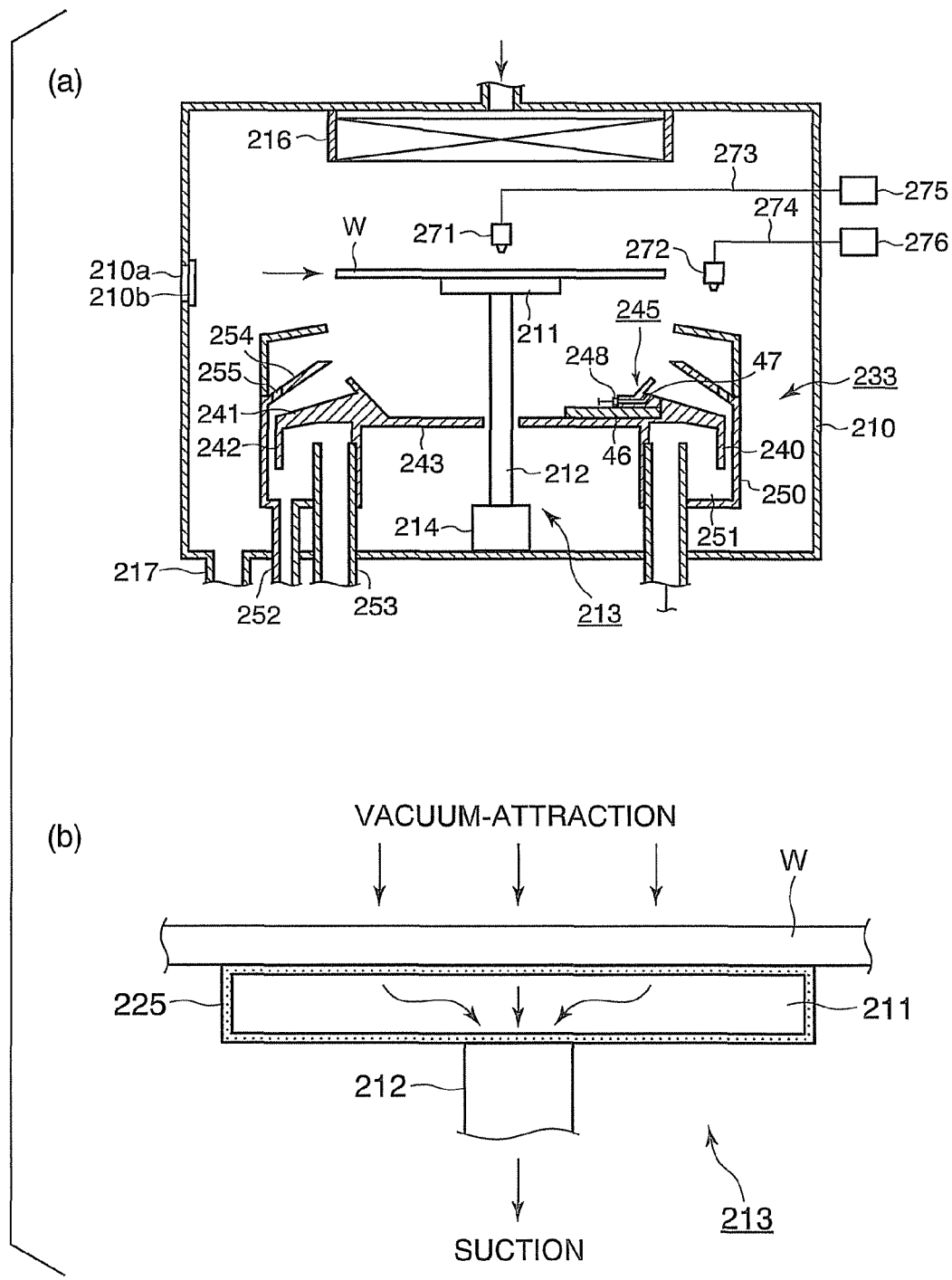
FIGS. 34(a) and 34(b) are schematic diagrams illustrating an action of the resist coater.
Figure 35:
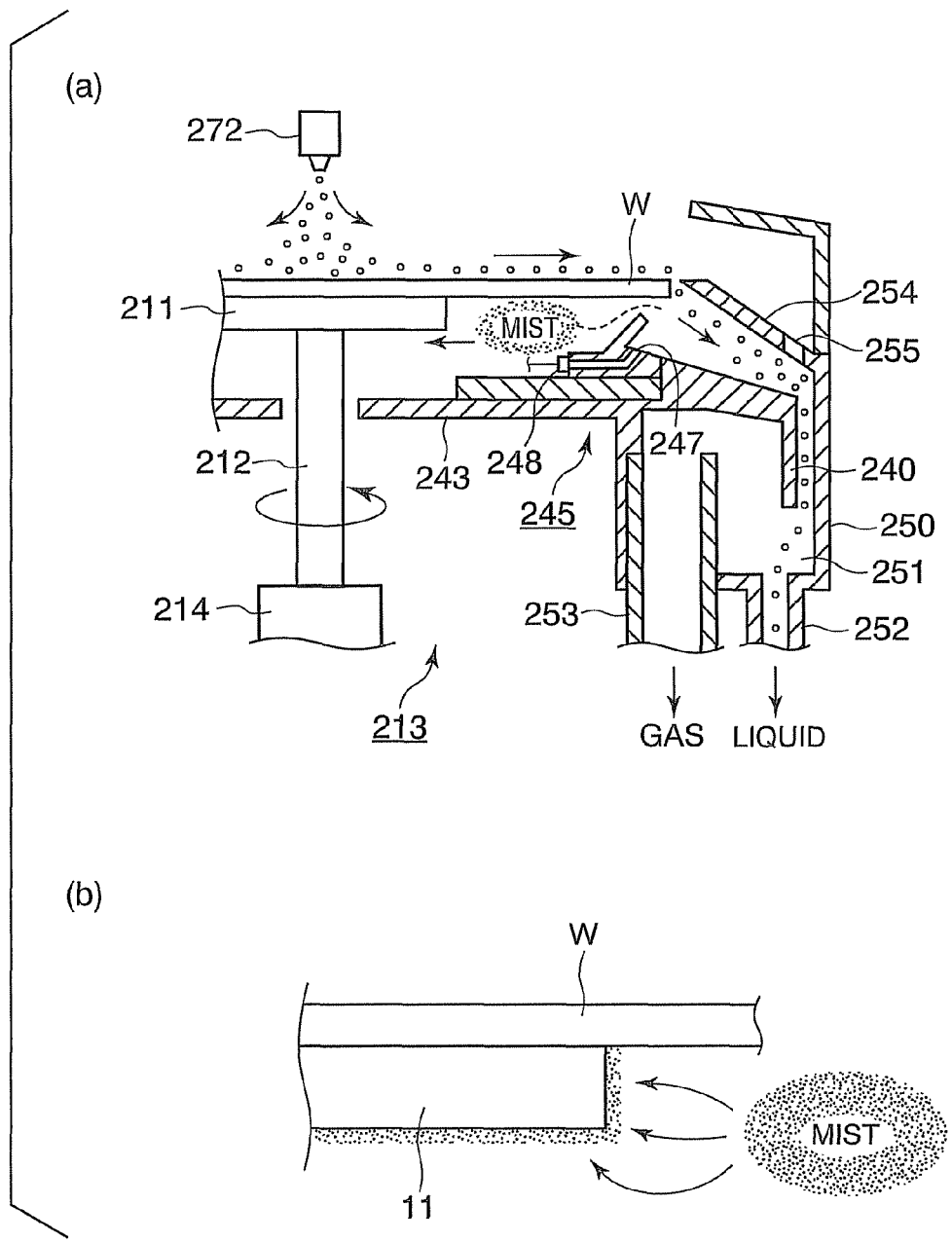
FIGS. 35(a) and 35(b) are other schematic diagrams illustrating the action of the resist coater.
Figure 36:
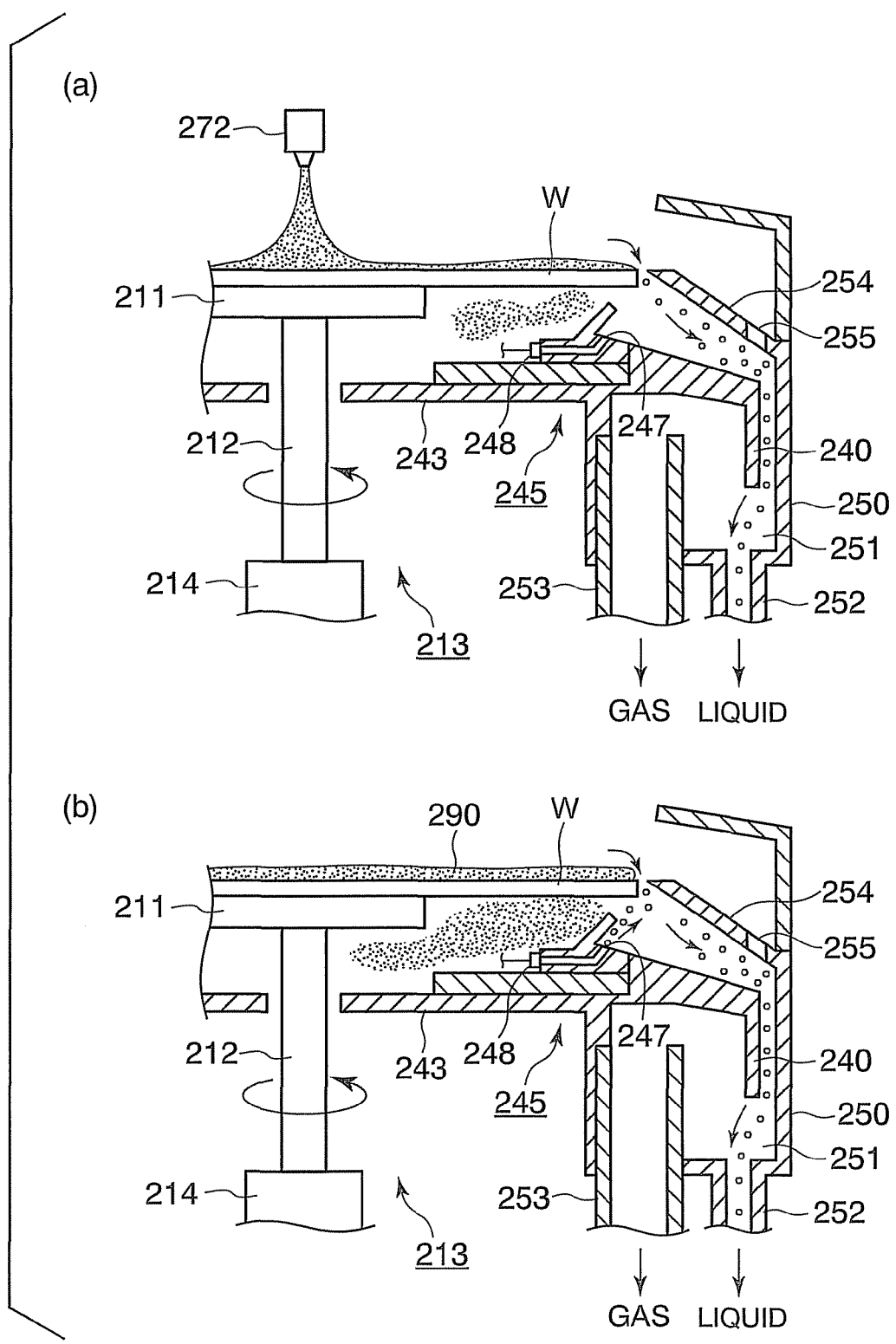
FIGS. 36(a) and 36(b) are other schematic diagrams illustrating the action of the resist coater.

The table 211 is detailed below with reference made to FIGS. 32(a), 32(b), and 33. The table 211 is formed with a diameter of 130 mm, for example, and constructed to suction-retain an inner-circumferential central section of a wafer W having a diameter of 300 mm, for example, from the lower surface of the wafer W. As shown in FIGS. 32(a), 32(b), a suction hole 221 opened to communicate with the suction pathway 231 formed in the rotating shaft 212 is provided centrally on an upper surface of the table 211, and a plurality of, for example, three ring-shaped members 222 formed in a circumferential direction of the table 211 are arranged in concentric form on the upper surface 211a of the table 211. The three ring-shaped members 222 each have an upper surface forming a substrate-retaining surface (substrate-mounting surface) for suction-retaining the wafer W, and these upper surfaces are formed to be flush so that the members 222 can retain the wafer W horizontally. Of the three ring-shaped members 222, the inner two ring-shaped members 222 each include a plurality of, for example, four, equally spaced, and longitudinally formed notches 223 in a circumferential direction of the member. When the wafer W is mounted on the table 211 and an atmosphere present at the lower surface of the wafer W is attracted from the suction hole 221, the atmosphere between the table 211 and the lower surface of the wafer W circulates from an outer circumferential side of the table 211 via the notches 223, toward the suction hole 221 at an inner-circumferential side of the table 211, as indicated by arrows in FIG. 32(a). Thus, the wafer W is suction-retained on the table 211.

The table 211 is constructed of a resin such as polyether-ether-ketone (PEEK), polybenzimidazole (PBI), polypropylene (PP), or polytetrafluoroethylene (PTFE), the resin in the present example being PEEK. As shown in FIG. 33, a large number of fibers 24 formed from, for example, carbon, glass, or a resin, in the present example, carbon, and measuring, for example, about 0.1 to 6.0 mm in length, and for example, about 7 μm in diameter, are buried as fiber bodies in the table 211. The table 211 with the fibers 224 mixed therein for enhanced table strength is molded by, for example, including the fibers 224 in a softened (fused) resin to form a mixture, and after pouring this mixture into, for example, a metallic mold and curing the mixture. In some cases, therefore, for reasons such as expansion and contraction of the resin during curing, the table 211 is molded with the fibers 224 pressed or bent toward the resin, against an inner surface of the mold, or slight projections and depressions are formed on the table surface according to particular inner-surface roughness of the mold. Accordingly, upon removal of the resin (table 211) from the mold, the fibers 224 buried in the table 211 have, for example, about 1 to 5 μm of respective front ends protruding from the surface of the table 211, either by repulsive force of the fiber ends to leap outward, or according to an inner-surface shape of the mold.

The surface of the table 211 is coated with a protective film 225 made of, for example, diamond-like carbon (DLC), so as to shroud an upper surface 211a, lateral peripheral surface 211b, and lower surface 211c of the table 211, and the protective film 225 is constituted by an upper protective layer 226 deposited over the upper surface 211a, and a lower protective layer 227 deposited covering a range from the lower surface 211c to the lateral peripheral surface 211b. The protective layers 226, 227 are interconnected continuously (such that the surface of the table 211 does not get exposed) near a boundary between the lateral peripheral surface 211b and upper surface 211a of the table 211. The protective film 225 is formed at a low temperature of, for example, 200° C. or less, by plasma CVD (Chemical Vapor Deposition), PVD (Physical Vapor Deposition), or the like, using source gases that contain, for example, carbon, hydrogen, and the like. The protective film 225 is independently deposited on, for example, the upper surface 211a, the lateral peripheral surface 211b, and the lower surface 211c each. More specifically, the table 211 is disposed in, for example, a special process vessel for plasma CVD so that the upper surface 211a faces upward (source gas supply side), then the protective layer 226 is deposited on the upper surface 211a, and after the table 211 has been turned upside down, the protective layer 227 is deposited upon the lower surface 211c of the table 211. Next, for example, the table 211 is directed sideways and then the protective layer 227 is deposited upon the lateral peripheral surface 211b under axial rotation of the table 211. In this way, the upper protective layer 226 is formed using the source gas that contains carbon and hydrogen and does not contain silicon, and the lower protective layer 227 is formed using the source gas that contains carbon, hydrogen, and fluorine. The protective layers 226, 227 resemble diamond in physical properties. More specifically, for example, hardness ranges between 1,000 and 3,000 Hv, resistivity between $1.0 \times 10^6$ and $1.0 \times 10^{14}$ Ω·cm, and surface roughness Ra between 0.5 and 1.0 nm, for example, 0.7 nm. Since the lower protective layer 227 contains fluorine as described above, this protective layer has a friction coefficient as small as 0.05 to 0.20, and is highly water-repellent against organic solvents and aqueous solutions. The protective layers 226, 227 are formed to obtain a thickness of about 1 to 20 μm for burying (shrouding) the fibers 224 that protrude outward from the surface of the table 211. The protective film 225, therefore, is strongly secured to the surface of the table 211 via the fibers 224 by a kind of anchoring effect.

Referring back to the description of the resist coater, as shown in FIG. 31, a resist nozzle 271 that is a process liquid supply element for delivering a process liquid (coating liquid), for example, a resist liquid, to the surface of the wafer W on the spin chuck 213, and a solvent nozzle 272 for delivering a dissolving liquid, for example, a thinner, are provided above the spin chuck 213. The nozzles 271 and 272 are constructed to be movable horizontally in a radial direction of the wafer W from a central portion thereof to peripheral edges thereof, by an arm not shown, and to be liftable by the arm. Additionally, a resist liquid supply 275 and a solvent supply 276 are connected to the nozzles 271 and 272, respectively, via a resist liquid supply pipe 273 and a solvent supply pipe 274, respectively.

In addition, a processing cup 233 is provided near the spin chuck 213. The processing cup 233 includes an inner cup 240 facing a lower peripheral edge of the wafer W suction-retained on the spin chuck 213, an intermediate cup 250 surrounding the inner cup 240 from its lateral and lower sides, and an outer cup 260 disposed above the intermediate cup 250.

The inner cup 240, adapted to guide into a liquid-draining pathway 252 (described later herein) the process liquid (and the like) flowing downward from the peripheral edges of the wafer W, includes an annular inclined section 241 inclined downward from a region opposed to an outer peripheral edge of the wafer W suction-retained on the spin chuck 213, toward the outside of the inclined section 241, and an annular vertical wall 242 extending downward from a lower end of the inclined section 241.

At an upper end of the inner cup 240, a bevel cleaning nozzle 245 as a dissolving-liquid supply element for delivering the dissolving liquid, for example, the thinner, from a lower inner circumferential side to the lower peripheral edge of the wafer W, is inserted in a ring-shaped protrusion 244 formed to face the peripheral edge of the wafer W on the spin chuck 213. For example, the bevel cleaning nozzle 245 is disposed in two places so that the two nozzles 245 face each other in a diametral direction of the wafer W on the spin chuck 213. Both bevel cleaning nozzles 245 are constructed to be movable forward and backward horizontally in the radial direction of the wafer W on the spin chuck 213, on a rail 246 laid on a circular plate 243 (described later herein). Reference number 247 in FIG. 31 denotes a delivery port formed in the bevel cleaning nozzle 245, and reference number 248 denotes a supply pathway for supplying the dissolving liquid from the outside of the process vessel 210 to the bevel cleaning nozzle 245. In FIG. 31, one of the two bevel cleaning nozzles 245 is depicted in a right region of the inner cup 240, but the other nozzle 245 is not depicted in a left region of the inner cup 240.

The circular plate 243 formed to be substantially of the same diameter as that of the wafer W on the spin chuck 213 is disposed on the lower side of the table 211 with the rotating shaft 212 sandwiched from both sides, and with the inner cup 240 supported at its inner peripheral side by the circular plate 243. As will be described later herein, the circular plate 243 includes a draining port (not shown) of a draining pipe (not shown, either) for discharging the process liquid and other fluids that have dropped onto the circular plate 243.

The intermediate cup 250 is formed so as to shroud the vertical wall 242 of the inner cup 240 concavely in a peripheral direction thereof, thereby to constitute a liquid-receiving section 251. One end of the liquid-draining pathway 252 extending downward, for example, from a position below the process vessel 210 is connected to a lower face of the liquid-receiving section 251 in order to discharge the process liquid. At an inner-surface side of the liquid-receiving section 251 on its bottom face, two exhaust pathways 253 each extending from another position below the process vessel 210, through the bottom of the liquid-receiving section 251 to an upper position of the liquid-receiving section 251, are connected to release the internal atmosphere of the process vessel 210. The exhaust pathways 253 are opened at positions proximate to a lower end of the inclined section 241 of the inner cup 240. An upper edge of the intermediate cup 250 outside the vertical wall 242 forms an inclined member 254 by extending in tapered form in a peripheral direction so as to be proximate to the peripheral edge of the wafer W on the spin chuck 213. At the lower end of the inclined member 254, an opening 255 for releasing an outer upper atmosphere of the wafer W with the airstream vented toward the exhaust pathways 253 is provided in a plurality of places in a peripheral direction.

The outer cup 260 is a substantially ring-shaped member disposed at an outer peripheral edge of the inclined member 254, and the outer peripheral edge is diametrally reduced in tapered form to shroud the outer upper atmosphere of the wafer W on the spin chuck 213 circumferentially for reduced disturbance in a flow of ambient air during wafer rotation.

In addition, as shown in FIG. 31, the resist coater has a control unit 281, which includes a CPU, a memory, and a program (these are not shown). The program is incorporated within the control unit 281 to conduct chemical processing such as the resist film coating process described later herein, and transport wafers W, by transmitting control signals from the control unit 281 to various other sections of the resist coater. This program is stored onto a storage medium such as a hard disk, compact disc, magneto-optical disc, or memory card, and installed in a computer.

Next, operation of the above embodiment is described below. First, a wafer W is loaded into the process vessel 210 by a transport arm not shown, and then the spin chuck 213 is moved upward as shown in FIG. 34(a), thereby to receive and vacuum-attract the wafer W, as shown in FIG. 34(b). At this time, upon the wafer W being attracted, the wafer W is strongly pressed against the table 211.

Next, the spin chuck 213 is moved downward to store the wafer W into the processing cup 233. Also, the transport arm not shown is moved backward to close the shutter 210b, and the wafer W is rotated at a desired speed, for example, several thousands of revolutions per minute (rpm). At this time, when the spin chuck 213 is activated to rotate the wafer W, since the wafer W will try to remain at rest, large frictional force consequently occurring between the table 211 and the wafer W will cause the upper surface of the table 211 and the lower surface of the wafer W to slide and chafe against each other. In addition, when the table 211 is thus rotated at high speed, although the resin that forms part of the table 211 will slightly deflect or change in shape by centrifugal force, the strong adhesion of the protective film 225 to the table 211 via the fibers 224 by a kind of anchoring effect will enable the protective film 225 to withstand the above slight change in shape by following the shape of the table 211.

After the above, the solvent nozzle 272 is moved from a standby position to a desired position above the wafer W. Next as shown in FIG. 35(a), the thinner is supplied from the solvent nozzle 272 to the wafer W to wet the surface of the wafer W with the thinner so that the wafer surface will be preconditioned to an environment suitable for on-wafer extension of the resist liquid applied later. This process is referred to prewetting. After being swept away from the outer peripheral edge of the wafer W, the thinner is discharged from the liquid-draining pathway 252 via the inclined section 241 and the vertical wall 242, and the internal atmosphere of the process vessel 210 that has circulated downward with the thinner is released from the exhaust pathway 253 via the liquid-receiving section 251. During the discharge, the thinner that was supplied to the wafer W may not be released to the liquid-draining pathway 252 or the exhaust pathway 253. Instead, the thinner may, as shown in FIG. 35(a), slightly turn around and reach the lower surface of the wafer W via its lateral region, in the form of drippings or a mist. If this actually occurs, the thinner may adhere to the protective layer 227 on the periphery or lower surface of the table 211, as shown in FIG. 35(b).

After that, the solvent nozzle 272 is returned to the standby position, then the resist nozzle 271 is moved to the desired position above the wafer W, and the wafer speed is raised to a desired value. This change in wafer speed likewise causes the wafer W and the table 211 to slightly slide and chafe against each other. Next, when the resist liquid is delivered from the resist nozzle 271 to a central portion of the wafer W, the resist liquid will, as shown in FIG. 36(a), be extended from the central portion, toward the peripheral edge, by the centrifugal force generated by wafer rotation. Also, an excess resist liquid will be swept away from the surface of the wafer W. Although the excess resist liquid that has been swept away from the surface of the wafer W will be discharged from the liquid-draining pathway 252, a mist may slightly turn around via the lateral region of the wafer W, thus likewise adhering to the lateral peripheral surface and/or lower surface of the table 211 (protective layer 227). Upon completion of the resist liquid coating process, the resist nozzle 271 is returned to the desired standby position and then the wafer W is rotated for a desired time, whereby resist film thickness is made uniform and the resist liquid dried to form a resist film 290.

Upon completion of the above formation, the wafer speed is momentarily reduced to 700 rpm, for example, and a solvent, for example, a thinner is delivered as a dissolving liquid (cleaning liquid) from the bevel cleaning nozzle 245 to the peripheral edge of the wafer W in order to perform back-rinsing. As shown in FIG. 36(b), the dissolving liquid turns around at a bevel portion on the lower surface of the wafer W and reach a bevel portion on the surface of the wafer W, thereby cleaning (cutting) a peripheral edge of the resist liquid film to desired width. The thinner that was delivered from the bevel cleaning nozzle 245, and the resist liquid dissolved in the thinner are next drained from the liquid-draining pathway 252. At this time, because of the wafer speed having been momentarily reduced to about 700 rpm as described above, air that has been compressed via the lower surface of the wafer W and a lower region of the table 211 is released, so that a negative pressure of the atmosphere on the lower surface of the wafer W temporarily increases above that of the atmosphere on the upper surface of the wafer W. When the back-rinsing process is in progress, therefore, the turnaround of a mist toward the table 211 is more likely than during prewetting and during coating with the resist film 290.

After thinner drying for a desired time, wafer rotation is stopped and then the wafer W is unloaded from the resist coater in a sequence reverse to that of loading. When wafer rotation is stopped, chafing due to sliding also occurs between the wafer W and the table 211 since the wafer W trying to maintain the rotating state is stopped via the table 211.

Next, a following wafer W is loaded and then likewise subjected to prewetting, coating with a resist film 290, and back-rinsing. Also, mists of thinner and resist liquid, although in trace quantities, further adhere with time to the lateral peripheral surface and lower surface of the table 211 (protective layer 227). During wafer processing for substrate processing at mass-production factories, each time a wafer W is transferred and vacuum-attracted or each time the wafer W is rotated, friction and sliding occur between the spin chuck 213 and the wafer W, but table wear and damage are suppressed since the protective layer 226 is formed on the surface of the table 211. Additionally, since the protective film 225 maintains strong adhesion to the table 211 via the fibers 224 by a kind of anchoring effect, even if the change in the shape of the table 211 repeatedly occurs during processing of a large number of wafers W, the shape of the protective film changes each time following that of the table 211, so film separation and damage are suppressed.

Figure 37:
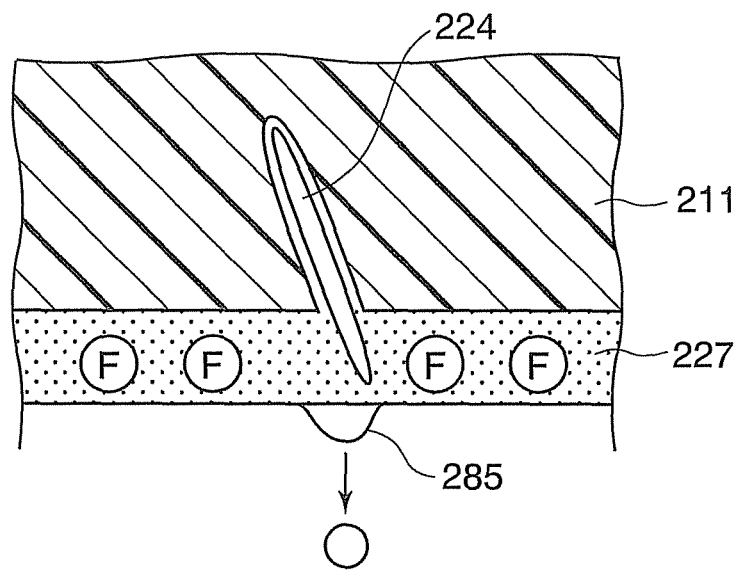
FIG. 37 is a further schematic diagram illustrating the action of the resist coater.

As the processing of the large number of wafers W is further continued, the amount of mist adhering to the table 211 (protective layer 227) will be accumulated to form, for example, a larger drip or liquid heap 285 of organic solvent, as shown in FIG. 37. At this time, the lateral peripheral surface and lower surface of the table 211 will have already had the protective layer 227 deposited upon the respective surfaces, so the liquid heap 285 will not come into contact with the table 211. Neither will the fibers 224 protruding from the surface of the table 211 come into contact with the liquid heap 285, because these fibers will have been covered with the protective layer 227. Additionally, the protective layer 227 containing fluorine as described above will have increased in water repellence, for which reason, the liquid heap 285 will immediately drip downward. Even if the liquid heap 285 is formed on the surface of the protective layer 227, therefore, contact between the liquid heap 285 and the protective layer 227 will only occur for a short time. The liquid heap 285, after dripping from the protective layer 227, will be drained from the draining pipe (not shown) that is formed in or on the circular plate 243.

According to the above embodiment, during suction-retaining of a wafer W on the spin chuck 213, when the resin is molded with the fibers 224 internally mixed for improved strength of the table 211, the ends of the fibers 224 protrude from the surface of the table 211 and thus the protective layer 226 is deposited upon the upper surface of the table 211 so that the fibers 224 are buried. Accordingly, the table 211 is kept out of direct contact with the wafer W, and for example, during the transfer and vacuum-attraction of the wafer W or during its rotation, friction and sliding between the table 211 and the wafer W are suppressed and hence, table deterioration (wear) is suppressed. In addition, since the protective layer 226 maintains strong adhesion to the table 211 via the fibers 224 by a sort of anchoring effect, even if the table 211 deflects or changes in shape during rotation, the protective layer 226 can change its own shape following the shape of the table 211, so that film separation and damage are suppressed. Even when a number of wafers W are subjected to processing, therefore, the deterioration of the table 211 is suppressed. Furthermore, since the fibers 224 are covered with the protective layer 226, even in a case of, for example, contact between the wafer W and the table 211, loss of the fibers 224 is suppressed and hence, particles are restrained from occurring. Since the loss of the fibers 224 is suppressed, even if any of the fibers 224 has been lost, cracking or damage that originates from that region is restrained from progressing or occurring.

Figure 38:
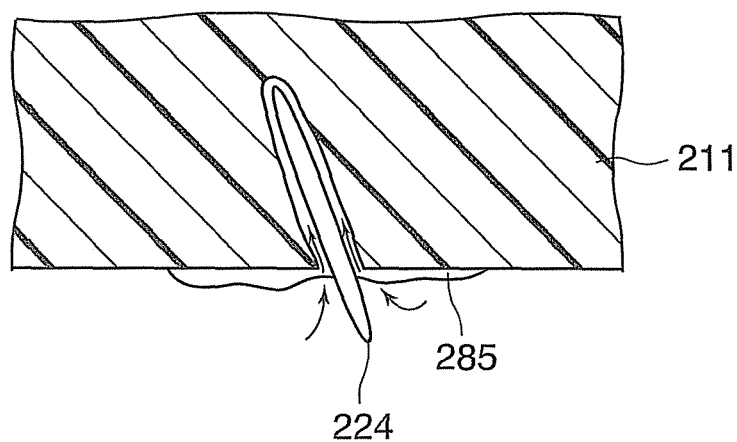
FIG. 38 is a schematic diagram illustrating the table without a diamond-like carbon film formed on the surface.

Furthermore, when the spin chuck 213 is used for chemical process, even if the process liquid supplied to the surface of a wafer W turns around and reaches the lateral peripheral surface or lower surface of the table 211 via the lateral region of the wafer W and thus the heap 285 of the process liquid is formed during subsequent processing of a number of other wafers W, forming the protective layer 227 on the lateral peripheral surface and lower surface of the table 211 will prevent the table 211 from coming into direct contact with the liquid heap 285, and hence suppress a progress of chemical erosion (deterioration) of the table 211 in the form of, for example, oxidation or dissolution. Furthermore, as described above, forming the protective layer 227 so as to cover the fibers 224 protruding outward from the surface of the table 211 prevents the process liquid from entering the table 211 via, for example, a slight clearance (interface) between the table 211 and the fibers 224, and thus suppresses the deterioration of the table 211. At this time, if the protective layer 227 is not deposited, surface tension, for example, of the process liquid will permit it to enter the table 211 from the slight clearance (interface) between the table 211 and the fibers 224, as shown in FIG. 38, and consequential erosion of the table 211 from the inside will make a further loss of the fibers 224 easily occur. Depositing the protective layer 227 in the form as described above, however, is also effective for suppressing the loss of the fibers 224 due to the erosion of the table 211. Moreover, the presence of fluorine contained in the protective layer 227 imparts extremely high water repellence to the surface thereof. This prevents the protective layer 227 from coming into contact with the liquid heap 285 for a long time, and consequently, for example, even if pinholes or other defects are formed on the surface of the protective layer 227 and the process liquid attempts entering the table 211, the liquid heap 285 immediately drips downward, whereby the erosion of the table 211 is further suppressed.

Additionally, since the protective layer 226 on the upper surface which comes into contact with the wafer W contains no silicon, the protective layer 226 is softer than the wafer W, and physical damage to the wafer W is suppressed as a result.

Besides, adhering of particles to the lower surface of the wafer W is suppressed since the protective layer 226 with an extremely small friction coefficient is formed on the substrate-mounting surface that comes into contact with the wafer W.

In the above example, the table 211 has had the protective film 225 (protective layers 226, 227) formed on the entire surface. Referring to the upper surface of the table 211, however, the protective film 225 may be formed only on the substrate-mounting surface (upper edge of the ring-shaped member 222) that comes into contact with at least the wafer W. Alternatively or additionally, to apply the spin chuck 213 to an apparatus not involving chemical process, such as a peripheral exposure apparatus or selective exposure apparatus for removing an unnecessary resist film from a peripheral edge of a wafer W, the rotary drive 214 may not include a rotational structure and the protective layer 227 may not be formed on the lateral peripheral surface or lower surface of the table 211. Furthermore, for example, if any wear on the surface of the table 211 is negligibly insignificant for chemical process, the table 211 may not have the protective layer 226 formed on its upper surface and may have the protective layer 227 formed on its lateral peripheral surface and its lower surface. Moreover, instead of being formed to shroud all of the lateral peripheral surface and lower surface of the table 211, the protective layer 227 may be formed only on one of the lateral peripheral surface and the lower surface, or only on a part thereof.

The material of the protective film 225 may contain, for example, carbon nitride (CN) and oxygen, in addition to carbon and hydrogen, or the protective layer 227 on the lateral peripheral surface and the lower surface may contain silicon. In addition, the protective film 225 may be, for example, a wear-resistant film with a high carbon ratio, such as a film that contains a purified hydrocarbon, in which case, a coating liquid created by mixing homogenously the purified hydrocarbon and an acrylic resin such as polycarbonate will be applied to the table 211, then dried, and cured to form the protective film 225. A further alternative to the above protective film 225 that contains carbon can be of a ceramic material such as SIC (silicon carbide), AlN (nitride aluminum), or quartz, and the ceramic-based protective film 225 in that case will be formed by, for example, heat treatment after coating in powder form.

Furthermore, in addition to the resist coater described above, the spin chuck 213 can be applied to other devices used for the chemical processes described later herein, such as an anti-reflective underlayer coater (BCT) and an anti-reflective surface coater (TCT). For liquid immersion lithography, the spin chuck 213 may be applied to a protective film coater (ITC) that forms a protective film on the surface of the wafer prior to a start of the immersion lithography, or to an organic protective film separation module (ITR) that separates the protective film after the immersion lithography. The organic protective film separation module will include, instead of the resist nozzle 271 described above, a nozzle for supplying an organic solvent (dissolving liquid), for example, a thinner. Furthermore, since the protective film 225 is resistant to acid aqueous solutions and alkaline aqueous solutions as well as to the above-described organic solvents (thinner and resist liquid), the spin chuck 213 may be applied to, for example, a developing apparatus that performs a developing process by supplying an alkaline process liquid (developing solution) to the resist film on the wafer W after exposure. Otherwise, the spin chuck 213 may be applied to, for example, a single wafer cleaning apparatus that uses, sequentially or as a mixed process liquid, several kinds of chemicals such as an alkaline aqueous solution (a mixture of an aqueous ammonia solution and a hydrogen peroxide solution), acid aqueous solution (dilute hydrofluoric acid aqueous solution), and organic solvent (IPA, isopropyl alcohol). In each of the above cases, the deterioration of the table 211 due to the use of the alkaline aqueous solution, the acid aqueous solution, or the organic solvent, is also suppressed during the formation of the protective layer 227.

Figure 39:
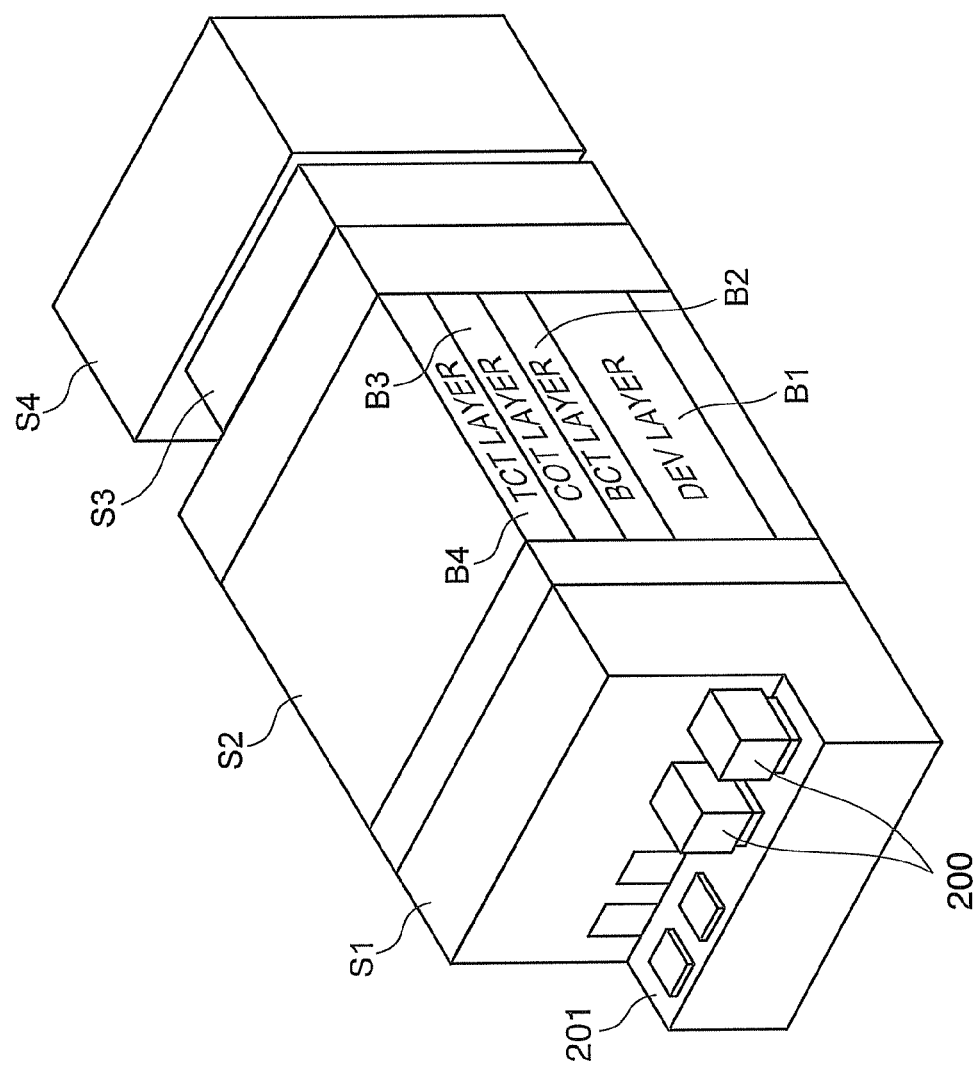
FIG. 39 is a perspective view of a coating/developing apparatus applying the resist coater.
Figure 40:
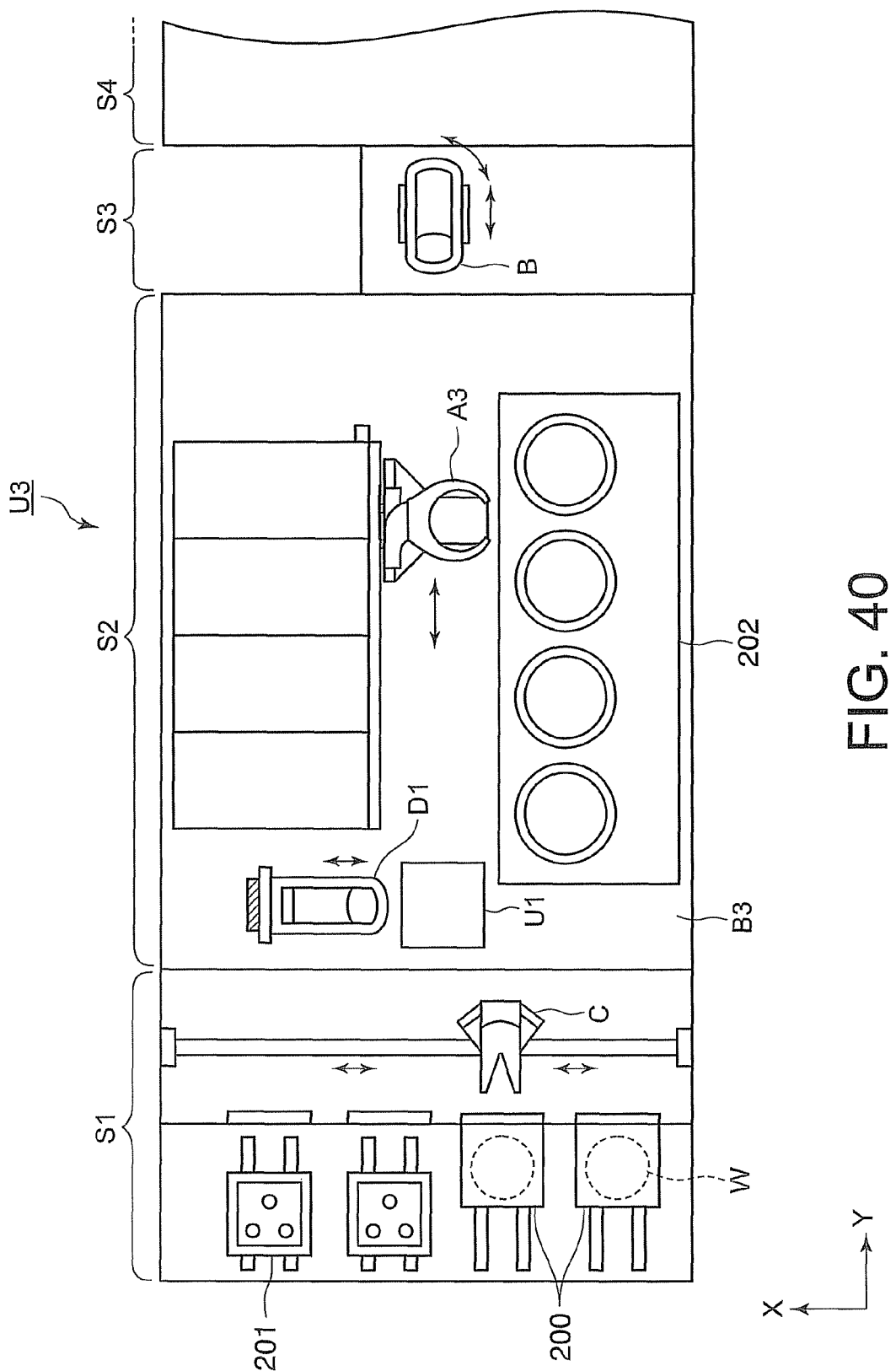
FIG. 40 is a plan view of the coating/developing apparatus.

Next, a coating/developing apparatus applying the above-described resist coater is described below with reference made to FIGS. 39 to 41. This coating/developing apparatus includes a carrier block Si for unloading a wafer W from an enclosed type of carrier 200, a processing block S2 for performing various processes upon the wafer W, and an interface block S3 for transferring the wafer W between the processing block S2 and an exposure apparatus S4 connected to the coating/developing apparatus as shown in FIGS. 39 and 40. The carrier block Si is constructed so that a transfer arm C takes out the wafer W from the carrier 200 mounted on a mounting table 201, then transfers the wafer W to the processing block S2 adjacent to the carrier block S1, and after receiving from the processing block S2 the wafer W that has been processed therein, returns the processed wafer W to the carrier 200.

Figure 41:
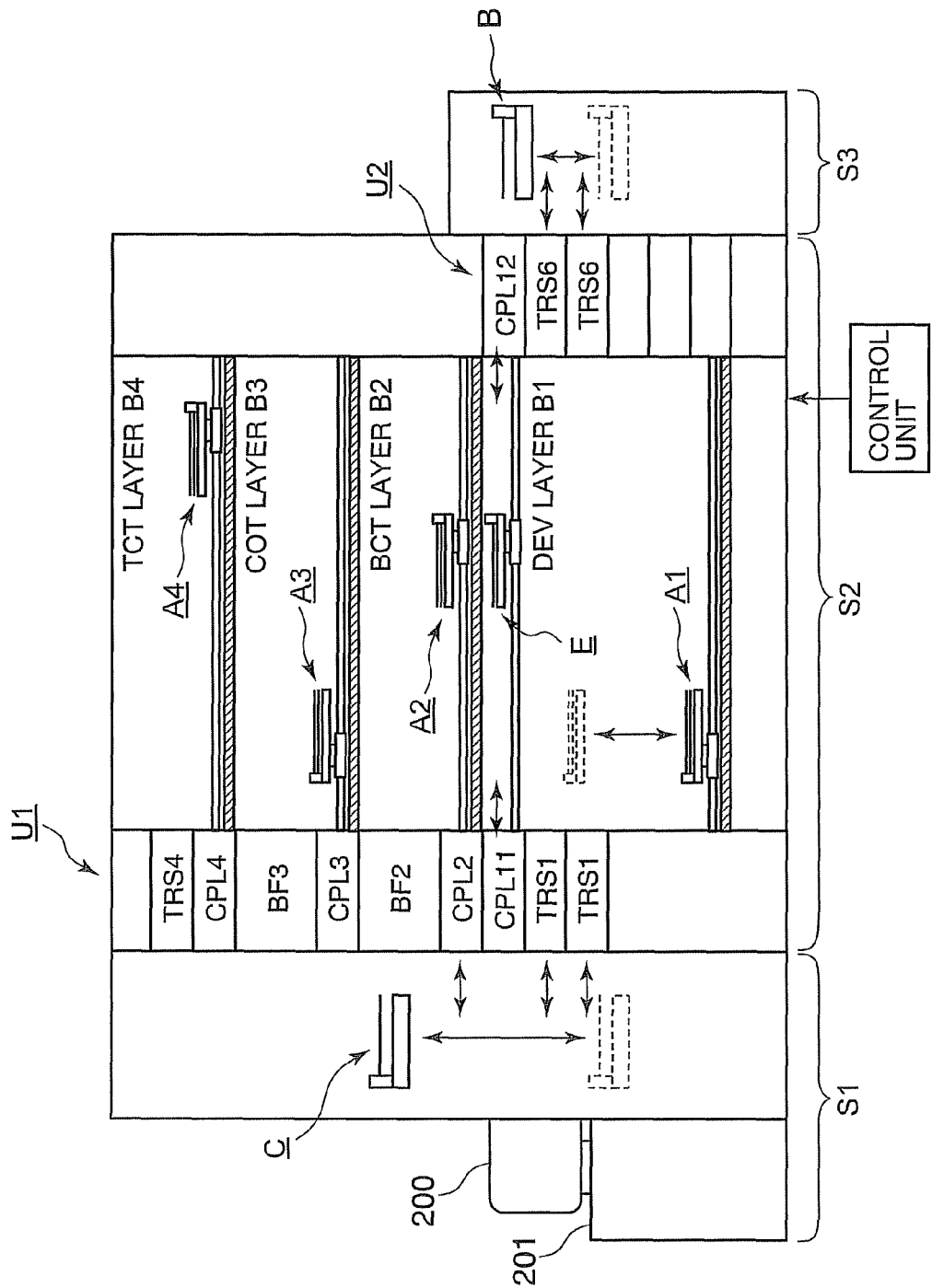
FIG. 41 is a longitudinal, sectional view of the coating/developing apparatus.
Figure 42:
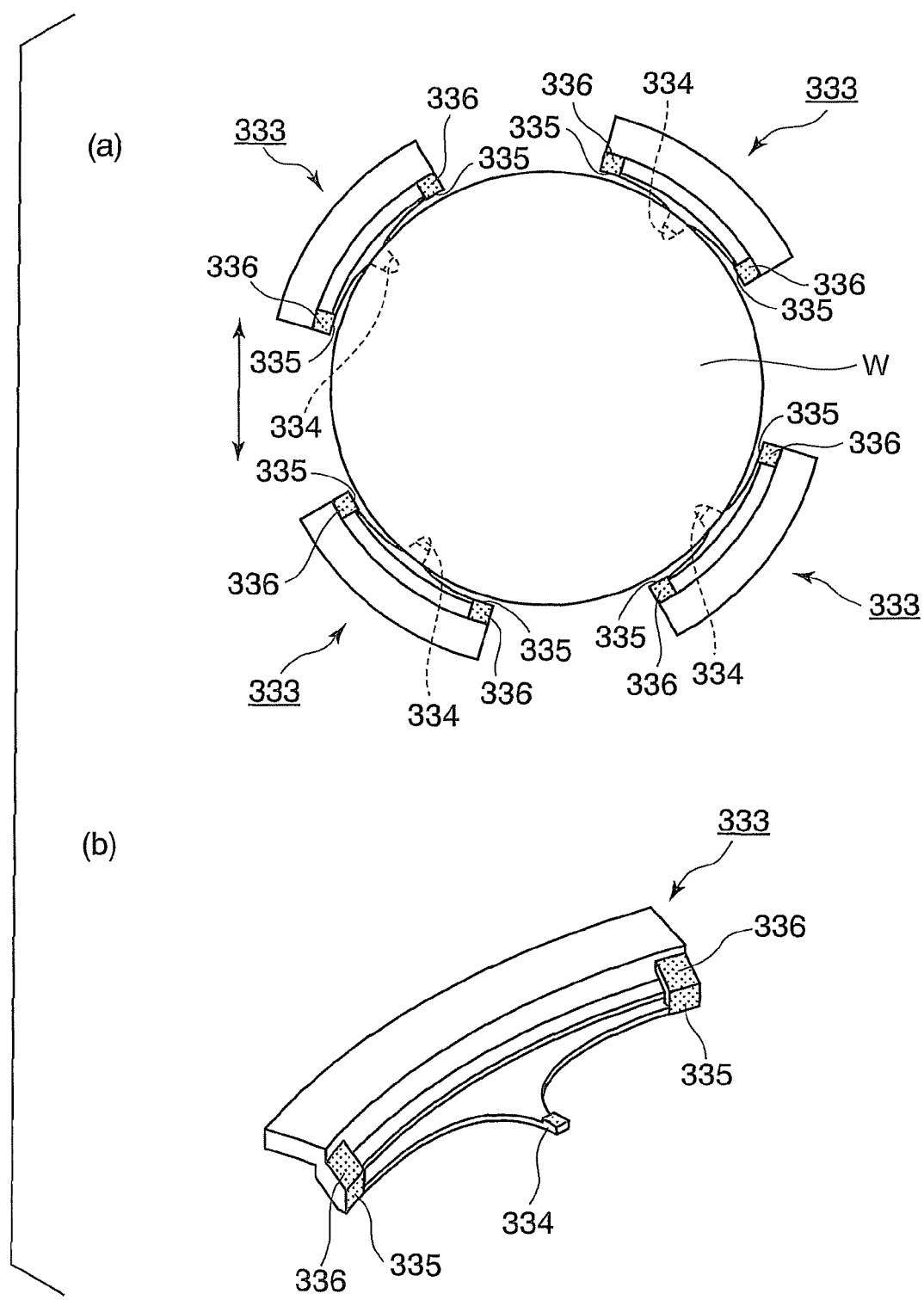
FIGS. 42(a) and 42(b) are schematic diagrams illustrating a method of experimentation in an example of the present invention.

As shown by way of example in FIG. 41, the processing block S2 includes a first block (DEV layer) B1 for a developing process, a second block (BCT layer) B2 for forming an anti-reflective film on a lower-layer side of a resist film, a third block (COT layer) B3 for resist liquid coating, and a fourth block (TCT layer) B4 for forming a anti-reflective film on an upper-layer side of the resist film. The four layers are stacked in that order with the lowermost one first.

The third block (COT layer) B3 includes the following: a resist coater for coating with a resist liquid; a heating/cooling unit group with a substrate heater incorporated therein to conduct a pre-process prior to, and a post-process following completion of, the process performed in the resist coater; and a transport arm A3 provided between the resist coater and the heating/cooling unit group in order to transfer the wafer W therebetween.

The second block (BCT layer) B2 and the fourth block (TCT layer) B4 each include a chemical processing unit for coating the wafer W with an anti-reflective film forming chemical by spin coating, the above-described heating/cooling unit group, and transport arms A2, A4 each provided between the chemical processing unit and the heating/cooling unit group in order to transfer the wafer W therebetween. The first block (DEV layer) B1 includes, for example, a two-stage stacked arrangement of developing units in one DEV layer block B1. The DEV layer B1 also includes a common transport arm A1 to transfer the wafer W to the two developing unit stages. As shown in FIGS. 40 and 41, the processing block S2 further has a rack unit U1 and the wafer W is transported between various sections of the rack unit U1 by a liftable transfer arm D1 provided near the rack unit U1. A shuttle arm E that is a dedicated transport element for transporting the wafer W directly from a transfer unit CPL 11 within the rack unit U1 to a transfer unit CPL 12 within a rack unit U2 of the processing block S2, is provided in an upper section of the DEV layer B1.

In this coating/developing apparatus, the wafer W in the carrier 200 of the carrier block Si is first taken out by the transfer arm C and carried to one transfer unit, for example, a transfer unit CPL 2, of the rack unit U1. The wafer W is further carried into the third block (COT layer) B3 via a transfer unit CPL 3 and the transport arm A3, and then after the surface of the wafer W has been hydrophobized in a hydrophobizing unit, a resist film is formed by the chemical processing unit 202, as described above. After this, the wafer W is transferred to a transfer unit BF 3 of the rack unit U1 by the transport arm A3.

The wafer W is further transferred from the transfer unit BF 3 through the transfer arm D1 and a transfer unit CPL 4 to the transport arm A4, and the wafer W, after having an anti-reflective film formed on the resist film, is next transferred to a transfer unit TRS 4 by the transport arm A4. The anti-reflective film may not be formed on the resist film or the second block (BCT layer) B2 may form an anti-reflective film instead of hydrophobizing the wafer surface.

The wafer W with the formed resist film and furthermore, with the anti-reflective film stacked thereupon, is transferred to the transfer unit CPL 11 via the transfer units BF 3, TRS 4, by the transfer arm D1. The wafer W is further transported directly from the transfer unit CPL 11 to the transfer unit CPL 12 of the rack unit U2 by the shuttle arm E, and then carried into the interface block S3. Each transfer unit with the reference code CPL assigned thereto in FIG. 41, also serves as a cooling unit for temperature control, and each transfer unit with the reference code BF assigned thereto, also serves as a buffer unit having a multiple-wafer mounting capability.

The wafer W is next carried to the exposure apparatus S4 by an interface arm B, then after undergoing a predetermined exposure process in the exposure apparatus S4, the wafer W is mounted in a transfer unit TRS 6 of the rack unit U2 and returned to the processing block S2. The returned wafer W undergoes the developing process in the first block (DEV layer) B1, next carried to the rack unit U1 by the transport arm A1, and returned to the carrier 200 via the transfer arm C. To connect an immersion lithographic apparatus that performs immersion lithography as the above-described exposure apparatus S4, the protective film coater (ITC) that forms the protective film on the surface of the wafer W prior to the start of the immersion lithography, and the organic protective film separation module (ITR) that separates the protective film after the immersion lithography will be provided in the processing block S2 of the coating/developing apparatus.

Example

The following describes the tests that were performed for confirming an extent of improvement in the acid resistance and wear resistance of the table 211 having the above protective film 225 formed thereon.
(Evaluation Tests 1)

Tests for evaluating wear resistance of the protective film 225 were first performed as evaluation tests 1. During these tests, in order to perform acceleration tests with a physical shock rapidly applied to the protective film 225, four wafer hold members 333 for retaining the wafer W from lateral sides were first arranged in a circumferential direction of the wafer. Next, an outer circumferential edge of the wafer W was made to collide against inner surfaces of the wafer hold members 333, by moving the wafer W in a horizontal direction in an internal region of the wafer hold members 333, and wear levels of the wafer hold members 333 were measured. The wafer hold members 333 are each constructed as shown in FIGS. 42(a) and 42(b). Reference number 334 denotes a lower-surface support section that supports the wafer W from the lower surface, 335 a lower vertical wall that surrounds from the corresponding lateral side the wafer W supported on the lower-surface support section 334 and restricts a position of the wafer W, and 336 an inclined section formed for tapered, diametral, upward enlarging from the lower vertical wall 335, to slide the wafer W downward onto the lower-surface support section 334 while supporting the outer edge of the wafer W. The wafer hold members 333 are each connected to a drive not shown, and adapted to reciprocate in the horizontal direction, as indicated by arrows in FIG. 42(a), while maintaining a predetermined spacing between one another. In addition, positions of the wafer hold members 333 are preadjusted so that the respective lower vertical walls 335 are slightly spaced apart from the peripheries of the wafer W.

Evaluation tests 1-1 were performed for comparison with an example having the protective film 225 described later herein, not having on each wafer hold member 333 the protective film 225 described in the above embodiment. The wafer hold members 333 used in these tests are each constructed of a predetermined resin instead of the PEEK resin described in the embodiment. In the predetermined resin, carbon fibers are included in substantially the same form as in the embodiment. After wafer mounting, the wafer hold members 333 were reciprocated 200,000 times and the wafer W was made to collide against the respective lower vertical walls 335 each time. After this, depths of any traces of wear, formed on each lower vertical wall 335, were measured using a microscope.

Evaluation tests 1-1 were followed by evaluation tests 1-2 similar to tests 1-1, and depths of any traces of wear, formed on each lower vertical wall 335, were measured. However, the protective film 225 (protective layer 226) described in the embodiment is formed on the wafer hold members 333, and the protective film is 3 μm thick.

Evaluation tests 1-3 were performed similarly to evaluation tests 1-2, and depths of any traces of wear, formed on each lower vertical wall 335, were measured. The wafer hold members 333 used in evaluation tests 1-3 are each constructed of the same PEEK resin as used in the embodiment. Thickness of the protective film 225 formed on the wafer hold members 333 is 3 μm, which is the same as in evaluation tests 1-2.

Evaluation tests 1-4 were performed similarly to evaluation tests 1-3, and depths of any traces of wear, formed on each lower vertical wall 335, were measured. The reciprocation of each wafer hold member 333 was repeated 10,000,000 times. The protective film 225 formed on the lower vertical wall 335 has the same thickness of 3 μm as used in evaluation tests 1-1. The wafer hold member 333 is constructed of the same resin as used in evaluation tests 1-1.

Evaluation tests 1-5 were performed similarly to evaluation tests 1-4, and depths of any traces of wear, formed on each lower vertical wall 335, were measured. Each wafer hold member 333 in evaluation tests 1-5, however, is constructed of the same predetermined resin as used in evaluation tests 1-2. Thickness of the protective film 225 formed on various sections of the wafer hold member 333 is 8 μm. The reciprocation of the wafer hold member 333 was repeated 10,000, 000 times.

Evaluation tests 1-6 were performed similarly to evaluation tests 1-4. The reciprocation of each wafer hold member 333, however, was repeated 10,000,000 times and depths of any traces of wear were measured on each lower-surface support section 334.

Evaluation tests 1-7 were performed similarly to evaluation tests 1-3. The reciprocation of each wafer hold member 333, however, was repeated 10,000,000 times and depths of any traces of wear were measured on each lower-surface support section 334.

Evaluation tests 1-8 were performed similarly to evaluation tests 1-5. The reciprocation of each wafer hold member 333, however, was repeated 10,000,000 times and depths of any traces of wear were measured on each lower-surface support section 334.

Figure 43:
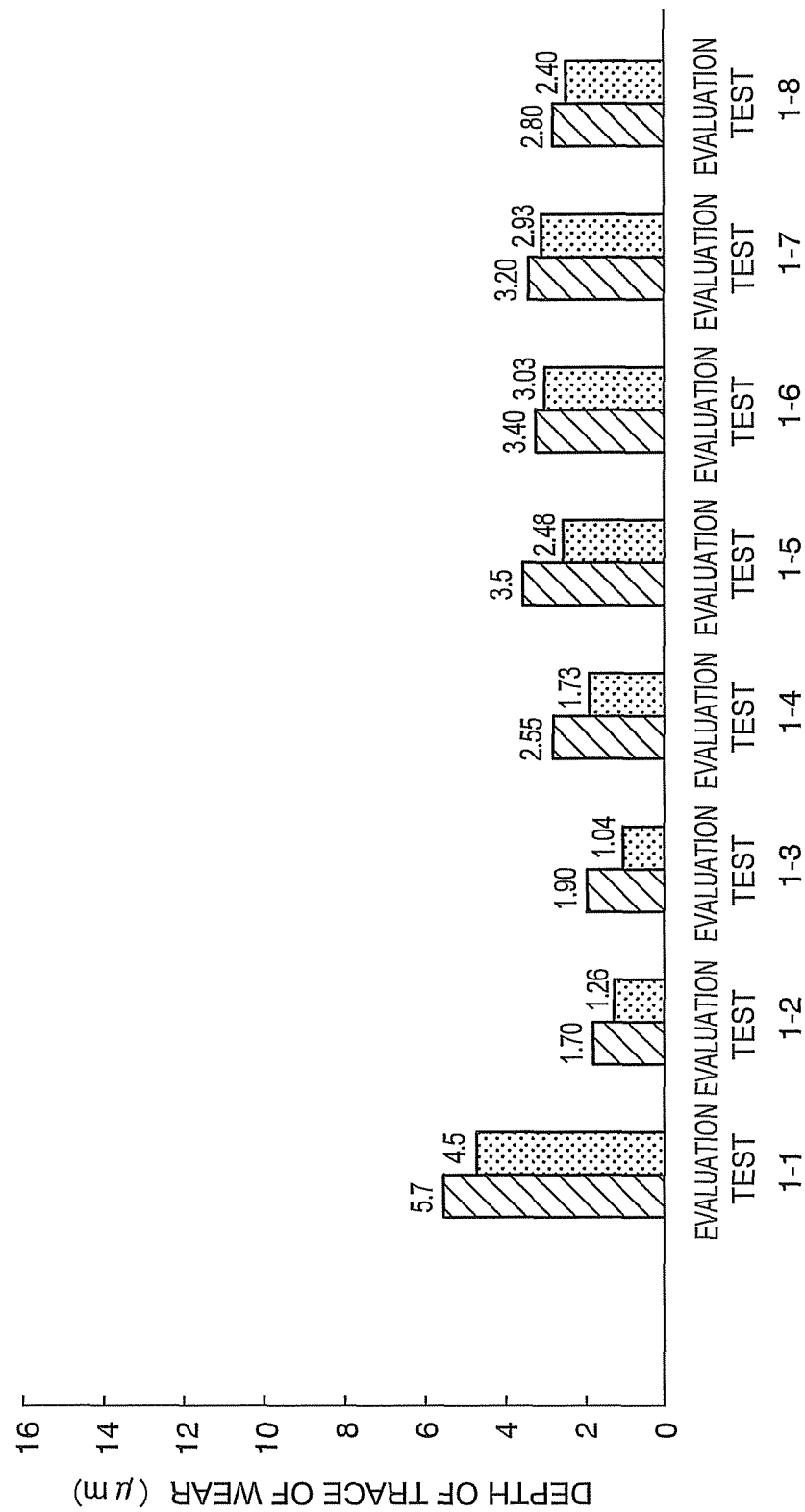
FIG. 43 is a characteristics diagram that represents test results obtained in the example of the present invention.

FIG. 43 shows results of evaluation tests 1-1 to 1-8. The greatest depth of the formed traces of wear, and an average depth value thereof are represented by a graph having slant lines, and a graph having a number of points, respectively, for each identification number of the evaluation tests. These test results are shown above each graph and expressed in units of μm. As represented by the graphs, the maximum and average depth values of the formed traces of wear in evaluation tests 1-2 are both smaller than those of evaluation tests 1-1. That is to say, the results of evaluation tests 1-1 and 1-2 indicate that as described in the embodiment, the deposition of the protective film 225 improves the lower vertical wall 335 (table 211) of the wafer hold member 333 in wear resistance. In addition, although the number of collisions of the wafer W against the lower vertical wall 335 in evaluation tests 1-4 is greater than in evaluation tests 1-1, the maximum and average depth values of the formed traces of wear in evaluation tests 1-4 are smaller than those of evaluation tests 1-1. These results also indicate that the deposition of the protective film 225 improves the wear resistance of the lower vertical wall 335.

It can be seen from the results of evaluation tests 1-3 and 1-5 that even when the kind of resin forming the wafer hold member 333, and the thickness of the protective film 225 are changed, wear resistance is increased above that obtained in evaluation tests 1-1. In addition, since the maximum and average depths of the formed traces of wear in evaluation tests 1-6 to 1-8 are held down to relatively small values, the formation of the protective film 225 is considered to be effective for the lower-surface support section 334 as well.

(Evaluation Tests 2)

In evaluation tests 2-1, an undiluted solution of sulfonic acid was drip-applied to wafer hold members 333, and depths of any consequential traces of wear (corrosion) were measured using a microscope. The protective film 225, however, is not formed on the wafer hold members 333. In addition, each wafer hold member 333 is constructed of the predetermined resin used in evaluation tests 1-1, instead of the PEEK resin.

In evaluation tests 2-2, as in the embodiment, an undiluted solution of sulfonic acid was drip-applied to wafer hold members 333 each having the protective film 225 (protective layer 227) formed on various sections in a manner similar to that of evaluation tests 2-1, and depths of any consequential traces of wear were measured using a microscope. Each wafer hold member 333 is constructed of the predetermined resin used in evaluation tests 2-1, and the protective film 225 is 1 μm thick.

Evaluation tests 2-3 similar to evaluation tests 2-1 were performed using wafer hold members 333 each having a 3-μm thick protective film 225.

Evaluation tests 2-4 similar to evaluation tests 2-1 were performed using wafer hold members 333 each having a 6-μm thick protective film 225.

Evaluation tests 2-5 similar to evaluation tests 2-1 were performed using wafer hold members 333 each having an 8-μm thick protective film 225.

Evaluation tests 2-6 similar to evaluation tests 2-1 were performed using wafer hold members 333 each constructed of PEEK and having a 3-μm thick protective film 225. A mixing ratio between the elements constituting the protective film 225 differs from any of mixing ratios between the elements constituting the protective films 225 used in evaluation tests 2-1 to 2-5.

Evaluation tests 2-7 similar to evaluation tests 2-1 were performed using wafer hold members 333 each constructed of PEEK and having a 3-μm thick protective film 225. A mixing ratio between the elements constituting the protective film 225 is the same as the mixing ratio between the elements constituting any of the protective films 225 used in evaluation tests 2-1 to 2-5.

Evaluation tests 2-8 similar to evaluation tests 2-1 were performed using wafer hold members 333 each constructed of polyimide and having a 3-μm thick protective film 225. A mixing ratio between the elements constituting the protective film 225 is the same as the mixing ratio between the elements constituting the protective film 225 used in evaluation tests 2-6.

Evaluation tests 2-9 similar to evaluation tests 2-1 were performed using wafer hold members 333 each constructed of polyimide and having a 3-μm thick protective film 225. A mixing ratio between the elements constituting the protective film 225 is the same as the mixing ratio between the elements constituting any of the protective films 225 used in evaluation tests 2-1 to 2-5.

Figure 44:
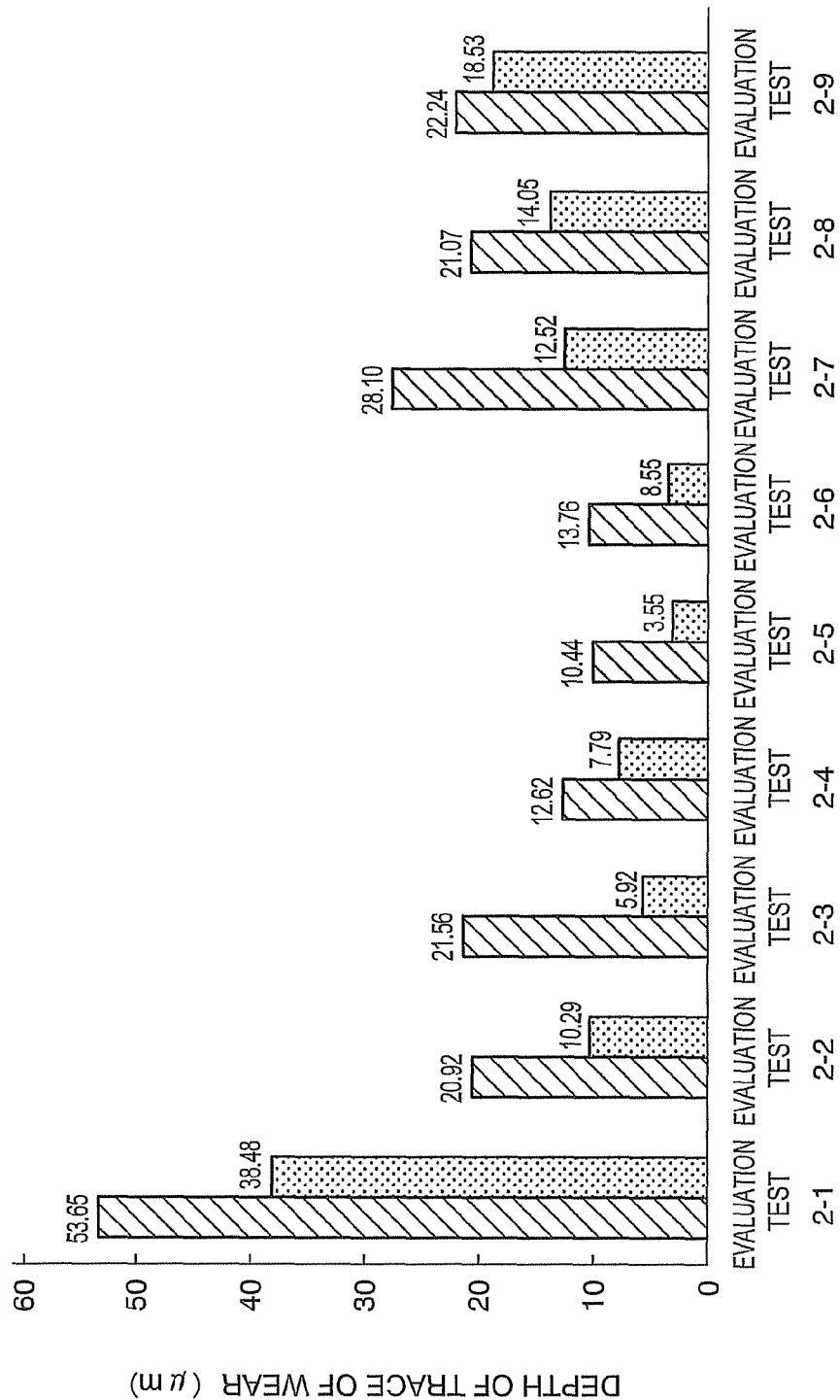
FIG. 44 is a characteristics diagram that represents other test results obtained in the example of the present invention.

FIG. 44 shows results of evaluation tests 2-1 to 2-9. As with FIG. 43, FIG. 44 represents the greatest depth of any formed traces of wear and an average depth value thereof, by a graph with slant lines and a graph with a number of points, respectively, for each identification number of the evaluation tests. These test results are shown above each graph and expressed in units of μm. As represented by the graphs, the maximum and average depth values of the formed traces of wear in evaluation tests 2-2 to 2-5 are both smaller than those of evaluation tests 2-1. That is to say, the results of evaluation tests 2-1 to 2-5 indicate that the formation of the protective film 225 improves acid resistance.

The maximum and average depth values of the traces of wear, formed in evaluation tests 2-6 to 2-9, are also held down to relatively small values. In addition, these results indicate that forming the protective film 225 is effective for improving corrosion resistance.

What is claimed is:

1. A substrate support device comprising:
   a support member having;
   a lower-surface support section to support a lower surface of a substrate; and
   a position restriction section provided on the lower-surface support section, the position restriction section being formed to surround a periphery of the substrate supported on the lower-surface support section and restrict a position of the substrate;
   wherein at least one of the lower-surface support section and the position restriction section includes a base material and a protective film including of a first film covering the base material, and a second film stacked on the first film, the protective film being formed to prevent chemical erosion of the base material.

2. The substrate support device according to claim 1, further comprising:
   a base that supports the support member; and a driving structure that moves the support member in a relative fashion with respect to the base;

wherein the substrate support device is constructed as a substrate transport device.

3. The substrate support device according to claim 1, wherein:

the support member is a temperature control plate for heating or cooling the substrate.

4. A substrate support device comprising:

a support member having;

a lower-surface support section to support a lower surface of a substrate;

a position restriction section provided on the lower-surface support section, the position restriction section being formed to surround a periphery of the substrate on the lower-surface support section and restrict a position of the substrate; and an inclined section provided on the support member, the inclined section being inclined downward from an outward position of a support region for the substrate surrounded by the position restriction section, towards the support region, such that a peripheral edge of the substrate slides downward on the inclined section and the substrate is guided to the lower-surface support section;

wherein at least one of the lower-surface support section, the position restriction section, and the inclined section, includes a base material and a protective film including a first film covering the base material, and a second film stacked on the first film, the protective film being formed to prevent chemical erosion of the base material.

5. The substrate support device according to claim 1, wherein:

the base material is made of a resin.

6. The substrate support device according to claim 5, wherein:

the base material retains a large number of fibers, with some of the fibers having a front end protruding to the surface of the base material; and the protective film covers the base material and each fiber to prevent the position restriction section, the lower-surface support section, or the inclined section from wearing.

7. The substrate support device according to claim 1, wherein:

the protective film is made of diamond-like carbon.

8. The substrate support device according to claim 7, wherein:

the first film has a main constituent different from that which the second film has.

9. The substrate support device according to claim 8, wherein:

fluorine is contained as a main constituent of the first film; and silicon is contained as a main constituent of the second film.

* * * * *